(12) United States Patent
Shukuri

(10) Patent No.: US 7,544,988 B2
(45) Date of Patent: Jun. 9, 2009

(54) SEMICONDUCTOR INTEGRATED CIRCUIT DEVICE AND A METHOD OF MANUFACTURING THE SAME

(75) Inventor: Shoji Shukuri, Koganei (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/325,054

(22) Filed: Nov. 28, 2008

(65) Prior Publication Data

US 2009/0078985 A1    Mar. 26, 2009

Related U.S. Application Data

(63) Continuation of application No. 11/212,707, filed on Aug. 29, 2005, which is a continuation of application No. 10/400,469, filed on Mar. 28, 2003, now Pat. No. 7,045,848.

(30) Foreign Application Priority Data

Apr. 18, 2002    (JP)    ............... 2002-115924

(51) Int. Cl.
*H01L 27/108*    (2006.01)
(52) U.S. Cl. .................. 257/311; 257/314; 438/257
(58) Field of Classification Search ................ 257/311, 257/314; 438/257
See application file for complete search history.

(56) References Cited

U.S. PATENT DOCUMENTS

| | | | |
|---|---|---|---|
| 5,296,399 A | 3/1994 | Park | |
| 5,408,115 A | 4/1995 | Chang | |
| 5,768,192 A | 6/1998 | Eitan | |
| 5,852,311 A | 12/1998 | Kwon et al. | |
| 5,966,603 A | 10/1999 | Eitan | |

(Continued)

FOREIGN PATENT DOCUMENTS

EP    1416540 A1    5/2004

(Continued)

OTHER PUBLICATIONS

Nozaki, Takaaki et al., "A 1-Mb EEPROM with MONOS Memory Cell for Semiconductor Disk Application," IEEE Journal of Solid State Circuits, vol. 26, No. 4, Apr. 1991 (pp. 497-501).

(Continued)

*Primary Examiner*—Douglas M Menz
(74) *Attorney, Agent, or Firm*—Antonelli, Terry, Stout & Kraus, LLP.

(57) ABSTRACT

The memory cell transistor includes, in a first well region, a pair of memory electrodes, one of which serves as source electrode and the other serves as drain electrode and a channel region interposed between the pair of memory electrodes. There is, on a channel region, a first gate electrode disposed near its corresponding memory electrode with an insulating film interposed therebetween, and a second gate electrode disposed through insulating films and a charge storage region and electrically isolated from the first gate electrode. A first negative voltage is applied to the first well region to form a state of reverse bias greater than or equal to a junction withstand voltage between the second gate electrode and the memory electrode near the second gate electrode, thereby enabling injection of hot electrons into the charge storage region and injection of electrons from the well region to the charge storage region.

14 Claims, 56 Drawing Sheets

U.S. PATENT DOCUMENTS

| | | |
|---|---|---|
| 5,969,383 A | 10/1999 | Chang et al. |
| 6,011,725 A | 1/2000 | Eitan |
| 6,180,538 B1 | 1/2001 | Halliyal et al. |
| 6,248,633 B1 | 6/2001 | Ogura et al. |
| 6,255,166 B1 | 7/2001 | Ogura et al. |
| 6,335,554 B1 | 1/2002 | Yoshikawa |
| 6,340,611 B1 | 1/2002 | Shimizu et al. |
| 6,483,749 B1 | 11/2002 | Choi et al. |
| 6,518,642 B2 | 2/2003 | Kim et al. |
| 6,555,427 B1 | 4/2003 | Shimizu et al. |
| 6,632,714 B2 | 10/2003 | Yoshikawa |
| 6,642,586 B2 | 11/2003 | Takahashi |
| 6,818,504 B2 | 11/2004 | Rabkin et al. |
| 6,818,508 B2 | 11/2004 | Shimizu et al. |
| 2004/0119107 A1 | 6/2004 | Hisamoto et al. |
| 2004/0155234 A1 | 8/2004 | Ishimaru et al. |
| 2004/0232471 A1 | 11/2004 | Shukuri |

FOREIGN PATENT DOCUMENTS

| | | |
|---|---|---|
| WO | WO 03/012878 A1 | 2/2003 |
| WO | WO 03/021666 A1 | 3/2003 |
| WO | WO 03/028112 A1 | 4/2003 |

OTHER PUBLICATIONS

"Can NROM, a 2 Bit, Trapping Storage NVM Cell, Give a Real Challenge to Floating Gate Cells?" Eitan et al., Extended Abstracts of the 1999 International Conference on Solid State Devices and Materials, Tokyo, 1999, pp. 522-524.

"High Speed Program/Erase Sub 100 nm MONOS Memory Cell" Fujiwara et al., pp. 75-77.

"A Novel Flash Memory Device with Split Gate Source Side Injection and ONO Charge Storage Stack (SPIN)" Chen et al., 1997 Symposium on VLSI Technology Digest of Technical Papers, pp. 63-64.

"Twin MONOS Cell with Dual Control Gates" Hayashi et al., Symposium on VLSI Technology Digest of Technical Papers, pp. 122-123.

Takaaki Nozaki, et al., A 1 Mbit EEPROM with MONOS Memory Cell for Semiconductor Disk Application, 1990 Symposium on VLSI Circuits, 1990 IEEE, (pp. 101-102).

(WRITE OPERATION)

(READ OPERATION)

(READ OPERATION FOR PLUSE DIRECTION)

SEMICONDUCTOR INTEGRATED CIRCUIT DEVICE AND A METHOD OF MANUFACTURING THE SAME

This application is a Continuation of U.S. patent application Ser. No. 11/212,707, filed Aug. 29, 2005, which in turn is a Continuation of U.S. patent application Ser. No. 10/400,469, filed Mar. 28, 2003 (now U.S. Pat. No. 7,045,848), and the entire disclosures of which are hereby incorporated by reference.

TECHNICAL FIELD

The present invention relates in general to a semiconductor integrated circuit device having a nonvolatile memory cell transistor (nonvolatile memory element), and to a method of manufacture thereof; and, more particularly, the invention relates, for example, to a technology that is effective when applied to a semiconductor integrated circuit device equipped with an on-chip nonvolatile memory, using a nonconductive charge trap film in an information retention region together with a CPU (Central Processing Unit).

BACKGROUND OF THE INVENTION

As a memory device for storing data or program-configured data, attention has recently been focused on a flash EEPROM (hereinafter called a "flash memory"), which is defined as a nonvolatile memory device that is capable of electrically erasing data that is stored in predetermined units in batch form and of electrically writing data. In a flash memory, each memory cell is made up of an electrically erasable and programmable nonvolatile memory element. The flash memory is capable of erasing data that is temporarily written into a corresponding memory cell or program-configured data and of rewriting (programming) new data or program-configured data into the corresponding memory cell.

The storage of an electrical charge in a flash memory has heretofore been performed by storing or accumulating electrons in a floating gate comprising a polysilicon film and which is electrically isolated from the surroundings. Such a conventional memory cell has been called a "floating gate type flash". The injection of hot electrons has generally been used as such an electron storage operation, i.e., a so-called write operation. The operation of discharging accumulated electrons out of the floating gate has been performed by a tunneling current which passes through a gate oxide film. When writing and erasure are repeated, a charge trap is formed inside the gate oxide film, and the surface level or state density increases at an interface between the substrate and the gate oxide film. In particular, the former has an essential problem in that the charge retention characteristic, i.e., the post-writing retention characteristic, is degraded.

As a method of resolving such a problem, a memory cell system has recently been proposed which makes use of a nonconductive charge trap film for the purpose of charge storage of the EEPROM. This has been disclosed in, for example, U.S. Pat. No. 5,768,192, U.S. Pat. No. 5,966,603, U.S. Pat. No. 6,011,725, U.S. Pat. No. 6,180,538, and B. Eitan et al., "Can NROM, a 2-bit, Trapping Storage NVM Cell, Give a Real Challenge to Floating Gate Cell", International Conference on Solid State Devices and Materials, Tokyo, 1999.

U.S. Pat. No. 5,768,192 has disclosed, for example, a system wherein, as shown in FIG. 58, a silicon nitride film 183 is interposed between insulating films 182 and 184, such as a silicon oxide film, etc., whereby a so-called laminated film having an ONO (Oxide/Nitride/Oxide) structure is used as a gate insulating film. In this first conventional memory cell 0V is applied to a source 187, 5V is applied to a drain 186 and 9V is applied to a control gate 185, so as to turn on the transistor, thereby injecting hot electrons developed in the neighborhood of the drain 186 and trapping them into the silicon nitride film 183, whereby writing is performed.

As compared with a system for effecting charge storage on a polysilicon film corresponding to a continuous conductive film, a charge storage system such as provided by the conventional first memory cell is characterized in that, since the trapping of electrons into the silicon nitride film 183 is non-contiguous and discrete, all of the stored charges do not disappear, even where charge leakage passes, such as via pin holes or the like that occur in part of the oxide film 182, and the retention characteristic is essentially strong. An erase operation of such a memory cell is performed by, as shown in FIG. 59, applying 3V, 5V and −3V to the source 187, drain 186 and control gate 185, respectively, to forcibly reverse the neighborhood of the drain 186 on the silicon surface side and inject hot holes, that are generated by a band-to-band tunnel phenomenon caused by an energy band that is significantly deformed by a strong electric field, into the silicon nitride film 183, to thereby neutralize the already-trapped electrons.

U.S. Pat. No. 5,408,115 and U.S. Pat. No. 5,969,383, respectively, have disclosed a memory cell system which has a split gate using side spacers, in which charge storage is effected on an ONO film serving as a memory cell structure. A write/erase system embodying this technique is shown in FIGS. 60 and 61. In this conventional second memory cell, as shown in FIG. 60, a select gate 163 is disposed on a gate oxide film 162 which is formed on the surface of a substrate 161, and lower oxide films 165, silicon nitride films 166 and upper oxide films 167 are laminated at a peripheral portion of the select gate 163, followed by provision of side spacer-shaped control gates 168. Since the source 164 of this conventional second memory cell is formed immediately after the processing of the select gate 163, and the drain 169 is formed after the processing of the control gates 168, only the control gate 168 on the drain 169 side functions as a gate electrode.

A write operation for the conventional second memory cell, as shown in FIG. 60, is performed by applying 5V, 1V and 10V to the corresponding drain 169, select gate 163 and control gate 168, respectively, to turn on a channel and accelerate electrons travelling from the source 165 within a strong lateral electric field produced in a channel region disposed below the boundary between the select gate 163 and the control gate 168, so as to bring them to a hot electron state, and the hot electrons are caused to pass through the lower oxide film 165, from which they are injected and trapped into the silicon nitride film 167. Since the injection positions of the hot electrons are not located in the neighborhood of the drain, this operation is generally called a "source side injection (SSI) system". An erase operation for this conventional second memory cell, as shown in FIG. 61, is performed by applying 14V to only the corresponding control gate 168, to thereby draw electrons that are trapped into the corresponding silicon nitride film 166 into the control gate 168 as a tunneling current flowing into the upper oxide film 167. Since the injection of electrons from the substrate 161 also occurs due to a tunneling current flowing via the lower oxide film 165 during the erase operation, there is a need to form the lower oxide film 165 to that it is thicker than the upper oxide film 167.

Further, in a read operation for the conventional second memory cell, as shown in FIG. 62, 2V and 5V are respectively applied to the corresponding drain 169 and select gate 163 so as to turn on the channel, and 2V is applied to the corresponding control gate 168, to thereby determine the high or low level of a threshold voltage, based on the presence or absence of the electrons trapped into the silicon nitride film, from the magnitude of the drain current. As compared with the conventional first memory cell of FIGS. 58 and 59, the conventional second memory cell of FIGS. 60-62 has the advantage of reducing the drain current necessary for the write operation and achieving a reduction in power. This is because, since the conventional second memory cell is provided with the select gate 163, the channel current at the time of writing can be controlled so that it is low. The channel current can be reduced to $1/100$ or less of that for the conventional first memory cell.

Furthermore, U.S. Pat. No. 5,408,115 has disclosed a conventional third memory cell, whose structure is shown in FIG. 63. The conventional third memory cell has a structure in which the structural positions of the select and control gates employed in the conventional second memory cell are changed. In the conventional third memory cell, a control gate 175 is formed above a lamination consisting of a lower oxide film 172, a silicon nitride film 173 and an upper oxide film 174, and, thereafter, gate oxide films 177 and side spacer-shaped select gates 178 are formed. The voltages that are set to effect write, erase and read operations of the present conventional third memory cell are similar to those of the conventional second memory cell.

A conventional fourth memory cell system, whose sectional views are shown in FIGS. 64 and 65, has been disclosed in I. Fujiwara, et al., "High Speed program/erase sub 100 nm MONOS memory", Nonvolatile Semiconductor Memory Workshop, August, 2001, p 75. As shown in FIG. 64, an ONO (Oxide/Nitride/Oxide) laminated film, comprising a silicon nitride film 193 interposed between insulating films 192 and 194, such as silicon oxide films, etc., is formed as a gate insulating film, and 12V is applied to a control gate 195 to inject electrons from the semiconductor substrate 191 side by a tunneling current and trap them into the silicon nitride film 193, thereby performing an erase operation that is brought into a high threshold voltage state. 6V is applied to a source 197 and a drain 196, and −6V is applied to the control gate 195 to forcibly reverse a silicon surface near a source/drain and inject hot holes, that are developed by a band-to-band tunneling phenomenon caused by an energy band that is greatly deformed by a strong field into the silicon nitride film 193, so as to neutralize the already-trapped electrons, thereby performing a write operation that is brought into a low threshold voltage state.

SUMMARY OF THE INVENTION

The present inventors have discovered the following problems as a result of investigations of the conventional memory cell systems.

A first problem resides in the fact that the drain current at the time of a reading operation in a low threshold voltage state is small. This problem results in a large drawback in a logic-mixed flash memory module which needs high-speed reading at about 100 MHz, for example. In the conventional first memory cell described in B. Eitan et al., "Can NROM, a 2-bit, Trapping Storage NVM cell, Give a Real Challenge to Floating Gate Cell", International Conference on Solid State Devices and Materials, Tokyo, 1999, the insulating films 182 and 184, such as silicon oxide films, etc., as shown in FIGS. 58 and 59, are respectively set to 5 nm, and the silicon nitride film 183 is set to 10 nm. Therefore, an oxide film-converted electrical effective thickness results in about 15 nm. This value becomes as thick as 1.5 times as compared with the conventional floating gate type memory cell, whose gate oxide film is designed to be about 10 nm. As compared with a memory cell having the same effective channel width/effective channel length, the read drain current is reduced to about 1/1.5.

In the conventional second memory cell shown in FIGS. 60 through 62, the gate oxide film 163 below the select gate 162 can be designed independently without depending on the write/erase characteristics of the memory cell. The gate oxide film 163 can be designed to be about 5 nm, for example. Since an effective channel length can be adjusted by the side spacer length, even where portions immediately below the control gates 168, and the upper oxide films 165 and 167, are respectively designed to be 5 nm, the silicon nitride films 166 are designed to be 10 nm, and the effective thickness is designed to be 15 nm, the effective channel length can be designed so that it is shorter than the select gate length defined by the minimum processing size. As a result, the effective channel length of the conventional second memory cell results in a serial length of both the select gate 163 and the control gates 168. However, the read current in a low threshold voltage state can be designed to be larger than that of the conventional first memory cell. From this point of view, the gate electrode to be controlled has an increased read current, but the conventional second memory cell is superior to the first memory cell.

A second problem relates to the reliability of the conventional second memory cell. The write/erase operation depends on the source/side injection writing of the hot electrons, and the emission and erasure of tunnel electrons effected on the control gate side, as described above. The present inventors have obtained a result in which, as a result of execution of a rewrite test by this operation system, the erase time interval is significantly degraded when the number of rewritings exceeds 10,000 times. As a result of analysis of the cause of this problem, it appears that this has happened because it is difficult for electrons trapped into a corner portion of the silicon nitride film 166, corresponding to an electron trap film disposed in an L shape, to be emitted toward the control gate 168 side. While the amount of electrons trapped into the corner portion of the silicon nitride film 166 gradually increases with repetition of the rewrite operation, the effective thickness of the silicon nitride film 166, as viewed from the control gate 168, is $\sqrt{2}$ times (about 1.4 times) that of a flat portion. Therefore, a reduction in in-film field intensity was considered to be a cause of this problem.

When the gate oxide film 163 shown in FIG. 60 is set to 4 nm or less in order to increase the read current in the low threshold voltage state, it also turned out that a dielectric breakdown failure in the gate oxide film 163 occurred during a write operation. This is because, since 10V is applied to the corresponding control gate 168 so that a channel is formed directly below the control gate 168 during the write operation, as described above, 5V applied to the drain 169 is transferred to the gate oxide film 162 at the end on the control gate side, of the select gate 163. At this time, the maximum voltage applied to the gate oxide film 162 results in (voltage at the drain 169=5V)−(voltage at the select gate 163=1V)=4V. Thus, the conventional second memory cell has a drawback in that the thickness of the gate oxide film 163 has a lower limit, and, thereby, the read current is restricted. In a logic-mixed flash memory module, the thickness of the gate oxide film 163 may preferably be designed to be the same as the thickness of a gate oxide film of a power voltage transistor in terms of simplification of the manufacturing process. While, for example, the thickness of a gate oxide film of a logic transistor in a 0.13-μm technology generation ranges from 2.5 nm to 3.0 nm, the sharing of the thickness of the gate oxide film was difficult from the viewpoint of the withstand voltage of the gate oxide film in the conventional second memory cell.

A third problem relates to the reliability of the conventional fourth memory cell. The write operation thereof depends on the injection of hot holes from the source/drain junction, as described above. Since the lateral attainable distance of each hot hole produced only in the neighborhood of the source/drain junction in the silicon nitride film 193 is about 50 nm, it is necessary to design the effective channel length of the present conventional fourth memory cell so as to be 100 nm or less. Therefore, a problem arises in that a single channel effect is remarkable; stable control on an initial threshold voltage is difficult; and a leakage current, so-called off-leak current on a bit line at the time that a NOR-type array connection is made, increases and its variations become large.

A fourth problem is as follows. Since the gate electrodes for performing the write/erase operations and the gate electrode for performing the read operation are identical as shown in FIGS. 58, 59, 60 through 62, 63, 64 and 65 in the conventional memory cells, the conventional fourth memory cell shown in FIGS. 64 and 65, for example, has a problem in that, due to the application of a weak electric field to the insulating film 192 by the application of a power voltage to the control gate 195 at the time of the read operation, a weak injection of hot electrons occurs from the low threshold voltage state in which holes are trapped into the silicon nitride film 193, so that the threshold voltage gradually increases, and the so-called read disturb life becomes short. As a result, when reading has been performed continuously for ten years, the threshold voltage is increased to greater than the power voltage applied to the control gate 195, so that an inversion failure in data occurs.

An object of the present invention is to provide a technology that is capable of reading memory information at high speed from a nonvolatile memory cell transistor formed in a semiconductor integrated circuit device.

Another object of the present invention is to reduce the parasitic resistance value of a channel portion of a nonvolatile memory cell transistor formed in a semiconductor integrated circuit device.

A further object of the present invention is to provide a semiconductor integrated circuit device that is capable of preventing an electrical charge of one polarity from being constantly trapped into a nonvolatile memory cell transistor formed in a semiconductor integrated circuit device, and to a method of manufacture thereof.

Yet another object of the present invention is to prevent degradation of data retention characteristics due to undesired leakage of electrical charges stored in a nonvolatile memory cell transistor formed in a semiconductor integrated circuit device.

A still further object of the present invention is to eliminate a high withstand voltage MIS transistor, which impairs a quick response and is large in thickness, from a signal path for reading memory information from a nonvolatile memory cell transistor formed in a semiconductor integrated circuit device.

The above, other objects and novel features of the present invention will become apparent from the description provided in the present specification and from the accompanying drawings.

Summaries of typical or representative Aspects and features of the present invention as disclosed in the present application will be described in brief as follows:

[1]<<Sprit Gate/Antipolarity Charge Injection/Negative Substrate Potential>>

A semiconductor integrated circuit device according to the present invention has a memory cell transistor and an access circuit therefor both provided on a semiconductor substrate. The memory cell transistor includes, in a first well region of the semiconductor substrate, a pair of memory electrodes, one of which serves as a source electrode and the other serves as a drain electrode, and a channel region interposed between the pair of memory electrodes, and includes, on the channel region, a first gate electrode (3, 123) disposed near the memory electrodes with an insulating film (2, 122) interposed between the first gate electrode (3, 123) and the channel region, and a second gate electrode (8, 127) disposed on the channel region with an insulating film (4 and 7, 124 and 126) and a charge storage region (6, 125) interposed between the second gate electrode and the channel region and electrically isolated from the first gate electrode. The access circuit is capable of selecting a first state in which a first negative voltage is applied to the first well region to thereby form a reverse-direction voltage applied state between the second gate electrode and the memory electrode near the second gate electrode and to form an electric field for directing a first polarity charge from the well region side to the charge storage region. The access circuit is capable of selecting a second state in which an electric field for directing a second polarity charge from the well region to the charge storage region is formed. Here, the first polarity charge means a positive charge typified by a hole or a negative charge typified by an electron, whereas the second polarity charge means an electrical charge opposite in polarity to the first polarity charge.

According to the above, the first negative voltage is applied to the first well region to thereby form the reverse-direction voltage applied state (reverse bias state) between the second gate electrode and the memory electrode near the second gate electrode, thereby making it possible to generate hot holes and hot electrons by band-to-band tunneling. The electric field for directing the first polarity charge, e.g., hot holes from the well region side to the charge storage region is formed to thereby produce an avalanche of the hot holes, so that a relatively large number of the hot holes are injected into the charge storage region.

In the first state, a reverse bias state that is much larger than that at the occurrence of the hot holes or the like by the band-to-band tunneling is formed between the second gate electrode and the memory electrode near the second gate electrode, to thereby enable the generation of a larger number of avalanche hot holes. Thus, the larger number of avalanche hot holes are injected into the charge storage region, so that the time required to inject the holes can be shortened and the time required to write or erase information can be shortened.

Here, a reverse bias voltage between a reverse bias voltage of a pn junction at the time that the hot holes or the like occur by the band-to-band tunneling, and a reverse bias voltage of a pn junction at the time that avalanche hot holes greater than those are produced, is referred to as a "junction withstand voltage (junction withstand)". Accordingly, the state of a reverse bias, that is much larger than when the hot holes or the like occur by the band-to-band tunneling, may be grasped or taken as the state of application of a reverse voltage that is near to or greater than the junction withstand. If an attempt is made to define the junction withstand voltage quantitatively, then a reverse bias voltage, at the time that a backward or reverse current, of the order of an allowable leakage current, that is allowed to flow into a channel of a MIS (Metal Insulate Semiconductor) held in an off state flows through a pn junction (also simply called a "junction"), can be defined as the junction withstanding. In the present specification, the junction withstand does not mean a junction breakdown voltage.

Since the well region is set to a negative voltage when the state of the reverse bias near or greater than the junction withstand voltage is formed, the voltage to be applied to the corresponding memory electrode can be made lower than when the voltage of the well region is set to a circuit's ground voltage. Thus, even when read circuits such as a sense amplifier, etc. are connected to the corresponding memory electrode, there is no need to constitute those read circuits using high withstand voltage MIS transistors.

The second gate electrode is electrically isolated from the first gate electrode (so-called split gate structure). Therefore, even if a high voltage is applied to the second gate electrode to form the first state or the second state, a withstand voltage of the first gate electrode is not affected thereby. Thus, there is no need to form the insulating film of the first gate electrode with a high-withstand film thickness. For example, the insulating film of the first gate electrode can be made relatively thin in a manner similar to a logic MIS transistor. Thus, the Gm of a MIS transistor section of a first gate electrode portion in the memory cell transistor can be made relatively large, and the amount of a signal current passing through a channel portion directly below the first gate electrode can be made large during the operation of reading memory information, even if the voltage to be applied to the first gate electrode is not made high in particular.

In order to prevent breakdown of the insulating film of the first gate electrode, that is formed relatively thin, in a manner similar to the logic MIS transistor when a negative voltage is applied to the well region upon hot-hole injection where the insulating film of the first gate electrode is made relatively thin in a manner similar to the logic MIS transistor, a negative voltage lower than the circuit's ground voltage may preferably be applied within a withstand voltage range thereof.

When the memory cell transistor is configured as a memory cell for storing binary information, one first gate electrode is provided near the one memory electrode, and one second gate electrode and one charge storage region are respectively provided near the other memory electrode to thereby constitute the corresponding memory cell transistor. The memory cell transistor is capable of storing binary information according to the difference between the amount of the first polarity charge and the amount of the second polarity charge, each of which is injected into the corresponding charge storage region. For example, electrons are injected into the charge storage region to form a high threshold voltage state (e.g., erase state), and hot electrons are injected into the charge storage region into which the electrons have been injected to neutralize the electrons, whereby a low threshold voltage state (e.g., write state) is formed.

When the memory cell transistor is configured as a memory cell for storing quaternary information, the second gate electrode and the charge storage region are provided near the memory electrode therefor, and one first gate electrode is provided in a region between a pair of the second gate electrodes. The memory cell transistor is capable of storing quaternary information according to the difference between the amount of a first polarity charge and the amount of a second polarity charge, both of which are injected into the pair of the charge storage regions. If a depletion layer much expanded to the drain side is taken into consideration in the case of a read operation for the memory cell transistor storing the quaternary information, e.g., where a logic value of memory information is determined according to the presence or absence of a current flowing from a drain to a source electrode in an n channel type memory cell transistor, then a MIS transistor section of a charge storage region portion placed on the source electrode side will have a conductance corresponding to its threshold voltage state. The MIS transistor section of the charge storage region portion placed on the drain side does not substantially fulfill its function as a switch regardless of its threshold voltage. Thus, the quaternary determination of the memory information can be made based on the presence or absence of a current flowing in a channel region when one memory electrode is used as the drain, and the presence or absence of a current flowing in the channel region when the other memory electrode is used as the drain.

[2]<<Sprit Gate/Antipolarity Charge Injection/Negative Substrate Potential>>

A semiconductor integrated circuit device according to a specific aspect of the present invention has a memory cell transistor provided on a semiconductor substrate, and an access circuit therefor provided thereon. The memory cell transistor includes a pair of memory electrodes of which one serves as a source electrode and the other serves as a drain electrode, and a channel region interposed between the pair of memory electrodes, both of which are provided in a first well region of the semiconductor substrate, and includes, on the channel region, a first gate electrode disposed near the one memory electrode with an insulating film interposed between the channel region and the first gate electrode, and a second gate electrode disposed near the other memory electrode on the channel region with an insulating film and a charge storage region interposed between the second gate electrode and the channel region and electrically isolated from the first gate electrode. The access circuit is capable of selecting a first state in which a first negative voltage is applied to the first well region to thereby apply a reverse voltage between the memory electrode near the second gate electrode and the first well region and to apply a voltage for forming an electric field for directing a first polarity charge from the well region side to the charge storage region to the second gate electrode. Further, the access circuit is capable of selecting a second state in which a voltage for forming an electric field for directing a second polarity charge to the charge storage region is applied to the second gate electrode and first well region.

In the first state, a state (reverse bias state) of application of a reverse voltage near or greater than or equal to a junction withstand voltage, for example, may be formed between the second gate electrode and the memory electrode near the second gate electrode.

According to the above means, the first negative voltage is applied to the first well region to thereby form the reverse-direction voltage applied state (reverse bias state) between the second gate electrode and the memory electrode near the second gate electrode, thereby making it possible to generate hot holes and hot electrons by band-to-band tunneling. The electric field for directing the first polarity charge, e.g., hot holes from the well region side to the charge storage region is formed to thereby produce an avalanche of the hot holes, so that a relatively large number of the hot holes are injected into the charge storage region.

In the first state, the state (reverse bias state) of application of the reverse voltage near or greater than or equal to the junction withstand voltage, for example, is formed between the second gate electrode and the memory electrode near the second gate electrode to thereby enable the occurrence of a larger number of avalanche hot holes. Thus, a larger number of avalanche hot holes are injected into the corresponding charge storage region, so that the time required to inject the holes can be shortened and the time required to write or erase information can be shortened.

Since the well region is set to a negative voltage when the state of the reverse bias greater than the junction withstand is formed, the voltage to be applied to the corresponding memory electrode can be made lower than when the voltage of the well region is set to a circuit's ground voltage. For example, when the access circuit comprises a first MIS transistor having a relatively thin gate insulating film, and a second MIS transistor having a relatively thick gate insulating film, the access circuit sets a voltage applied to the memory electrode near the second gate electrode as a first operation power voltage (Vdd) of a circuit comprising the first MIS transistor in order to form the first state. Thus, even when read circuits, such as a sense amplifier, etc. are connected to the corresponding memory electrode, there is no need to constitute those read circuits of high withstand voltage MIS transistors.

Since the second polarity charge, e.g., an electric field for injecting electrons, is formed between the well region and the second gate electrode, the field intensity is not biased or extremely small in its bias at opposite bottom portions in the charge storage region, and the uniform injection of the second polarity charge into the charge storage region is easy, thus making it possible to prevent the occurrence of partial leftovers from erasure or partial leftovers from writing. The possibility of there being partial leftovers from erasure or writing will manifest when a nonconductive trap film or the like is adopted for the charge storage region.

The second gate electrode is electrically isolated from the first gate electrode (so-called split gate structure). Therefore, even if a high voltage is applied to the second gate electrode to form the first state or the second state, the withstand voltage of the first gate electrode is not affected thereby. Thus, there is no need to form the insulating film of the first gate electrode with a high-withstand film thickness. For example, the insulating film of the first gate electrode can be made relatively thin in a manner similar to a logic MIS transistor. Thus, the Gm of a MIS transistor section of a first gate electrode portion in the memory cell transistor can be made relatively large, and the amount of a signal current passing through a channel portion directly below the first gate electrode can be made large in the case of reading memory information, even if the voltage to be applied to the first gate electrode is not made high in particular.

In order to prevent breakdown of the insulating film of the first gate electrode that is formed relatively thin in a manner similar to the logic MIS transistor when a negative voltage is applied to the well region upon hot-hole injection where the insulating film of the first gate electrode is made relatively thin in a manner similar to the logic MIS transistor, a negative voltage lower than the circuit's ground voltage, e.g., a second negative voltage smaller than the first negative voltage in absolute value, may preferably be applied to the first gate electrode. For example, the setting of the second negative voltage to a voltage (−Vcc) equal to the first operation power voltage in absolute value is most suitable. According to it, the first negative voltage may preferably be set to, for example, a voltage (−nVcc) equal to several times the first operation power voltage in absolute value.

Assuming that the electric field formed in the second state is an electric field for directing the second polarity charge from the well region to the charge storage region, charges opposite to each other in polarity are injected from the well region so that so-called writing/erasing can be performed. In the second state, for example, a positive voltage is applied to the second gate electrode, and a circuit's ground voltage is applied to the first well region. Thus, it is not necessary to consider a trade-off between prevention of undesired charge leakage and satisfactory charge pull-out or drawing performance at the time of memory information rewriting with respect to the insulating film between the second gate electrode and the charge storage region. Thus, when the charge storage region is constituted of, for example, an ONO structure, no problem occurs even if the oxide film (insulating film) on the upper side (near the second gate electrode) is formed thicker than the one on the lower side (on the well region side). The undesired charge leakage developed via the second gate electrode can be easily reduced.

The circuit's ground voltage may preferably be supplied to the memory electrode near the second gate electrode in the second state.

If attention is directed to the operation of reading memory information, then the access circuit may further be capable of selecting a third state in which the second gate electrode is set to the circuit ground voltage, the first gate electrode is set to the first operation power voltage, and a current is allowed to flow in the channel region.

The charge storage region can make use of a nonconductive charge trap film, an insulating film having conductive particles, or a conductive floating gate electrode covered with an insulating film, or the like.

When the access circuit comprises a first MIS transistor having a relatively thin gate insulating film, and a second MIS transistor having a relatively thick gate insulating film, the insulating film for the first gate electrode may be thinner than the insulating film for the second gate electrode. For example, the insulating film for the first gate electrode may be made equal to the gate insulating film of the first MIS transistor in thickness.

The semiconductor integrated circuit device may further include a logic circuit connected to the access circuit and comprising the first MIS transistor. The logic circuit may be provided with, for example, a CPU and a RAM.

[3]<<Sprit Gate/Antipolarity Charge Injection/Negative Substrate Potential>>

A semiconductor integrated circuit device according to another specific aspect of the present invention has a memory cell transistor provided on a semiconductor substrate, and an access circuit therefor provided thereon. The memory cell transistor includes, in a first well region of the semiconductor substrate, a pair of memory electrodes (10, 11), one of which serves as a source electrode and the other serves as a drain electrode, and a channel region interposed between the pair of memory electrodes, and includes, on the channel region, a first gate electrode (3) disposed near a region for the one memory electrode with an insulating film (2) interposed between the channel region and the first gate electrode, and a second gate electrode (8) disposed near a region for the other memory electrode on the channel region with an insulating film (5, 7) and a charge storage region (6) interposed between the second gate electrode and the channel region and electrically isolated from the first gate electrode. The access circuit is capable of selecting a first operation in which a negative voltage for forming a reverse bias state between the second gate electrode and the memory electrode near the second gate electrode is applied to the first well region to thereby inject a first polarity charge into the charge storage region. Further, the access circuit is capable of selecting a second operation in which a positive voltage is applied to the second gate electrode to thereby inject a second polarity charge into the charge storage region.

In the first operation, a state of a reverse bias near or greater than a junction withstand voltage may be formed between the memory electrode near the second gate electrode and the first well region by the negative voltage.

When the access circuit comprises a first MIS transistor having a relatively thin gate insulating film and a second MIS transistor having a relatively thick gate insulating film, the access circuit may set the voltage applied to the memory electrode near the second gate electrode as a first operation power voltage for a circuit comprised of the first MIS transistor.

The access circuit may preferably apply a second negative voltage smaller in absolute value than the first negative voltage to the first gate electrode upon the first operation. The second negative voltage may be a voltage equal to the first operation power voltage in absolute value. The first negative voltage may be a voltage equal to several times the first operation power voltage.

The access circuit is capable of injecting hot electrons into the corresponding charge storage region by application of a second negative voltage that is larger in absolute value than the first negative voltage to the second gate electrode upon the first operation.

The access circuit applies a circuit's ground voltage to the corresponding well region and applies the circuit's ground voltage to the corresponding memory electrode near the second gate electrode upon the second operation, thereby making it possible to inject electrons into the charge storage region from the well region.

In the operation of reading memory information, the access circuit may further be capable of selecting a third state in which the second gate electrode is set to the circuit's ground voltage, the first gate electrode is set to the first operation power voltage, and a current is allowed to flow in the channel region.

In the first operation, for example, a reverse bias state near or greater than a junction withstand voltage is formed between the second gate electrode and the memory electrode near the second gate electrode, so that the access circuit is capable of generating a larger number of hot holes. Thus, the larger number of hot holes are injected into the corresponding charge storage region, and hence the time required to inject the holes can be shortened and the time required to write or erase information can be shortened.

[4]<<Sprit Gate/Antipolarity Charge Injection/Negative Substrate Potential>>

A semiconductor integrated circuit device according to a further specific aspect of the present invention has a memory cell transistor, a first MIS transistor relatively thin in gate insulating film, and a second MIS transistor relatively thick in gate insulating film, all of which are provided on a semiconductor substrate. The memory cell transistor includes, in a first well region of the semiconductor substrate, a pair of memory electrodes (10, 11), one of which serves as a source electrode and the other serves as a drain electrode, and a channel region interposed between the pair of memory electrodes, and includes, on the channel region, a first gate electrode (3) disposed near a region for the one memory electrode with an insulating film (2) interposed between the channel region and the first gate electrode, and a second gate electrode (8) disposed near a region for the other memory electrode on the channel region with an insulating film (5, 7) and a charge storage region (6) interposed between the second gate electrode and the channel region and electrically isolated from the first gate electrode, and is capable of storing information different according to the difference between amounts of a first polarity charge and a second polarity charge each injected into the charge storage region. The insulating film placed below the first gate electrode is equal in thickness to the gate insulating film of the first MIS transistor. The well region is supplied with a negative voltage for forming, for example, a state of a reverse bias near or greater than a junction withstand voltage between the second gate electrode and the memory electrode near the second gate electrode when the first polarity charge is injected into the corresponding charge storage region. The second gate electrode is supplied with a positive voltage when the second polarity charge is injected into the charge storage region.

[5]<<Multi-Valued Memory Cell>>

A semiconductor integrated circuit device according to a still further aspect of the present invention has a memory cell transistor provided on a semiconductor substrate, and an access circuit therefor provided thereon. The memory cell transistor includes, in a first well region of the semiconductor substrate, a pair of memory electrodes (128), one of which serves as a source electrode and the other serves as a drain electrode, and a channel region interposed between the pair of memory electrodes, and includes, on the channel region, memory gate electrodes (127) separately disposed near the respective memory electrodes through insulating films (124, 126) and charge storage regions (125), and a control gate electrode disposed between both the memory gate electrodes with an insulating film (122) interposed therebetween and electrically isolated from the memory gate electrodes. The access circuit is capable of selecting a first state in which a negative voltage is applied to the first well region to form a state of a reverse bias close to or greater than, for example, a junction withstand voltage between the well region and the one memory electrode and to form an electric field for directing a first polarity charge from the well region side to the charge storage region on the one memory electrode side, a second state in which an electric field for directing a second polarity charge from the well region to the charge storage regions of both the memory gate electrodes is formed, and a third state in which a current is allowed to mutually flow from the one memory electrode to the other memory electrode through the channel region.

<<Another Viewpoint of Multi-Valued Memory Cell>>

A semiconductor integrated circuit device according to a still further specific aspect of the present invention has a memory cell transistor provided on a semiconductor substrate, and an access circuit therefor provided thereon. The memory cell transistor includes, in a first well region of the semiconductor substrate, a pair of memory electrodes (128), one of which serves as a source electrode and the other serves as a drain electrode, and a channel region interposed between the pair of memory electrodes, and includes, on the channel region, memory gate electrodes (127) separately disposed near the respective memory electrodes through insulating films (124, 126) and charge storage regions (125), and a control gate electrode (123) disposed between both the memory gate electrodes with an insulating film (122) interposed therebetween and electrically isolated from the memory gate electrodes. The access circuit is capable of selecting a first operation in which a negative voltage is applied to the first well region to thereby form a state of a reverse bias close to or greater than, for example, a junction withstand voltage between the first well region and the one memory electrode and inject a first polarity charge into the one charge storage region, a second operation in which a positive voltage is applied to both the memory gate electrodes to thereby inject a second polarity charge from the well region to both the charge storage regions, and a third operation in which a current is allowed to mutually flow from the one memory electrode to the other memory electrode through the channel region.

[6]<<<<Sprit Gate/Antipolarity Charge Injection/Negative Substrate Potential>>

A semiconductor integrated circuit device according to a still further specific aspect of the present invention has a memory cell transistor, a first MIS transistor having a relatively thin gate insulating film, and a second MIS transistor having a relatively thick gate insulating film, all of which are provided on a semiconductor substrate. The memory cell transistor includes a source region, a drain region and a channel region interposed between the source region and the drain region, all of which are provided within a first well region of the semiconductor substrate, and includes a first gate electrode (CG) disposed on one sides of the source region and drain region, a second gate electrode disposed on the other sides of the source region and drain region, a first gate insulating film (46, 129) formed between the channel region and the first gate electrode, a charge storage region (6, 125) formed between the channel region and the second gate electrode, and an insulating film for electrically isolating the first gate electrode and the second gate electrode, all of which are provided over the channel region. In the case of a write or erase operation of the memory cell transistor, a negative voltage having a value smaller in absolute value than one equal to several times a power voltage Vcc of a circuit comprising the first MIS transistor, and a ground voltage for the circuit are applied to the first well region to thereby inject carriers into the corresponding charge storage region.

<<Application of Negative Voltage (−Vcc) to CG>>

In the case of a write or erase operation of the memory cell transistor, a negative first voltage is applied to the second gate electrode and a negative second voltage, that is smaller than the negative first voltage in absolute value, is applied to the first gate electrode to thereby inject holes into the corresponding charge storage region.

[7]<<Negative Voltage to MG>Negative Voltage to CG, Hole Injection>>

A semiconductor integrated circuit device according to a still further specific aspect of the present invention has a memory cell transistor. The memory cell transistor includes a source region, a drain region, and a channel region interposed between the source region and the drain region, all of which are provided within a first well region of a semiconductor substrate, and includes, on the channel region, a first gate electrode (CG), a second gate electrode (MG), a first gate insulating film (46, 129) formed between the channel region and the first gate electrode, a charge storage region (6, 126) formed between the channel region and the second gate electrode, and an insulating film for electrically isolating the first gate electrode and the second gate electrode. In the case of a write or erase operation of the memory cell transistor, a negative first voltage is applied to the second gate electrode and a negative second voltage, that is smaller than the negative first voltage in absolute value, is applied to the first gate electrode to thereby inject holes into the corresponding charge storage region.

If the second voltage applied to the CG is set to a low voltage like −Vcc, then a control system for the first gate electrode can be formed of a low withstand voltage MIS circuit. For example, the first gate electrode is electrically connected to a first driver circuit for driving a gate control line, through the gate control line. The first driver circuit comprises a low withstand voltage transistor (power voltage MIS transistor). The first gate insulating film is formed by a gate insulating film forming process for the low withstand voltage transistor.

The charge storage region comprises a nonconductive charge trap film. The charge storage region is formed over the channel region with a first insulating film being interposed therebetween. The first gate electrode constitutes a control gate electrode. The second gate electrode constitutes a memory gate electrode.

[8]<<Vcc to Source or Drain, Negative Voltage to Well, Hole Injection>>

A semiconductor integrated circuit device according to a still further specific aspect of the present invention has a memory cell transistor, a first MIS transistor having a relatively thin gate insulating film, and a second MIS transistor having a relatively thick gate insulating film, all of which are provided on a semiconductor substrate. The memory cell transistor includes a source region, a drain region, a channel region interposed between the source region and the drain region, a gate electrode, and a charge storage region (6, 125) formed between the channel region and the gate electrode, all of which are provided within a first well region of the semiconductor substrate. In the case of a write or erase operation of the memory cell transistor, a negative first voltage is applied to the gate electrode, a negative second voltage not greater than the first voltage in absolute value is applied to the first well region, and a third voltage (Vcc) not greater in absolute value than a power voltage (Vcc) of a circuit made of the first MIS transistor is applied to the source or drain region to thereby inject holes into the corresponding charge storage region.

<<Hole Generation at Applied Voltage≧Junction Withstand Voltage>>

In the case of a write or erase operation of the memory cell transistor, the difference in potential between the third voltage (Vcc) and the second voltage (−2Vcc) is close to a junction withstand voltage of the source or drain region and is capable of generating holes by band-to-band tunneling.

If the third voltage applied to the drain is set to a low voltage like Vcc, then a bit-line circuit connected to the drain can be formed of a low withstand voltage MIS circuit. For example, the source region or the drain region is electrically connected to a first driver circuit for driving a bit control line, through the bit control line. The first driver circuit comprises a low withstand voltage transistor (power voltage MIS transistor). The charge storage region is formed of a nonconductive charge trap film over the channel region, with a first insulating film being interposed therebetween.

[9]<<Overlap Structure of CG and MG for Gate of Peripheral MOS Transistor, FIGS. 24 and 55>>

A semiconductor integrated circuit device according to a still further specific aspect of the present invention has a memory cell transistor, and at least one peripheral circuit transistor. The memory cell transistor includes, in a memory cell forming region of a semiconductor substrate, a source region, a drain region, a channel region interposed between the source region and the drain region, a first gate electrode and a second gate electrode disposed on the channel region, a first gate insulating film (46, 129) formed between the channel region and the first gate electrode, a charge storage region (6, 125) formed between the channel region and the second gate electrode, and an insulating film for electrically isolating the first gate electrode and the second gate electrode. The peripheral circuit transistor (power voltage MIS transistor, high voltage MIS transistor) has a gate electrode on a peripheral circuit transistor forming region of the semiconductor substrate. The gate electrode of the peripheral circuit transistor comprises a film formed by laminating a first conductive film lying in the same layer as the first gate electrode, and a second conductive film lying in the same layer as the second gate electrode.

The charge storage region comprises a nonconductive charge trap film, for example. The first gate electrode constitutes the control gate electrode. The second gate electrode constitutes a memory gate electrode and is formed on side walls of the control gate electrode through an insulating film in the form of sidewall spacer shapes (8, 62, 98, 127). The second conductive film is formed on the first conductive film.

The above at least one peripheral transistor includes a low withstand voltage transistor (power voltage MIS transistor) operated at a power voltage (Vcc), and a high withstand voltage transistor (high voltage MIS transistor) operated at a voltage higher than the power voltage.

The first gate insulating film (46, 129) is formed by a gate insulating film forming process for the low withstand voltage transistor.

[10]<<Manufacturing Process of Section [9]>>

A method of manufacture of a semiconductor integrated circuit device, according to the present invention, includes the steps of forming a first conductive film over a memory cell forming region and a peripheral circuit transistor forming region of a semiconductor substrate, patterning the first conductive film lying over the memory cell forming region to form a first conductive pattern which serves as a first gate electrode of a memory cell and leaving the first conductive film over the peripheral circuit transistor forming region, forming a second conductive film on the memory cell forming region and the first conductive film in the peripheral circuit transistor forming region, and etching the second conductive film to form each second gate electrode of the memory cell on at least side walls of the first conductive pattern, and forming a gate electrode of each peripheral circuit transistor comprising the second conductive film and first conductive film over the peripheral circuit transistor forming region.

The memory cell includes, in a memory cell forming region of a semiconductor substrate, a source region, a drain region, a channel region interposed between the source region and the drain region, a control gate electrode and a memory gate electrode disposed on the channel region, a first gate insulating film (46, 129) formed between the channel region and the control gate electrode, and a charge storage region (6, 125) formed between the channel region and the memory gate electrode. The first gate electrode constitutes the control gate electrode. The second gate electrode constitutes the memory gate electrode.

The peripheral circuit transistors include a low withstand voltage transistor (power voltage MIS transistor) operated at a power voltage, and a high withstand voltage transistor (high voltage MIS transistor) operated at a voltage higher than the power voltage. The first gate insulating film is formed by a gate insulating film forming step for the low withstand voltage transistor.

The second gate electrode is formed on side walls of the first gate electrode through an insulating film in the form of each sidewall spacer shape (8, 62, 98, 127).

An electrode withdrawal portion (200) of the second gate electrode is formed in the forming step of the second gate electrode.

The method further includes a step of patterning the first conductive pattern after the formation of the second gate electrode to thereby form the first gate electrode.

[11]<<Isolation of Silicide Layers 14 by Spacers 12 and 13>>

A semiconductor integrated circuit device according to a still further specific aspect of the present invention has at least one memory cell. The memory cell includes a source region, a drain region, and a channel region interposed between the source region and the drain region, all of which are provided within a semiconductor region, and includes a first gate electrode (CG), a second gate electrode (MG), and an insulating film for electrically isolating the first gate electrode and the second gate electrode, all of which are provided on the channel region. The channel region comprises a first channel region and a second channel region. A first gate insulating film is provided between the first channel region and the first gate electrode. A second gate insulating film is provided between the second channel region and the second gate electrode. The second gate electrode is formed higher than the first gate electrode. A silicide layer (14) for the second gate electrode and a silicide layer (14) for the first gate electrode are electrically isolated by sidewall spacers (13) each comprised of an insulating film, in self-alignment with side walls of the second gate electrode. Undesired short-circuits in both silicide layers are easily and reliably prevented.

[12]<<Height: CG<MG, MG: Low Resistance>>

A semiconductor integrated circuit device according to a still further specific aspect of the present invention has at least one memory cell. The memory cell includes a source region, a drain region, and a channel region interposed between the source region and the drain region, all of which are provided within a semiconductor region, and includes a first gate electrode (CG), a second gate electrode (MG), and an insulating film for electrically isolating the first gate electrode and the second gate electrode, all of which are provided on the channel region. The channel region comprises a first channel region and a second channel region. A first gate insulating film is provided between the first channel region and the first gate electrode. A second gate insulating film is provided between the second channel region and the second gate electrode. The second gate electrode is formed on side walls of the first gate electrode through an insulating film in the form of each sidewall spacer shape (8, 62, 98, 127). The thickness of the second gate electrode is thicker than the thickness of the first gate electrode, and the height on a substrate surface, of the second gate electrode is higher than the height on the substrate surface, of the first gate electrode. When the first and second gate electrodes are silicidized, undesired short-circuits in both silicide layers are easily and reliably prevented.

In order to reduce the resistance value of the second gate electrode, a silicide layer (14) may preferably be formed in the second gate electrode. More specifically, sidewall spacers (12, 13), each comprised of an insulating film, are formed in self-alignment with side walls on both sides of the second gate electrode. The silicide layer (14) for the second gate electrode and the silicide layer (14) for the first gate electrode are electrically isolated by the sidewall spacer (13) disposed on one side of both sides. The silicide layer (14) for the second gate electrode and a silicide layer (14) for the source region or the drain region are electrically isolated by the sidewall spacer (12) on the other side thereof. The silicide layer (14) for the first gate electrode and the silicide layer (14) for the source region or the drain region are electrically isolated by sidewall spacers (12) each made of an insulating film, which are formed on the side walls of the first gate electrode on a self-alignment basis.

The second gate insulating film includes a nonconductive charge trap film corresponding to, for example, a charge storage region (6, 125). The first gate electrode (CG) constitutes a control gate electrode of the memory cell. The second gate electrode (MG) constitutes a memory gate electrode of the memory cell and is formed on side walls of the control gate electrode through an insulating film in the form of each sidewall spacer shape (8, 62, 98, 127).

[13]<<Manufacturing Process of Section [11]>>

A method of manufacture of a semiconductor integrated circuit device includes the steps of forming a first conductive film (51) over a memory cell forming region of a semiconductor substrate and forming an insulating film (50) on the first conductive film (see FIG. 19), etching the insulating film and the first conductive film to form a first conductive pattern which serves as a first gate electrode (CG) of a memory cell (see FIG. 20), forming a second gate electrode (62) of the memory cell on side walls of the first conductive pattern, removing the insulating film (50) on the first conductive pattern (see FIG. 24), forming sidewall spacers (69), each made of an insulating film on side walls of the second gate electrode (62) on a self-alignment basis (see FIG. 26), and forming a silicide layer (77) for each of the first conductive pattern and the second gate electrode (62) in self-alignment with respect to the sidewall spacers (69) (see FIG. 27).

More specifically, in the sidewall spacer (69) forming step (see FIG. 26), the sidewall spacers (69) are formed on the side walls on both sides of the second gate electrode and side walls of the first gate electrode. The silicide layer (77) for the second gate electrode and the silicide layer (77) for the first gate electrode are electrically isolated by the sidewall spacer (69) disposed on one side of both sides. The silicide layer (77) for the second gate electrode and a silicide layer (77) for a source region or a drain region are electrically isolated by the sidewall spacer (69) on the other side thereof. The silicide layer (77) for the first gate electrode and the silicide layer (77) for the source region or the drain region are electrically isolated by sidewall spacers (69) formed on the side walls of the first gate electrode.

More specifically, a gate electrode of each peripheral circuit transistor is formed of a film obtained by laminating a conductive film lying in the same layer as the first conductive film, and a second conductive film lying in the same layer as the memory gate electrode.

The silicide layer forming step can serve as a silicide layer forming step for each peripheral MIS transistor. Namely, sidewall spacers are formed on side walls of the gate electrode of each peripheral circuit transistor in the sidewall spacer (69) forming step. A silicide layer is formed on the gate electrode of the peripheral circuit transistor in the silicide layer (77) forming step.

More specifically, the memory cell includes, in a memory cell forming region of a semiconductor substrate, a source region, a drain region, a channel region interposed between the source region and the drain region, a control gate electrode disposed near one of the source and drain regions, a memory gate electrode disposed near the other of the source and drain regions, a first gate insulating film (46, 129) formed between the channel region and the control gate electrode, and a charge storage region (6, 125) formed between the channel region and the memory gate electrode. The first gate electrode constitutes the control gate electrode. The second gate electrode constitutes the memory gate electrode.

[14]<<Memory Cell Structure Wherein Each Memory Gate Electrode is Formed in Self-Alignment with Respect to Each Spacer (100) (See FIGS. 35 Through 39>>

A semiconductor integrated circuit device has at least one memory cell. The memory cell includes a source region, a drain region, and a channel region interposed between the source region and the drain region, all of which are provided within a semiconductor region, and includes a first gate electrode (101), a second gate electrode (98), and an insulating film for electrically isolating the first gate electrode and the second gate electrode, all of which are provided on the channel region interposed between the source and drain regions. The channel region comprises a first channel region and a second channel region. A first gate insulating film (92) is provided between the first channel region and the first gate electrode. A second gate insulating film (95, 96, 97) is provided between the second channel region and the second gate electrode. The second gate electrode (98) is formed higher than the first gate electrode (101). The first gate electrode (101) is formed in self-alignment with respect to sidewall spacers (100) each made of an insulating film, which are formed in self-alignment with respect to side walls of the second gate electrode (98).

More specifically, sidewall spacers (100), each comprising an insulating film, are formed in self-alignment with the side walls on both sides of the second gate (see FIG. 36). The second gate insulating film (95, 96, 97) is formed in self-alignment with respect to the sidewall spacer (100) on one side of both sides (see FIG. 38). The first gate electrode (101) is formed in self-alignment with respect to the sidewall spacer (100) on the other side thereof.

More specifically, the second gate insulating film includes a nonconductive charge trap film corresponding to a charge storage region (96). The first gate electrode (101) constitutes a control gate electrode. The second gate electrode (98) constitutes a memory gate electrode and is formed on each side wall of the control gate electrode through an insulating film in sidewall spacer fashion (98).

[15]<<Manufacturing Method of Section [14]>>

A method of manufacture of a semiconductor integrated circuit device includes the steps of forming a first conductive film (93) over a memory cell forming region of a semiconductor substrate and forming an insulating film (94) on the first conductive film (see FIGS. 19 and 35), etching the insulating film and the first conductive film to form a first conductive pattern which serves as a first gate electrode of a memory cell (see FIGS. 20 and 35), forming a second gate electrode (98) of the memory cell on side walls of the first conductive pattern (see FIG. 35), removing the insulating film on the first conductive pattern (see FIG. 36), forming sidewall spacers (100), each comprised of an insulating film, in self-alignment with side walls of the second gate electrode (98) (see FIG. 36), and etching the first conductive pattern in self-alignment with respect to the sidewall spacers (100) to form each first gate electrode (101) (see FIG. 38).

More specifically, a second gate insulating film (96) is formed between the second gate electrode (98) and the semiconductor substrate. The sidewall spacers (100) are formed on the side walls on both sides of the second gate electrode (see FIG. 36). The second gate insulating film is formed in self-alignment with respect to the sidewall spacer on one side of both sides (see FIG. 38). The first gate electrode (101) is formed in self-alignment with respect to the sidewall spacer on the other side thereof.

More specifically, a gate electrode of each peripheral circuit transistor is formed of a film obtained by laminating a conductive film lying in the same layer as the first conductive film, and a second conductive film lying in the same layer as the memory gate electrode.

More specifically, the second gate insulating film includes a nonconductive charge trap film corresponding to a charge storage region (96). The first gate electrode (101) constitutes a control gate electrode. The second gate electrode (98) constitutes a memory gate electrode and is formed on side walls of the control gate electrode through an insulating film in sidewall spacer fashion (98).

[16]<<Threshold Voltage Control>>

A semiconductor integrated circuit device according to a still further aspect of the present invention has a basic structure similar to ones described up to now, i.e., a memory cell transistor provided on a semiconductor substrate, and an access circuit therefor provided thereon. The memory cell transistor includes a pair of memory electrodes, one of which serves as a source electrode and the other serves as a drain electrode, and a channel region interposed between the pair of memory electrodes, both of which are provided in a first well region of the semiconductor substrate, and includes, on the channel region, a first gate electrode disposed near the corresponding memory electrode with a first gate insulating film interposed between the first gate electrode and the channel region, and a second gate electrode formed on the channel region with a second insulating film and a charge storage region and electrically isolated from the first gate electrode. Further, the first gate electrode is different in conductivity type from the second gate electrode. An initial threshold voltage as viewed from the first gate electrode and an initial threshold voltage as viewed from the second gate electrode are determined so as to be desirable in terms of a read operation. For example, an initial threshold voltage as viewed from the second gate electrode is set low in the case of a read operation, and the voltage to be applied to the second gate electrode is set to a low voltage like a circuit's ground voltage upon reading, thereby making it possible to avoid a reduction in data retention performance due to a so-called word line disturbance.

As a still further specific aspect, the thickness of the first gate insulating film may be formed so that it is thinner than that of the second gate insulating film. Further, the first gate electrode may be set to a p type, and the second gate electrode may be set to an n type. At this time, a channel region results in an n type.

DETAILED DESCRIPTION OF THE PREFERRED EMBODIMENTS

Figure 1:
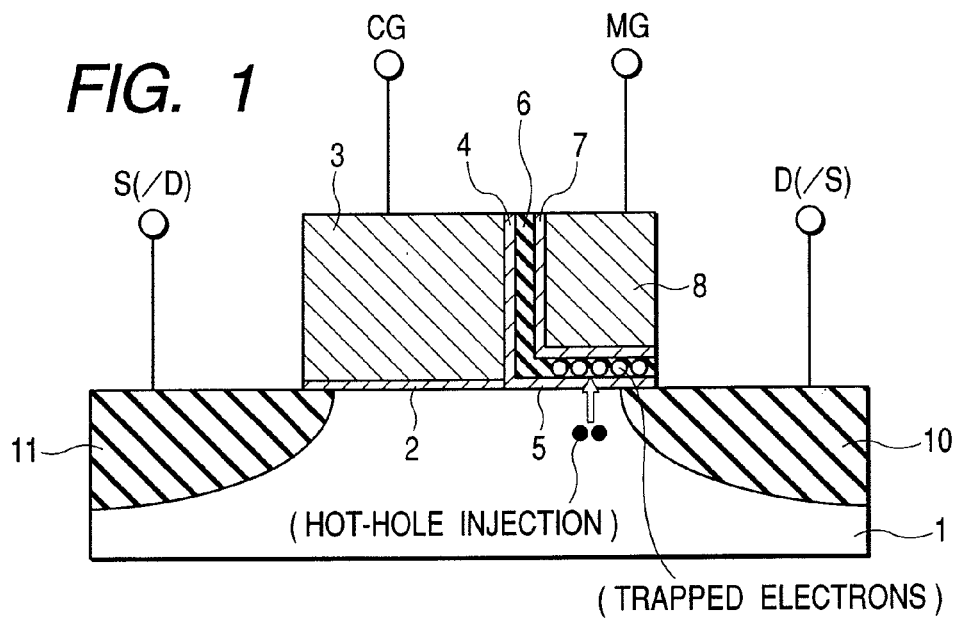
FIG. 1 is a vertical cross-sectional view illustrating a nonvolatile memory cell transistor applied to a semiconductor integrated circuit device according to the present invention.

Preferred embodiments of the present invention will be described in detail with reference to the accompanying drawings. Incidentally, components having the same function in all of the drawings are respectively identified by the same reference numerals, and their repetitive description will be omitted. In the following description, a MOS (Metal Oxide Semiconductor) transistor (also simply described as "MOS") will be used as one example of MIS transistors (or MISFET), which are generic names for insulated gate field effect transistors.

<<Memory Cell Transistor>>

A nonvolatile memory cell transistor (also simply called a "memory cell") applied to a semiconductor integrated circuit device according to the present invention is illustrated in FIG. 1 in the form of a vertical cross-section. A first structural viewpoint related to the memory cell transistor resides in writing and erasure operations based on electron- and hot-hole injection, and a split gate structure. Namely, the memory cell transistor shown in the drawing comprises a read transistor unit or section (selection transistor section) in which a control gate (control gate electrode or first gate electrode) 3 is formed in a surface region of a semiconductor substrate (or well region) 1 with a gate insulating film 2, that is made of, for example, a silicon oxide film, interposed therebetween, and a memory transistor unit or section in which, for example, a lower silicon oxide film 5 corresponding to a gate insulating film, a charge storage region 6, and an upper silicon oxide film 7 corresponding to an insulating film are laminated on the surface region of the semiconductor substrate 1 on at least the drain side of the control gate 3, and a memory gate (memory gate electrode or second gate electrode) 8 is formed thereabove. The charge storage region 6 is a region for holding information therein and is capable of discontinuously performing, for example, charge retention on a discrete basis. The holding region is made of, for example, a non-conductive charge trap film. As the non-conductive charge trap film, one may used, for example, a silicon nitride film. Since the silicon nitride film is discontinuous and discrete in charge's trap, all of the stored charges do not disappear and retention characteristics can be enhanced even where charge leakage paths, such as pin holes or the like, occur in part of the lower silicon film 5 corresponding to the gate insulating film. The thickness of the upper silicon oxide film 7 is formed so as to be thicker than that of the lower silicon oxide film 5, and the thickness of the gate insulating film 2 is formed so as to be thinner than the thicknesses of the laminated films 5, 6 and 7. A drain (memory electrode corresponding to a drain electrode (region)) 10 is formed in the surface region of the semiconductor substrate 1, which is overlapped with the memory gate 8. A source (memory electrode corresponding to a source electrode (region)) 11 is formed in the surface region of the semiconductor substrate 1, which has overlapped with the control gate 3. While the source and drain of each MOS transistor are generally relative concepts based on applied voltages, a memory electrode connected to the upstream side of a current path during a read operation is called a "drain" for convenience herein. It is needless to say that, though described later, a circuit may be configured with reference numerals 10 and 11 as the source and drain, respectively. The insulating films 5, 6 and 7, for electrically separating the control gate 3 and the memory gate 8, are formed therebetween.

Thus, the memory cell transistor includes the control gate 3 formed through the gate insulating film 2, the memory gate 8 formed through the gate insulating film 5 and the charge storage region 6, and the insulating films 5, 6 and 7 for electrically separating the control gate 3 and the memory gate 8 from each other, all of which are provided over a channel region (semiconductor substrate or well region) interposed between the source 11 and the drain 10.

The memory cell shown in FIG. 1 has a high threshold voltage state (e.g., erase state) obtained by, for example, applying a positive voltage to only the memory gate 8, injecting electrons 20 from the semiconductor substrate 1 side by virtue of a tunneling current and trapping them into the silicon nitride film 6, and it has a low threshold voltage state (write state) obtained by applying a positive voltage to the drain 10 and a negative voltage to at least the memory gate 8 and injecting hot holes developed in the neighborhood of a junction surface of the drain 10 into the silicon nitride film 6 to thereby neutralize trapped electrons. Incidentally, when one of a negative charge typified by an electron or a positive charge typified by a hole is assumed to be a first polarity charge, a charge opposite in polarity to the first polarity charge is called a "second polarity charge".

Figure 2:
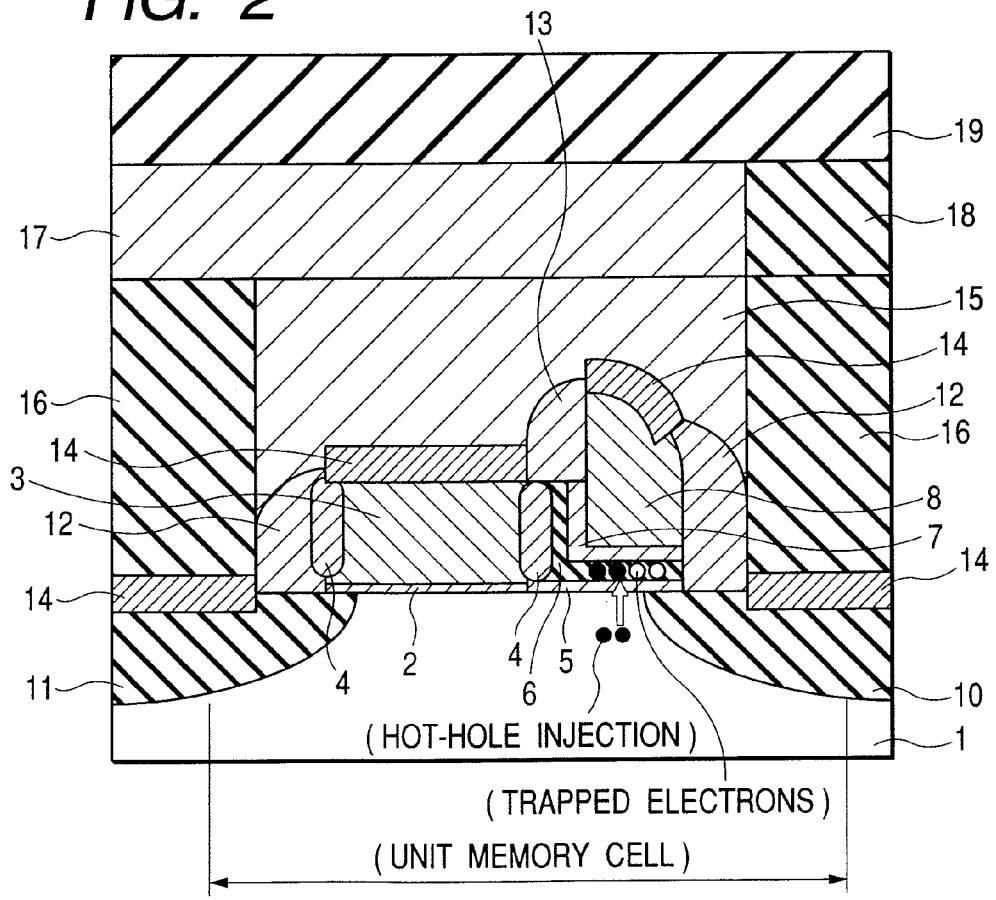
FIG. 2 is a vertical cross-sectional view of a memory cell according to the present invention, which is manufactured in the process of mixing with a logic transistor.
Figure 3:
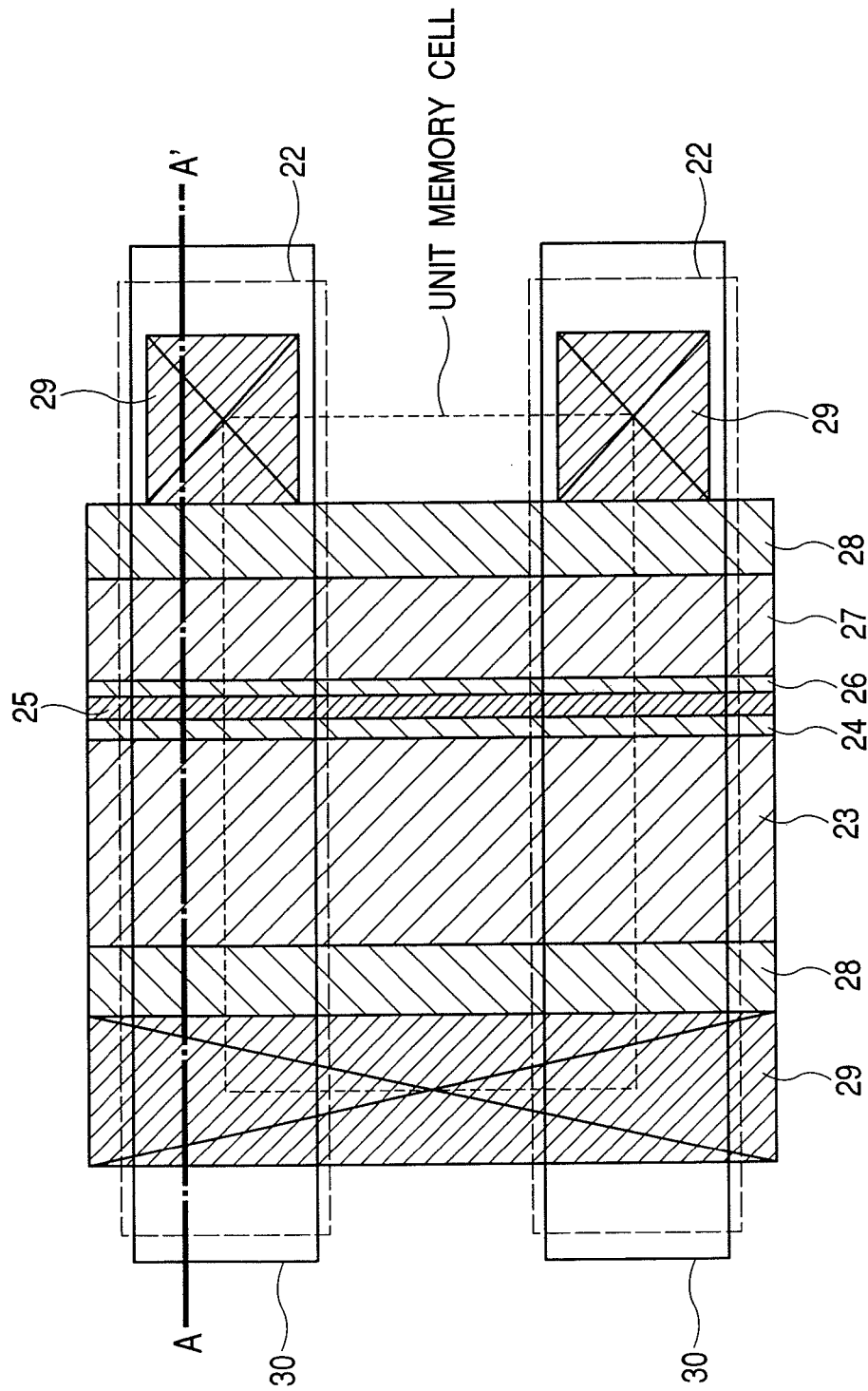
FIG. 3 is a plan view of the memory cell shown in FIG. 2.

A second viewpoint related to the memory cell transistor resides in the fact that a large read current is allowed, in other words, the memory cell transistor can be structurally made common to a logic transistor (power voltage MOS transistor). A vertical cross-section of the memory cell transistor according to the present invention, where it is manufactured in the process of mixing with the logic transistor (power voltage MOS transistor), is illustrated in FIG. 2. A plan view thereof is illustrated in FIG. 3. Incidentally, FIG. 2 is a cross-sectional view taken along line A-A' of FIG. 3. The left side of FIG. 2 corresponds to A, and the right side of FIG. 2 corresponds to A', respectively. Only the memory cell transistor is shown in FIGS. 2 and 3, and the mixing process will be described later. Each MOS transistor operated at a source or power voltage Vdd will be abbreviated as a power voltage MOS transistor.

In FIG. 2, a control gate (control gate electrode or first gate electrode) 3 formed, in the same manufacturing process as a gate electrode of the logic transistor (first MOS transistor having a relatively thin insulating film), over a gate insulating film 2 formed in the same manufacturing process as a gate insulating film of the logic transistor operated at the power voltage, and a memory gate (memory gate electrode or second gate electrode) 8 provided above a laminated film of a lower oxide film 5 corresponding to a gate insulating film, a silicon nitride film 6 corresponding to a charge storage region and an upper oxide film 7 corresponding to an insulating film are formed over a surface region of a semiconductor substrate 1 that is made of, for example, silicon. Incidentally, the thickness of the upper silicon oxide film 7 is formed so as to be thicker than that of the lower silicon oxide film 5. A drain (memory electrode corresponding to a drain electrode) 10 and a source (memory electrode corresponding to a source electrode) 11 are disposed in the surface region of the semiconductor substrate 1 so as to overlap with the memory gate 8 and the control gate 3, respectively. The control gate 3 and the memory gate 8 are respectively made of, for example, a silicon film. Since the lower oxide film 5 is formed by a thermal oxidation process, for example, a silicon oxide film 4 corresponding to a sidewall insulating film is grown on side face portions of the control gate 3. Thus, the thickness of the silicon oxide film 4 is formed so as to be thicker than that of the lower oxide film 5, and the withstand voltage between the control gate 3 and the memory gate 8 can be enhanced. In FIG. 2, for example, metal silicide films 14 each made of cobalt silicide (CoSi) or nickel silicide (NiSi) are formed over the control gate 8, the memory gate 8, and the surface regions of the drain 10 and source 11. They are electrically isolated (separated) by side spacers 12 and 13 made of an insulating film. Incidentally, since the side spacers 12 and 13 are formed without using a photolithography technology (to be described later) and in the same process step in a manufacturing process, the manufacturing process steps can be reduced. An interlayer insulating film 15 is formed so as to cover the memory cell transistor and the logic transistor, and the surface of the interlayer insulating film 15 has been planarized. Connecting holes 197 and 198 for opening the drain 10 and source 11 are defined in the interlayer insulating film 15, and metal plugs 16 are embedded into the connecting holes. An interlayer insulating film 17, whose surface has been planarized, is formed on the interlayer insulating film 15, and a bit line 19 is formed on the interlayer insulating film 17. The connecting hole 197 for opening the metal plug 16 placed over the drain 10 is defined in the interlayer insulating film 17, and a metal plug 18 is embedded into the connecting hole 197. Incidentally, the connecting holes 197 and 198 will be described later with reference to FIG. 4. Thus, the metal plugs 16 are electrically connected to the drain 10 and source 11, respectively. Further, the metal plug 16 formed over the drain 10 is electrically connected to the bit line 19 through the metal plug 18.

In the plan view of the memory cell shown in FIG. 3, a control gate 23 (corresponding to the control gate 3), an oxide film 24 (corresponding to the oxide film 5), a silicon nitride film 25 (corresponding to the silicon nitride film 6), an upper oxide film (corresponding to the upper oxide film 7), a memory gate 27 (corresponding to the memory gate 8), and insulating film side spacers 28 (corresponding to the side spacers 12) are disposed in active regions 22 surrounded by device isolation regions so as to extend in a direction (second direction: longitudinal direction as viewed in the drawing) orthogonal to a direction (first direction: transverse direction as viewed in the drawing) in which the active regions 22 extend. Further, metal plugs 29 (corresponding to the metal plugs 16), are placed over the drain 10 and source 11, and bit lines 30 (each corresponding to the bit line 19) are connected to only the metal plug on the drain. Incidentally, since the metal plug 18 formed on the metal plug 29 placed on the drain 10 is substantially formed in the interlayer insulating film 17 in the same shape and position as the corresponding metal plug 29, the illustration thereof will be omitted to make it easy to understand the drawing. The metal plug 29 (corresponding to the metal plug 16) formed on the source 11 is configured so as to extend in the same direction as the direction in which the control gate 23 (corresponding to the control gate 3) and the memory gate 27 (corresponding to the memory gate 8) extend, and constitutes a common source line.

Figure 4:
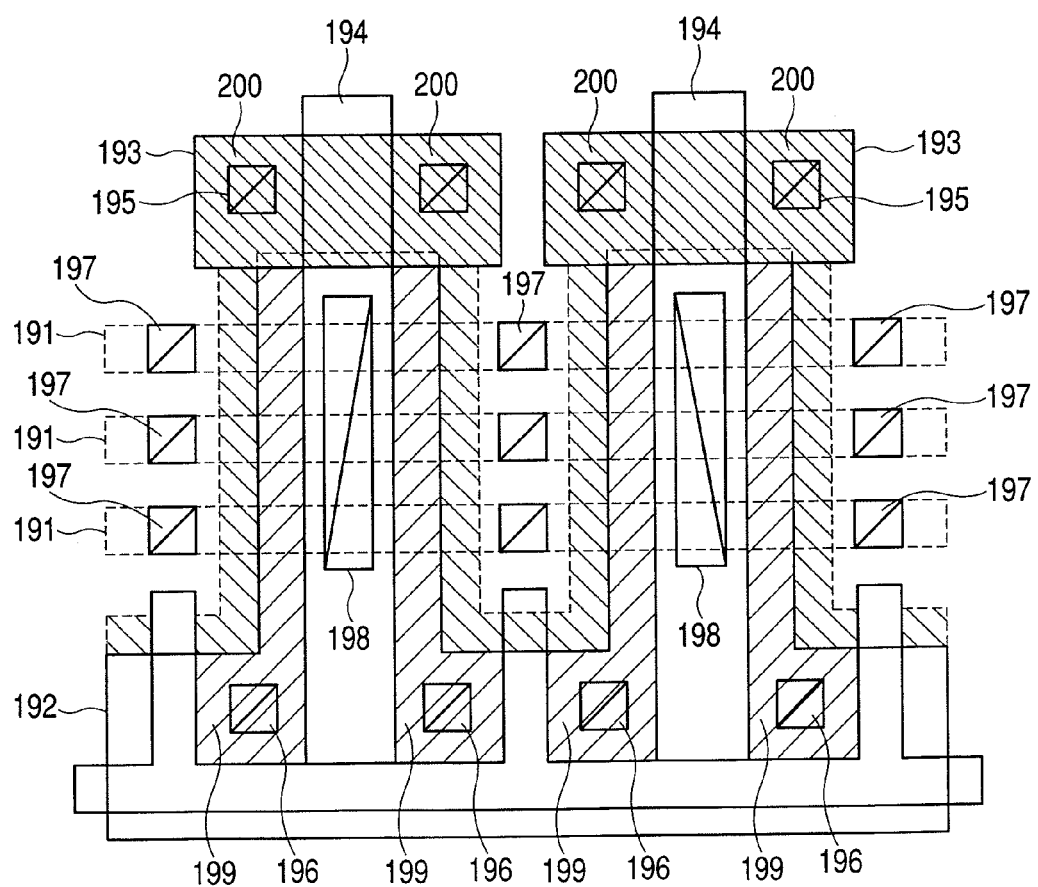
FIG. 4 is a plan view illustrating the layout of processing mask patterns for forming memory gates only in side face portions on the drain side, of control gates employed in the memory cell according to the present invention.

FIG. 4 illustrates the layout of processing mask patterns for forming the memory gates 8 and 27 only at the side face portions of the control gates 3 and 23 on the drain 10 side in the memory cell of the present invention, as shown in FIGS. 1 and 2. In FIG. 4, reference numerals 191 indicate active region patterns for defining active regions surrounded by device isolation regions of the memory cell. The active regions 22 are formed so as to extend in the first direction (transverse direction as viewed in the drawing). Reference numeral 192 indicates a first gate film pattern for defining an end of the control gate on the drain side, and reference numerals 193 indicate second gate patterns for defining second gate films in the process of forming side spacers in order to perform electrode withdrawal of the memory gates 8 and 27, respectively. Further, gate film isolation patterns 194 for cutting off the first and second gate films to define an end thereof on the source side and completing control gates 199 (corresponding to the control gates 3 and 23) and memory gates 200 (corresponding to the memory gates 8 and 27) are shown in FIG. 4. Namely, diagonally-shaded portions of the first gate film pattern 192 are respectively formed as the control gates 199 (corresponding to the control gates 3 and 23) by virtue of the gate film isolation patterns 194. Of the second gate film patterns 193, portions shown in high-density patterns are respectively formed as the memory gates 200 (corresponding to the memory gates 8 and 27). Furthermore, contact hole patterns 195 on the memory gates 200, contact hole patterns 196 on the control gates 199, drain contact hole patterns 197, and slit-shaped contract hole patterns 198 on the source are shown in FIG. 4, and connecting holes 195, 196, 197 and 198 are respectively defined therein. Incidentally, the metal plugs 16 and 29 are formed within their corresponding contact hole patterns 198, and the common source line extending in the second direction (longitudinal direction as viewed in the drawing) is formed integrally with the metal plugs 16 and 29. Although not shown in the drawing, bit line patterns are disposed in parallel to the active region patterns, and the bit lines 19 and 30 are formed so as to extend in the first direction (transverse direction as viewed in the drawing).

Incidentally, electrode withdrawal portions of the memory gates 8, 27 and 200 are electrically connected to their corresponding wirings or via wirings formed in the same layers as the bit lines 19 and 30 through the metal plugs 16 and 29 each formed in the connecting hole 195 of the interlayer insulating film 15 and the metal plug 18 formed in the corresponding connecting hole 195 of the interlayer insulating film 17. Further, electrode withdrawal portions of the control gates 3, 23 and 199 are electrically connected to their corresponding wirings or via wirings formed in the same layers as the bit lines 19 and 30 through the metal plugs 16 and 29 each formed in the connecting hole 196 of the interlayer insulating film 15 and the metal plug 18 formed in the corresponding connecting hole 196 of the interlayer insulating film 17.

As will be described later, in the manufacturing process of the memory cell of the present invention using the mask patterns shown in FIG. 4, device isolation regions 32 for defining the active regions 22 are formed within the substrate 1 by the active region patterns 191. Thereafter, the gate insulating film 2 for the logic transistor (power voltage MOS transistor) and the memory transistor operated at the power voltage is grown on the substrate 1, and the first gate film (first conductive film) formed of, for example, a silicon film is deposited on the gate insulating film 2. The first gate is thereafter pattern-processed to the shape of the first gate film pattern 192 by using, for example, a resist film pattern corresponding to the shape of the first gate film pattern 192. Afterwards, the gate insulating film 2 other than a portion below the first gate film, for example, is removed, and the lower oxide film 5, the silicon nitride films 6 and 25, the laminated film of the upper oxide films 7 and 26, and the second gate film (second conductive film) made of, for example, a silicon, all of which are shown in FIGS. 1 and 2, are deposited on the substrate 1 including an upper portion of the first gate film. Incidentally, the upper silicon oxide films 7 and 26 are formed so as to be thicker than the thickness of the lower silicon oxide film 5. Thereafter, a resist film pattern corresponding to the shape of the second gate film pattern 193, for example, is formed, and the second gate film is processed by an anisotropic dry etching method to form side spacer-like second gate films on the periphery of the first gate film. Afterwards, the first and second gate films are pattern-processed using resist film patterns corresponding to the shapes of the gate film isolation patterns 194, for example, whereby the processing of the control gates 2, 23 and 199 and the memory gates 8, 27 and 200 is completed by cutting off the first and second gate films. Thereafter, a semiconductor device mixed with a flash memory is completed via the process of forming the metal wirings 19 and 30 after the formation of the source-drain regions 10 and 11 of the memory cell, the formation of source-drain regions of the logic transistor operated at the power voltage, the formation of the metal silicide films 14, the formation of the interlayer insulating film 15, the formation of the connecting holes 195, 196, 197 and 198, the formation of the interlayer insulating film 17, and the formation of the connecting holes 195, 196 and 197. Incidentally, although not shown in FIG. 4, for example, the slit-shaped contact hole patterns 198 are respectively formed so as to extend in positions lying downstream from the contact hole patterns 196 as viewed in the second direction (longitudinal direction as viewed in the drawing), where they are electrically connected to their corresponding wirings or via wirings formed in the same layers as the bit lines 19 and 30 through the metal plugs formed in the connecting holes of the unillustrated interlayer insulating film 17.

Figure 5:
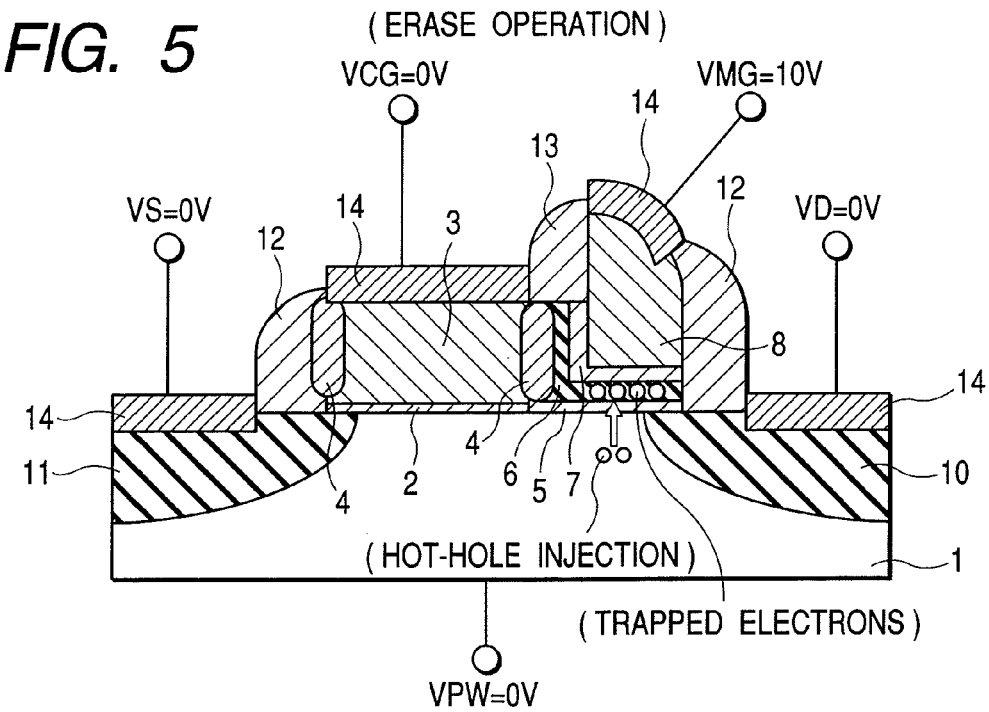
FIG. 5 is a cross-sectional view illustrating a voltage-applied state at an erase operation of the memory cell.
Figure 6:
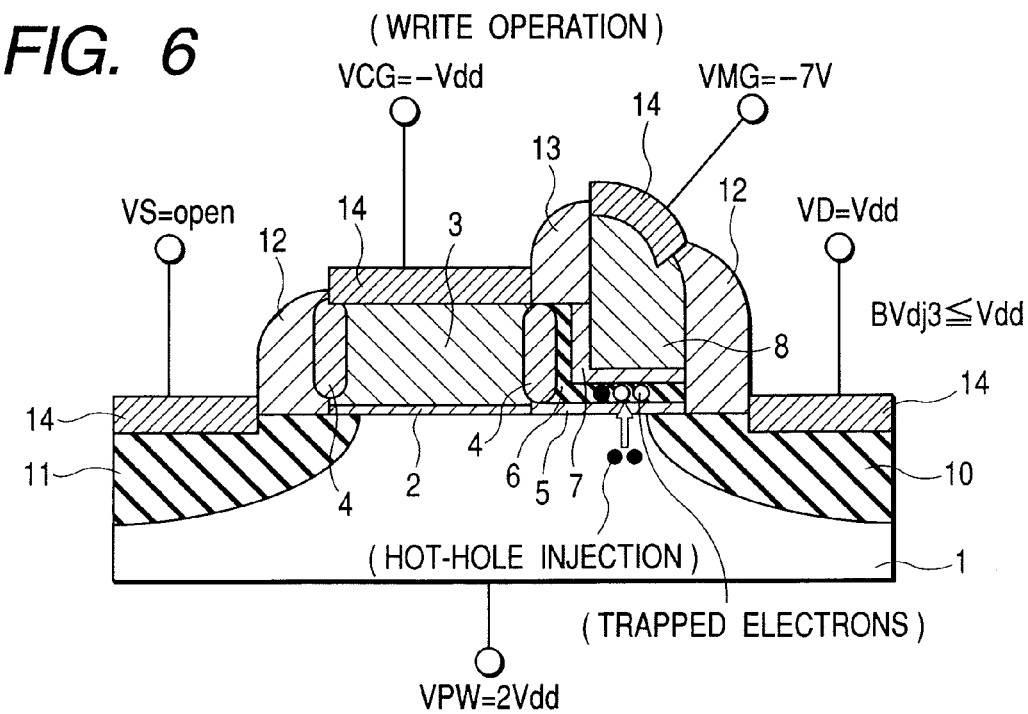
FIG. 6 is a cross-sectional view illustrating a voltage-applied state at a write operation of the memory cell.
Figure 7:
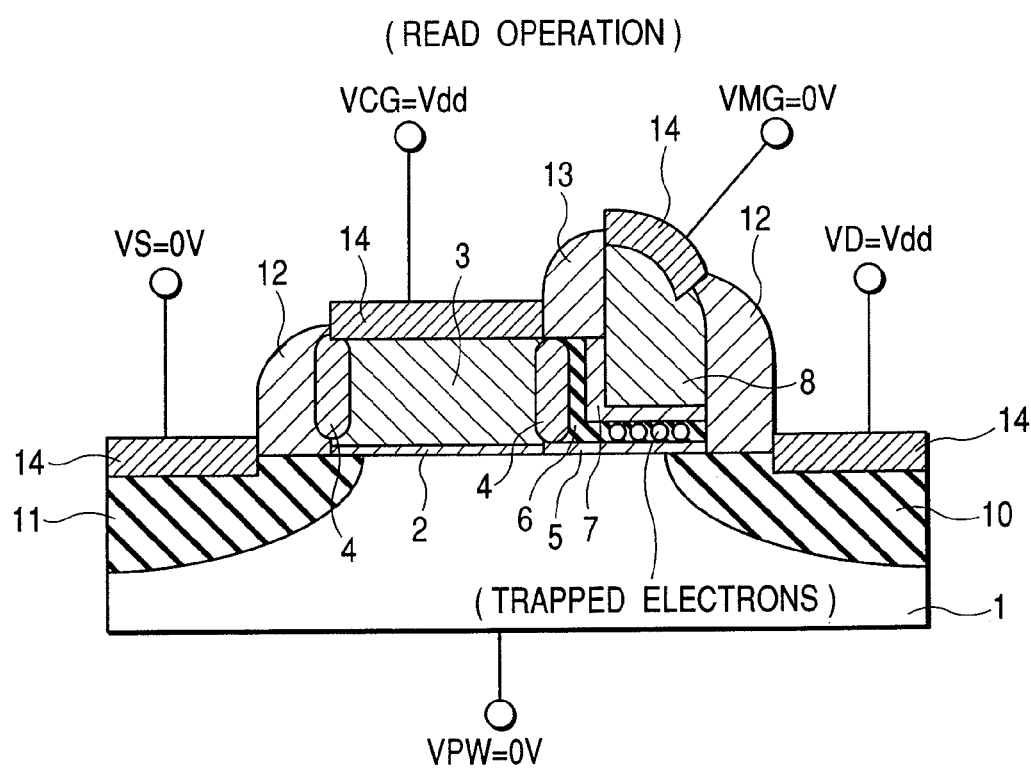
FIG. 7 is a cross-sectional view illustrating a state of a read operation of the memory cell.

Basic operations of the memory cell of the present invention are shown in FIGS. 5, 6 and 7. VD indicates a drain voltage, VS indicates a source voltage, and VCG indicates a control gate voltage. VMG indicates a memory gate voltage.

FIG. 5 illustrates a voltage-applied state at the time of an erase operation. In the case of an erase operation, a suitable positive voltage (e.g., VMG=10V) is applied to only the memory gate 8, and other terminals are all set to 0V (ground potential) corresponding to a reference voltage. The erase operation serves so as to inject electrons from the semiconductor substrate (well region) 1 side by a Fowler-Nordheim (FN) tunneling current flowing through the lower oxide film 5 directly below the memory gate 8 and trap them into the silicon nitride film 6 to thereby increase a threshold voltage measured from the memory gate 8 (e.g., VTE=2V). Namely, the electrons are injected into the silicon nitride film 6 corresponding to the charge storage region from the semiconductor substrate 1 side under tunneling of the electrons caused to pass through the lower oxide film 5 corresponding to the gate insulating film to thereby trap the electrons into a trap in the silicon nitride film 6. Thus, since the tunneling current-based electrons are injected via the lower oxide film 5 directly below the memory gate 8, the electrons are trapped into only the silicon nitride film 6 directly below the memory gate 8, and, hence, the trapping of the electrons into each corner, which has been indicated as the second problem of the conventional memory cell, does not occur. As a result, the problem of erase time degradation caused by the electrons trapped into each corner of the silicon nitride film 6 at a rewrite operation is solved. In the case of such an erase operation, the high voltage is applied to only the memory gate 8, and no high voltage is applied to the gate oxide film 2 of the read transistor section. The erase time depends on an erase voltage applied to the memory gate 8, and an effective field intensity determined by the ratio between the thickness of the lower oxide film and an effective oxide-film thickness of a lower oxide film/silicon nitride film/upper oxide film. When, for example, the thickness of the lower oxide film 5 is set to 3 nm, the thickness of the silicon nitride film 6 is set to 5 nm and the thickness of the upper oxide film 7 is set to 5 nm, the effective oxide-film thickness of the three layer films results in 10.5 nm. Therefore, the erase voltage to be applied to the memory gate 8 reaches about 10.5V to obtain a field intensity of 10 MV/cm at which the FN tunneling current flows into the lower oxide film. Since the upper silicon oxide film 7 is formed so as to be thicker than that of the lower silicon oxide film 5, the electrons trapped into the silicon nitride film 6 can be prevented from being emitted from the silicon nitride film 6 to the memory gate 8 by tunneling.

FIG. 6 illustrates a voltage-applied state at the time of a write operation of the memory cell. In the case of a write operation, a source or power voltage Vdd (e.g., VD=1.5V) is applied to the drain 10, a suitable negative voltage (e.g., a voltage equal to twice the power voltage=−2Vdd=−3V) is applied to the semiconductor substrate (well region) 1, and a suitable negative voltage (e.g., −Vdd=−1.5V) is applied to the control gate 3. In this condition, a suitable negative voltage (e.g., VMG=−7V) is applied to the desired memory gate 8 which is to perform writing, by a write time interval. If the design of the device is such that VD−VPW=Vdd−(=2Vdd) =3Vdd reaches the neighborhood of a junction withstand voltage because the difference in potential between the drain 10 and the semiconductor substrate (well region) 1 is a junction voltage, then a junction surface portion is forcedly reversed due to the negative voltage applied to the memory gate 8, so that a large quantity of hot holes occur beginning with a band-to-band tunneling phenomenon, and they are thereafter injected into the silicon nitride film due to the negative voltage of the memory gate 8. Namely, the large quantity of hot holes can be injected into the silicon nitride film due to the formation of a reverse-direction voltage-applied state (reverse-bias state).

Here, a reverse bias voltage between a reverse bias voltage of a pn junction at the time that the hot holes or the like occur by the band-to-band tunneling, and a reverse bias voltage of a pn junction at the time that avalanche hot holes greater than those are produced, will be referred to as a "junction withstand voltage (junction withstand)". Accordingly, the state of a reverse bias much larger than when the hot holes or the like occur by the band-to-band tunneling, may be grasped or taken as the state of application of a reverse voltage near or greater than the junction withstand voltage. If an attempt is made to define the junction withstand voltage quantitatively, then a reverse bias voltage at the time that a backward or reverse current of the order of an allowable leakage current that is allowed to flow into a channel of a MIS (Metal Insulate Semiconductor) held in an off state flows through a pn junction (also simply called a "junction"), can be defined as the junction withstand voltage. In the present specification, the junction withstand voltage does not mean a junction breakdown voltage.

As described above, the junction withstand voltage can be defined as the reverse bias voltage at the time that the reverse current of the order of the allowable leakage current that is allowed to flow into the channel of the off-state MOS transistor flows through the pn junction (also simply called a "junction"). Therefore, when such an allowable leakage current is assumed to be 10 nA, according to the above definition, the device design may be performed in such a manner that a leakage current of 10 nA occurs between the drain 10 and the semiconductor substrate (well region) 1 by the reverse bias of 3Vdd. Consequently, a large quantity of hot holes occur with the setting of the junction voltage corresponding to the difference in potential between the drain 10 and the semiconductor substrate 1 at the time of the write operation to the neighborhood of the junction withstand voltage. The holes are injected into the silicon nitride film by the negative voltage of the memory gate 8.

If the device design is performed such that the junction withstand voltage becomes smaller than 3Vdd, then avalanche hot holes occur in larger quantities and are injected into the silicon nitride film in larger quantities, so that the time required to inject them can be further reduced. Namely, a larger quantity of avalanche hot holes occur with the setting of the junction voltage corresponding to the difference in potential between the drain 10 and the semiconductor substrate 1 at the time of the write operation to be greater than the junction withstand voltage. Thus, the hot holes are injected into the silicon nitride film in larger quantities and hence the injection time can be reduced.

The injected hot holes neutralize the already-trapped electrons and reduce the threshold voltage measured from the memory gate 8 (e.g., VTP=−2V). Since a drain current necessary for the write operation is of only a leakage current at the drain junction, it corresponds to a leakage current value ranging from about 5 μA/bit to 10 μA/bit near the junction withstand voltage. This is reduced to 1/10 or less as compared with 200 μA/bit at the time of writing based on hot electron injection in the conventional first memory cell. In the case of writing based on hot hole injection, hot hole generating regions locally exist in a drain junction end at which the concentration of an electric field occurs, and the distance at which each hot hole is achievable from its generation point, is about 50 nm. Therefore, the width of the memory gate 8 is set in such a manner that an effective channel length of the memory transistor section reaches 50 nm or less. In the case of only the memory transistor section, the difficulty of stably controlling the initial threshold voltage and the drawback of increasing the off leakage current, etc. which have turned into the third problem of the conventional memory cell, are similarly non-existent therein. In the memory cell of the present invention, however, the instability of read characteristics can be resolved by the provision of the read transistor section (selection transistor section).

In the case of the present write operation, a high voltage is applied to the memory gate 8 and the semiconductor substrate (well region) 1, and the voltage, e.g., −2Vdd applied to the semiconductor substrate (well region) 1 even at the maximum is applied to the gate insulating film 2 of the read transistor section. However, if a suitable negative voltage (e.g., VCG=−Vdd) is applied to the control gate 3, then the voltage to be applied to the gate insulating film 2 reaches Vdd. As a result, the thickness of the gate insulating film 2 can be designed so as to be thin equivalent to the gate oxide film of the logic transistor (power voltage MOS transistor) operated at the power voltage. Accordingly, the reduction in the drain current at the time of reading, which has become the first problem of the conventional memory cell, can be resolved. Since the maximum voltage applied to each of the control gate 3 and the drain 10 is of the power voltage (Vdd), each of the read circuits, such as a word driver circuit connected to the control gate 3, a sense amplifier circuit connected to the drain 10, etc. can be made of a peripheral transistor (power voltage MOS transistor) operated at a power voltage, having a gate insulating film having the same film thickness as the gate insulating film 2 and which is capable of realizing high-speed reading. Incidentally, as will be described later, the gate insulating film 2 is configured with a thickness of, for example, 2.7 nm and is formed so as to be thinner than the thicknesses of the laminated films 5, 6 and 7.

FIG. 7 illustrates a read-operated state of the memory cell of the present invention. In the case of a read operation, a power voltage (e.g., VD=Vdd=1.5V) is applied to the drain 10, the power voltage (e.g., VCG=Vdd=1.5V) is applied even to the control gate 3, and other terminals are set to 0V. Since the voltage to be applied to the memory gate 8 is also 0V, the turning off or on of a drain current is determined according to whether the threshold voltage of the memory transistor is in an erase state (VTE=2V) or a write state (VTP=−2V). The problem of degradation of a read disturb life due to the voltage application to the memory gate 8, which has become the fourth problem of the conventional memory cell, is hence resolved. As a read drain current in the write state, a large current value is obtained from the fact that, since the thickness of the gate insulating film 2 of the read transistor section is equivalent to the logic transistor (power voltage MOS transistor), the current drive capacity is high (Gm is high), and since the effective channel length of the memory transistor section is 50 nm or less, the parasitic resistance of such a portion is small. When, for example, the read transistor section is compared with a logic transistor having the same effective channel width/effective channel length, the read transistor section is capable of achieving a drain current value up to about 70% to 80% of that of the logic transistor. As a result, a flash memory having an ultrafast read speed (e.g., read frequency of 200 MHz) can be mixed into a logic LSI in terms of the fact that the above read circuit can be made of the peripheral transistor (power voltage MOS transistor) operated at the power voltage, and the read current of the memory cell is large.

<<Data Processor>>

Figure 8:
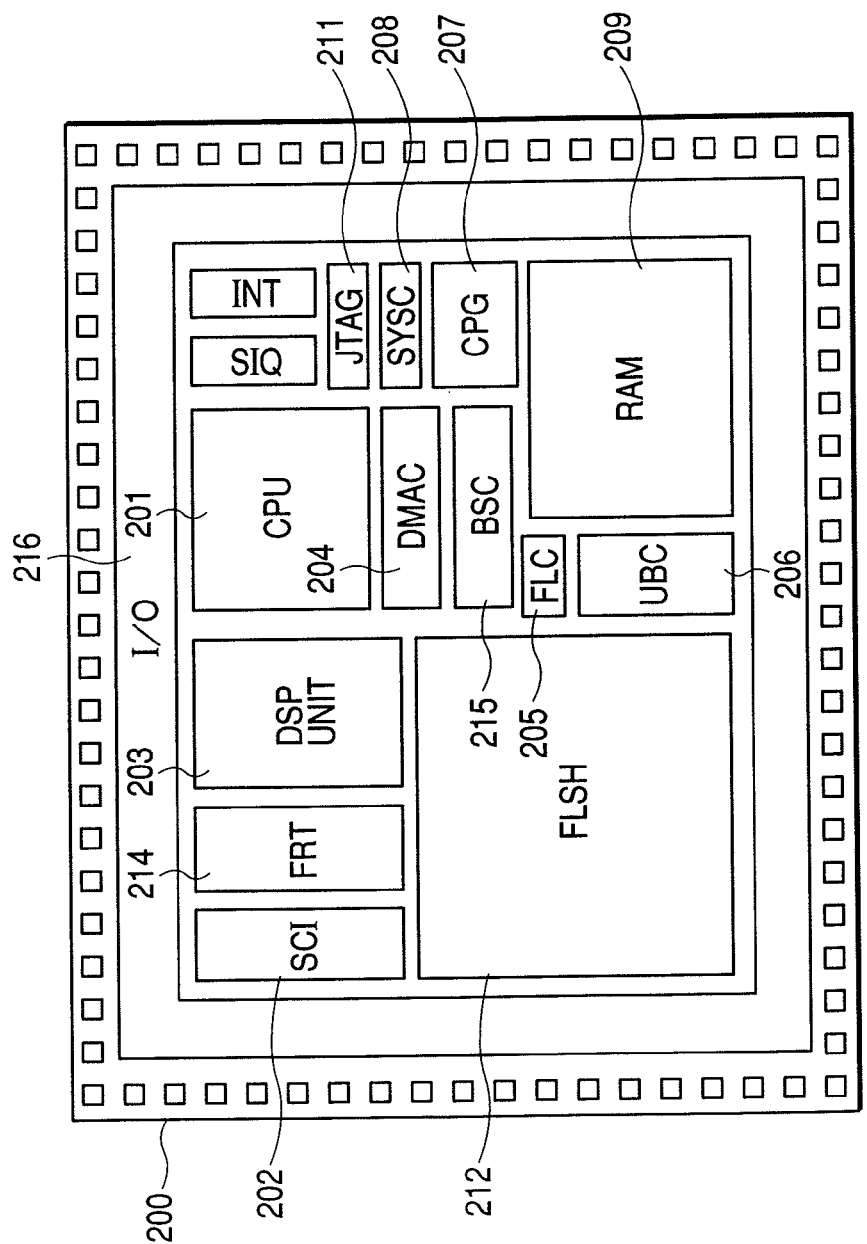
FIG. 8 is a block diagram illustrating a data processor with an on-chip flash memory.

FIG. 8 illustrates a data processor with an on-chip flash memory module which includes a memory cell having the structure illustrated in FIGS. 2 and 3. Although not restricted in particular, the data processor 200 is formed on a single semiconductor substrate (semiconductor chip) like monocrystal silicon by a 0.13 μm semiconductor integrated circuit manufacturing technology. Although not restricted in particular, a large number of bonding pads are disposed around the semiconductor substrate. The data processor 200 includes respective circuit modules of a CPU (Central Processing Unit) 201 constituted of a logic MOS transistor (power voltage MOS transistor) having a gate insulating film whose thickness is 2.7 nm, which is operated at a source or power voltage Vdd=1.2V, an SCI (Serial Communication Interface) 202, an FRT (Free Running Timer) 214, a DSP unit 203, a DMAC (Direct Memory Access Controller) 204, an FLC (Flash Controller) 205, a UBC (User Break Controller) 206 having a debug support function, a CPG (Clock Pulse Generator) 207, a SYSC (System Controller) 208, a BSC (Bus State Controller) 215, a RAM (Random Access Memory) 209 whose memory capacity is, for example, 16 kB, and a JTAG 211 used in a self-test or the like. Further, the data processor 200 comprises a flash memory (FLSH) 212 which is made of, for example, a logic transistor (power voltage MOS transistor) having a gate insulating film whose thickness is 2.7 nm, a high-withstand transistor having a gate insulating film whose thickness is 15 nm, and the memory cell transistor of the present invention, and which has a memory capacity of 256 kB, and an I/O (Input/Output) circuit 216. Incidentally, the high-withstand transistor is a transistor having a gate insulating film which is thicker than that of the gate insulating film of the power voltage MOS transistor.

Although not restricted in particular, an external source or power voltage supplied to an external power terminal of the data processor 200 is set to 3V, and the power voltage Vdd (=1.2V) of the logic MOS transistor (power voltage MOS transistor) is formed by stepping down the external power voltage. Each of the MOS transistors constituting the I/O circuit 216 has a withstand voltage exceeding 3V. Each of the high-withstand MOS transistors for the flash memories 212 and 213 has a withstand voltage which causes no gate breakdown with respect to high voltages necessary upon write and erase operations for the memory cell.

Figure 9:
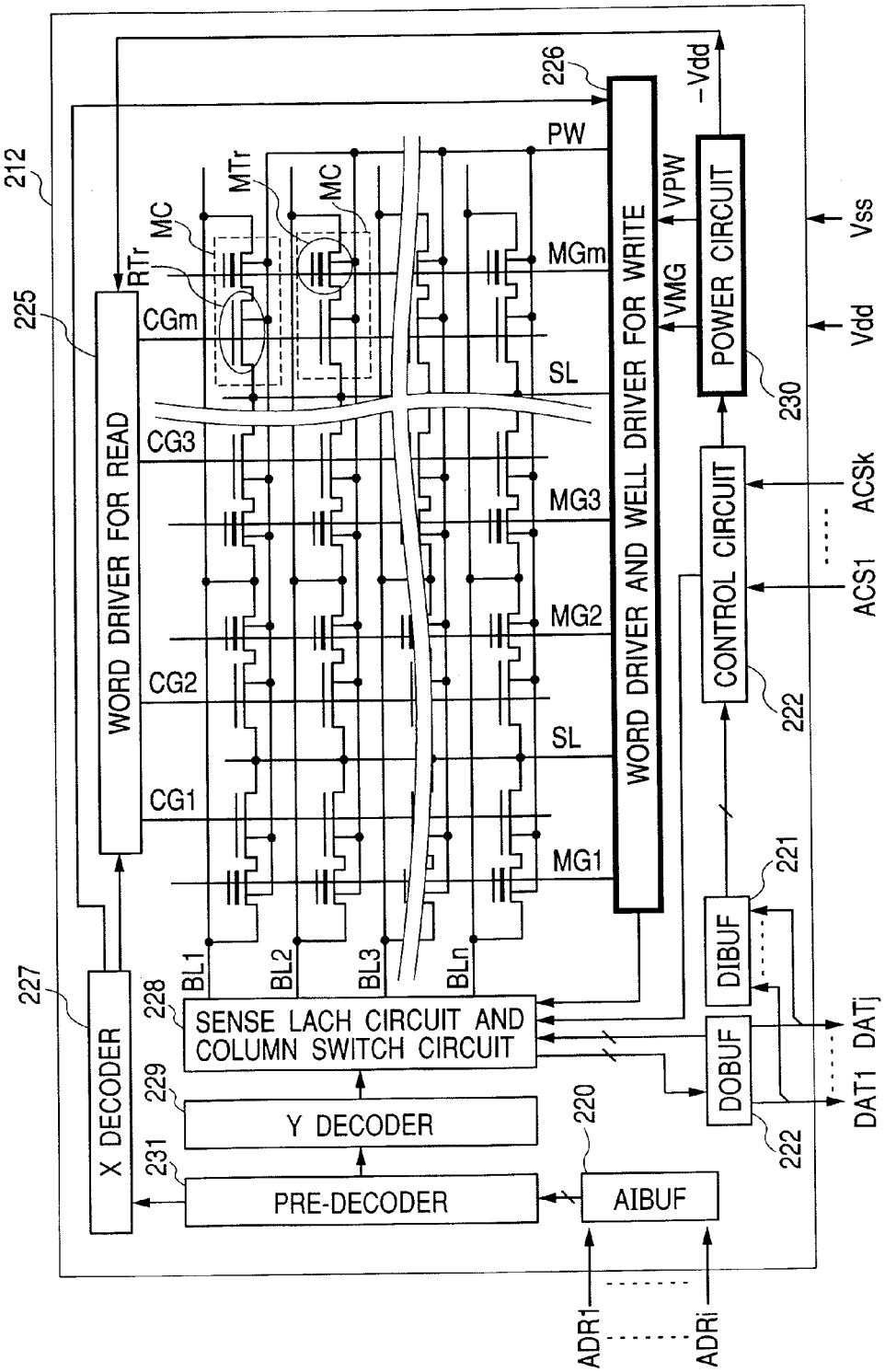
FIG. 9 is a block diagram illustrating the details of the flash memory.

A detailed example of the flash memory 212 is shown in FIG. 9. The flash memory 212 has a memory cell block in which a large number of memory cells MCs, each as illustrated in FIGS. 2 and 3, are disposed in matrix form. The memory cells MCs are illustrated as being divided into read transistor units or sections (RTr) and memory transistor sections (MTr). Although not restricted in particular, the large number of memory cells MCs are respectively configured as NOR type memory cell blocks wherein source lines SLs are made common, and n bit lines BL1 through BLn, m control gate lines CG1 through CGm and m memory gate lines MG1 through MGm are provided. Although not restricted in particular, the memory cell blocks share the well region in which the memory cell transistors are formed. In practice, a large number of memory cell blocks are disposed in obverse and reverse directions of the sheet to thereby constitute a flash memory.

The control gate lines CG1 through CGm are driven by a word driver for read 225. The memory gate lines MG1 through MGm, source lines SLs and well region PW are driven by a word driver and well driver for write 226. The selection of the control gate line and the memory gate line to be driven is performed by an X decoder 227. The bit lines are connected to a sense latch circuit and column switch circuit 228. The sense latch circuit is connectable to data buffers 221 and 222 by the corresponding column switch circuit, and a Y decoder 229 effects the selection of its connection on the column switch circuit 228. A power circuit 230 generates the internal voltages necessary for memory operations.

The flash memory 212 is placed under access control of the FLC 205 which responds to access requests made from the CPU 201 and the DMAC. The FLC 205 is connected to the flash memory 212 via address lines ADR1 through ADRi, data lines DAT1 through DATj and control lines ACS1 through ACSk. An address input buffer (AIBUF) 220 inputs address signals through the address lines. The input address signals are supplied to the X decoder 227 and Y decoder 229 through a predecoder 231. The data input buffer (DIBUF) 221 inputs access commands and write data through the data lines DAT1 through DATj. The data output buffer (DOBUF) 222 outputs read data sent from each memory cell. A control circuit 223 inputs strobe signals, such as a read signal, a write signal, a command enable signal, an address enable signal, etc. through the control lines ACS1 through ACSk and controls an input/output operation to the outside. Further, the control circuit 223 inputs an access command through the data input buffer 221 and controls a memory operation specified by the input command.

In FIG. 9, each of the word driver and well driver 226 and the power circuit 230 comprises a high-withstand transistor having a gate insulating film whose thickness is 15 nm, for example. Other element circuits are respectively made of a logic MOS transistor (power voltage MOS transistor) having a relatively thin gate insulating film whose thickness is 2.7 nm. For example, an initial threshold voltage of a read transistor section (RTr) of each memory cell is designed to be 0.5V, an initial threshold voltage of each memory transistor section (MTr) is designed to be −0.5V, and a drain junction withstand voltage is designed to be 3.6V, respectively.

Figure 10:
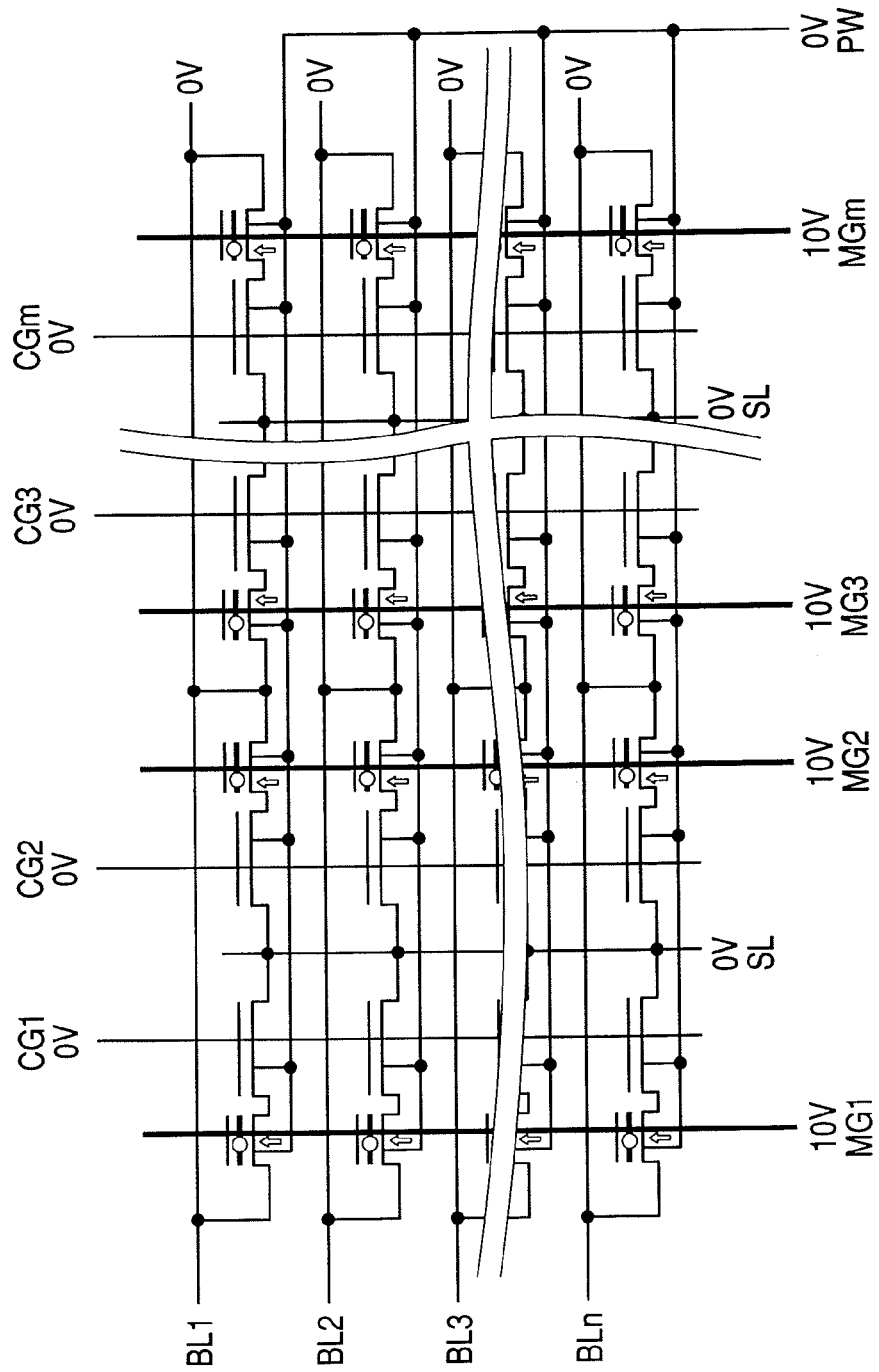
FIG. 10 is a circuit diagram illustrating the state of a memory array at an erase operation effected on the flash memory.

FIG. 10 illustrates a state at the time of an erase operation effected on the flash memory. Erasing is performed in memory cell block units, i.e., well region units of the memory cells. Namely, for example, an erase voltage of 10V is applied to all the memory gates (MG1 through MGm) in an erase block for an erase time of 100 ms, and a ground potential (Vss) 0V is applied to all of the other terminals to thereby trap electrons into the corresponding silicon nitride film by a tunneling current flowing via the lower oxide film below each memory gate MG and to increase the on-erase threshold voltage (VTE) of each memory transistor section MTr to 1.2V, whereby the erase operation is completed.

Figure 11:
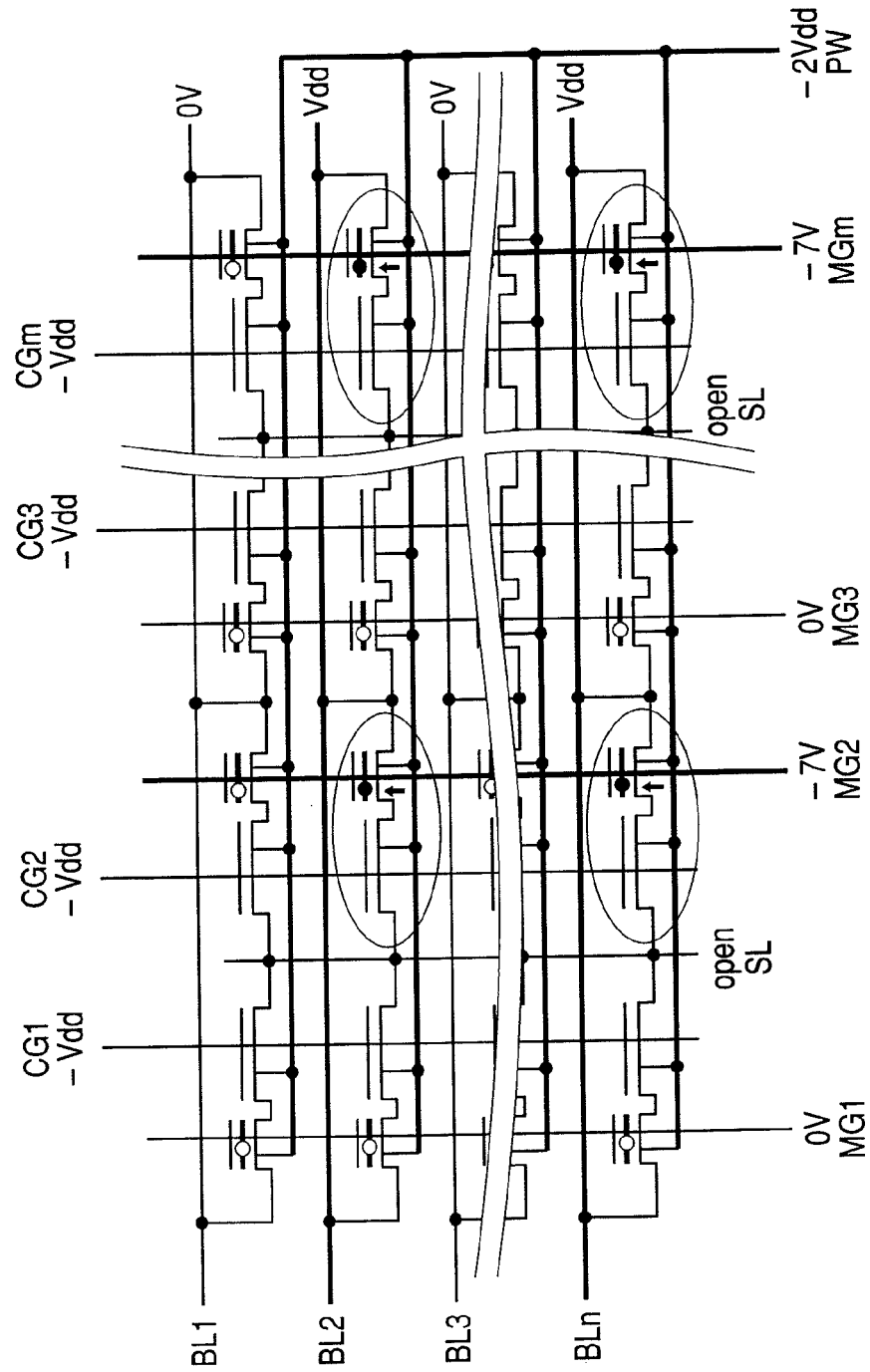
FIG. 11 is a circuit diagram illustrating the state of the memory array at a write operation effected on the flash memory.

FIG. 11 illustrates a state at the time of a write operation effected on the flash memory. For example, −2Vdd (−2.4V) is applied to the well region PW in a write block, −1.2V (−Vdd) is applied to all the control gate lines CG1 through CGm, and −7V is applied to only the corresponding memory gate lines (e.g., MG2 and MGm) on which writing is effected. Thereafter, 1.2V (Vdd) is applied to the corresponding bit lines (e.g., BL2 and BLn) on which writing is effected, for a write time of 10 μs, and hot holes generated in the neighborhood of the drain are injected into the silicon nitride film to thereby reduce the threshold voltage (VTP) of each memory transistor section MTr to −1.2V, whereby the write operation is completed.

Figure 12:
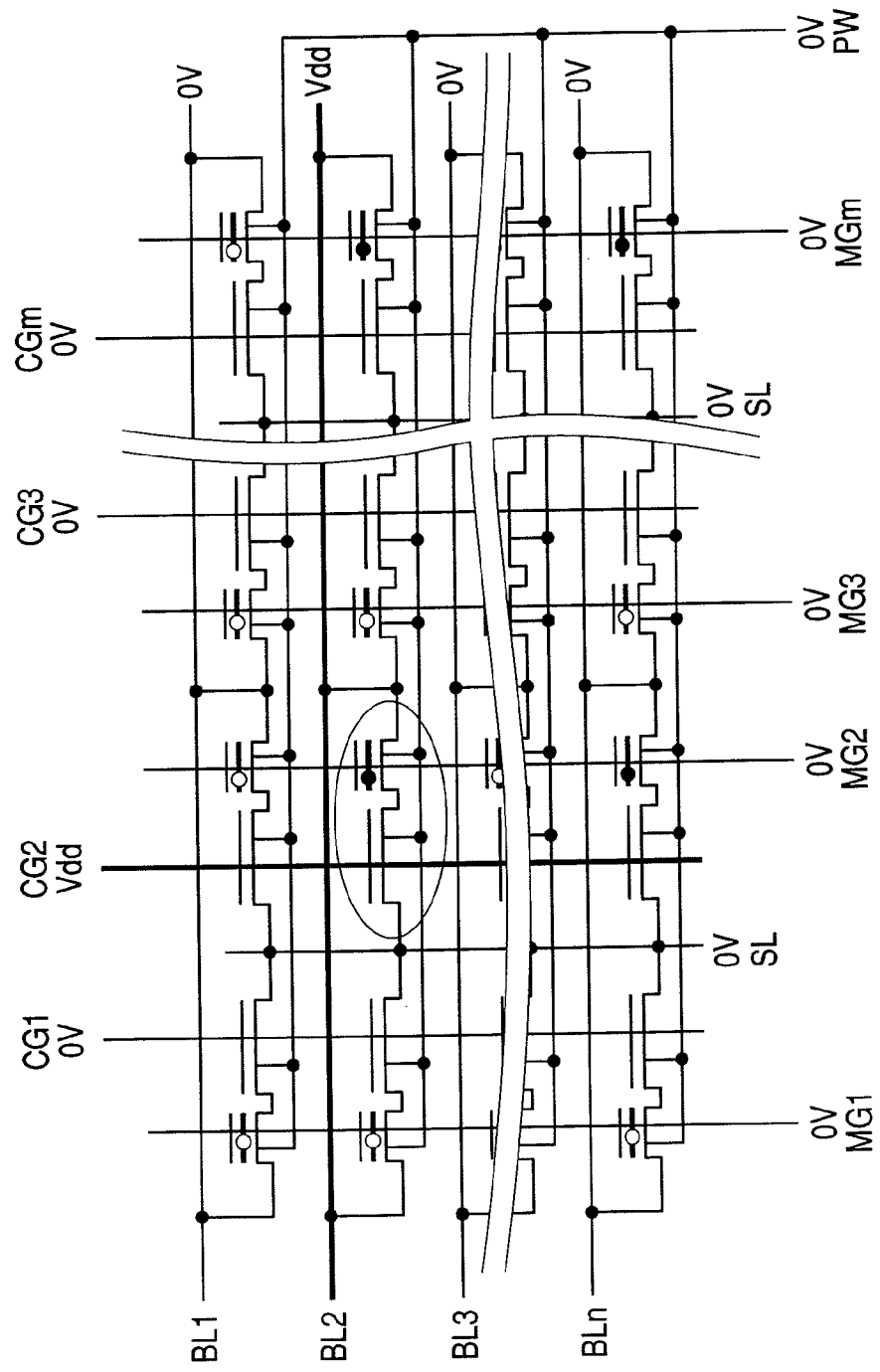
FIG. 12 is a circuit diagram illustrating the state of the memory array at a read operation effected on the flash memory.

FIG. 12 illustrates a state at the time of a read operation effected on the flash memory. For example, the corresponding bit line (e.g., BL2) on which reading is effected, is selected and precharged to 1.2V (Vdd). Thereafter, 1.2V (Vdd) is applied to the selected control gate line (e.g., CG2), and a change in the potential on the bit line BL2 intended for reading is detected by the corresponding sense amplifier circuit, whereby the reading of data is carried out. Since, at this time, the read-intended memory cell connected to the bit line BL2 and the control gate line CG2 is in a write state and the threshold voltage of each memory transistor is set to VTP=−1.5V, an on-current of each memory cell is set to about 50 μA. The sense amplifier circuit detects a change in the current or a change in voltage with its change.

Figure 13:
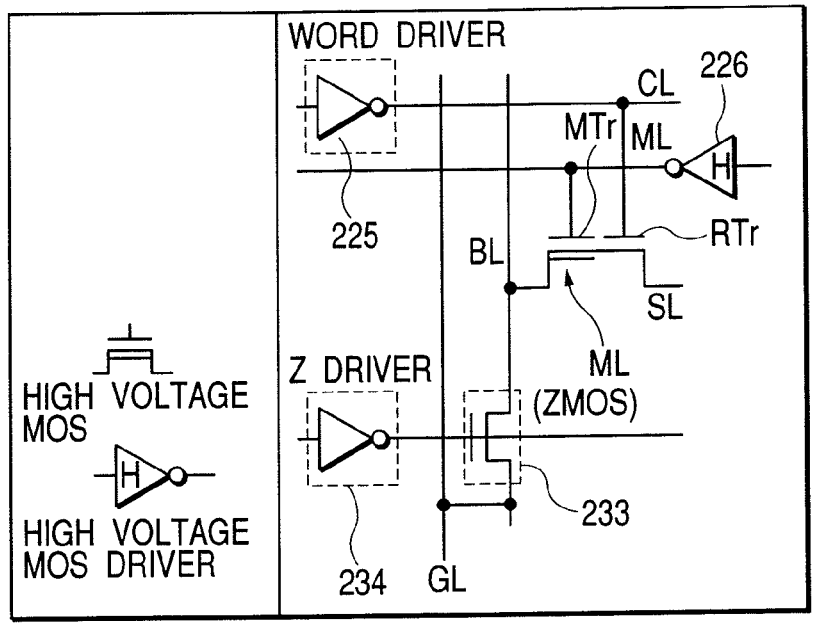
FIG. 13 is a diagram illustrating another bit line structure in a memory cell block.

FIG. 13 illustrates another bit line structure of the memory cell block. The configuration shown in the drawing is of a structure wherein each bit line is hierarchized into a global or main bit line GL and a sub bit line SBL, only the sub bit line SBL to which the corresponding memory cell MC to be operated and selected is connected, is selected and connected to the global bit line GL, and the parasitic capacitance of the corresponding bit line associated with the memory cell is apparently reduced to thereby realize a high-speed read operation. Since there is no need to apply a high voltage to the bit lines BL and GL even in the case of writing, as described above, it is not necessary to bring a MOS transistor 233 and its driver (Z driver) 234 for selectively connecting the sub bit line SBL to the global bit line GL into a high withstand state. Namely, the structure is made of a MOS transistor (power voltage MOS transistor) having a gate insulating film of a relatively thin thickness of 2.7 nm. Even in regard to this point of view, the Gm of a path for reading memory information is further reduced, and, hence, the speeding-up by the hierarchized bit-line structure based on the global/sub bit lines can be fully made functional.

<<Memory Cell Transistor; Threshold Control>>

Figure 14:
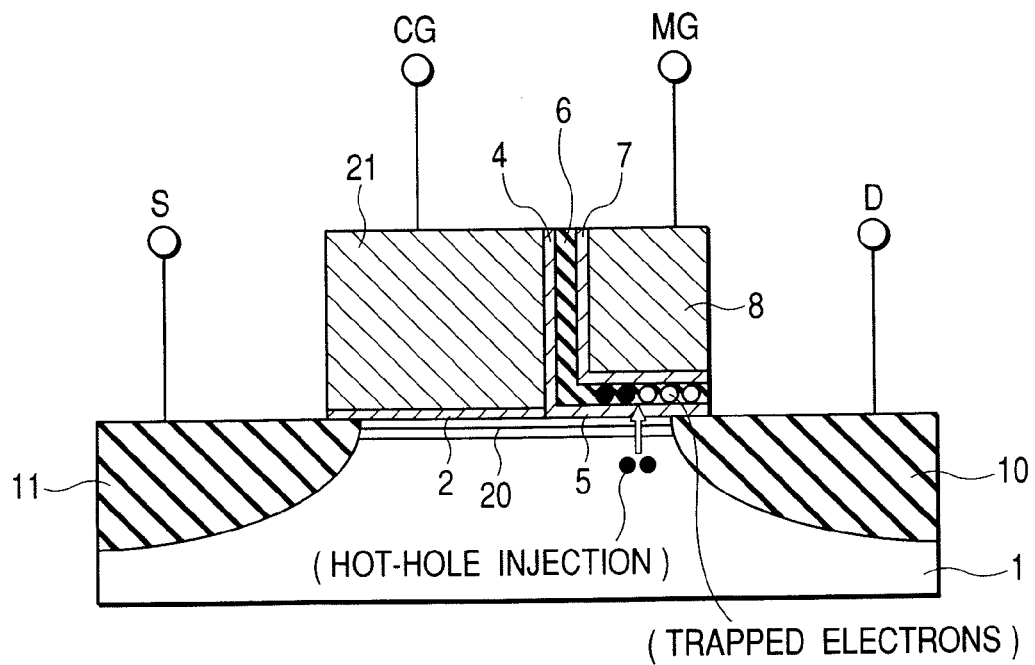
FIG. 14 is a vertical cross-sectional view showing another example of a memory cell transistor.

FIG. 14 shows another example of the nonvolatile memory cell transistor. The memory cell shown in the drawing represents an example in which the doping of the control gate and memory gate of the memory cell shown in FIG. 1 with the impurity is changed to thereby obtain a desired initial threshold voltage under the same channel structure. Namely, the whole surface of a channel region of a semiconductor substrate (well region) 1 is brought into depletion by channel implantation, and a control gate 21 and a memory gate 8 are changed in conductivity type to thereby cause threshold voltages of a selection transistor section (read transistor section) and a memory transistor section to differ from each other.

More specifically, according to the vertical sectional structure illustrated in FIG. 14, a read transistor section is formed with the control gate (CG) 21 made of a 150 nm-thick p-type polysilicon film doped with a boron whose concentration is $2 \times 10^{20}$ cm$^{-3}$, in a surface region of a p-type semiconductor substrate (well region) 1 having a resistivity of 10 Ωcm with a gate insulating film 2 formed of a silicon oxide film having a thickness of 2.7 nm being interposed therebetween. There is also a memory transistor section in which a lower oxide film 5 having a thickness of 3 nm, a silicon nitride film 6 having a thickness of 5 nm, and an upper oxide film 7 having a thickness of 5 nm are laminated over the surface region of the p-type semiconductor substrate (well region) 1 on the drain side of the control gate (CG) 21, and a memory gate (MG) 8 having a gate length of 50 nm, which is made of an n-type polysilicon film which is doped with phosphor whose concentration is $4 \times 10^{20}$ cm$^{-3}$, and which has a thickness of 150 nm, is formed over the above films. Incidentally, the memory gate (MG) 8 and the control gate (CG) 21 are electrically isolated from each other by the laminated film formed of the respective films 5, 6 and 7.

A drain region 10 having a maximum arsenic concentration of $1.5 \times 10^{20}$ cm$^{-3}$, a junction depth of 40 nm and a junction withstand voltage of 4.5V is formed in the surface region of the semiconductor substrate (well region) which overlaps with the memory gate (MG) 8. A source region 11 having a maximum arsenic concentration of $1.5 \times 10^{20}$ cm$^{-3}$, a junction depth of 40 nm, and a junction withstand voltage of 4.5V is formed in the surface region of the semiconductor substrate (well region) 1, which overlaps with the control gate (CG) 21. Namely, the read transistor section and the memory transistor section are configured over a channel region 20 lying between the drain region 10 and the source region 11.

Initial threshold voltages of the read transistor section and the memory transistor section of the memory cell illustrated in FIG. 14 are determined by the n-type channel region 20 formed in the surface region of the semiconductor substrate (well region) 1. The n-type channel region 20 is set such that the threshold voltage of the read transistor section, which is made of, for example, a control gate (CG) 21 formed of a polysilicon film of conductivity type corresponding to a p type, becomes 0.5V. The average arsenic concentration thereof is $5 \times 10^{17}$ cm$^{-3}$, and the junction depth thereof is 30 nm. At this time, the initial threshold voltage of the memory transistor section comprising the memory gate (MG) 8 formed of the polysilicon film whose conductivity type is an n type, was −0.5V. Thus, according to the memory cell of the present embodiment, the initial threshold voltages of the read transistor section and the memory transistor section can be made appropriate owing to only the formation of the n-type channel region 20.

Write and erase operations effected on the memory cell according to the present embodiment are basically similar to the operations of the memory cell shown in FIG. 1. In the case of the erase operation, 10V is applied to only the memory gate (MG) 10 to inject electrons from the semiconductor substrate 1 side by a tunneling current and trap them into the silicon nitride film 6, whereby the memory cell is brought to a high threshold voltage state. In the case of the write operation, 1.2V (Vdd) is applied to the drain 10, −2.4V (−2Vdd) is applied to the semiconductor substrate 1, −1.2V (−Vdd) is applied to the control gate (CG) 21, and −7V is applied to the memory gate 8 to inject hot holes generated in the neighborhood of a junction surface of the drain 10 into the silicon nitride film 6, thereby neutralizing trapped electrons, whereby the memory cell is brought to a low threshold voltage state.

<<Manufacturing Method>>

A manufacturing process for mixing the nonvolatile memory cell into a logic LSI by use of a 0.13 μm process technology, for example, will be described using cross-sectional views of an LSI (see FIGS. 15 through 30) representing sequential manufacturing process steps. Although not restricted in particular in the description made herein, the mask pattern layout shown in FIG. 4 will be used for mask patterns for processing a memory cell. Incidentally, the left sides of the cross-sectional views (see FIGS. 15 through 30) respectively indicate a memory cell forming region (memory cell), the central portions thereof respectively indicate a power voltage MOS transistor forming region (power voltage MSO), and the right sides thereof respectively indicate a high voltage MOS transistor forming region (high voltage MOAS). Incidentally, lines X-X shown in FIG. 15, etc. indicate cut regions of portions formed by cutting off the left and right portions and plotting them for convenience.

Figure 15:
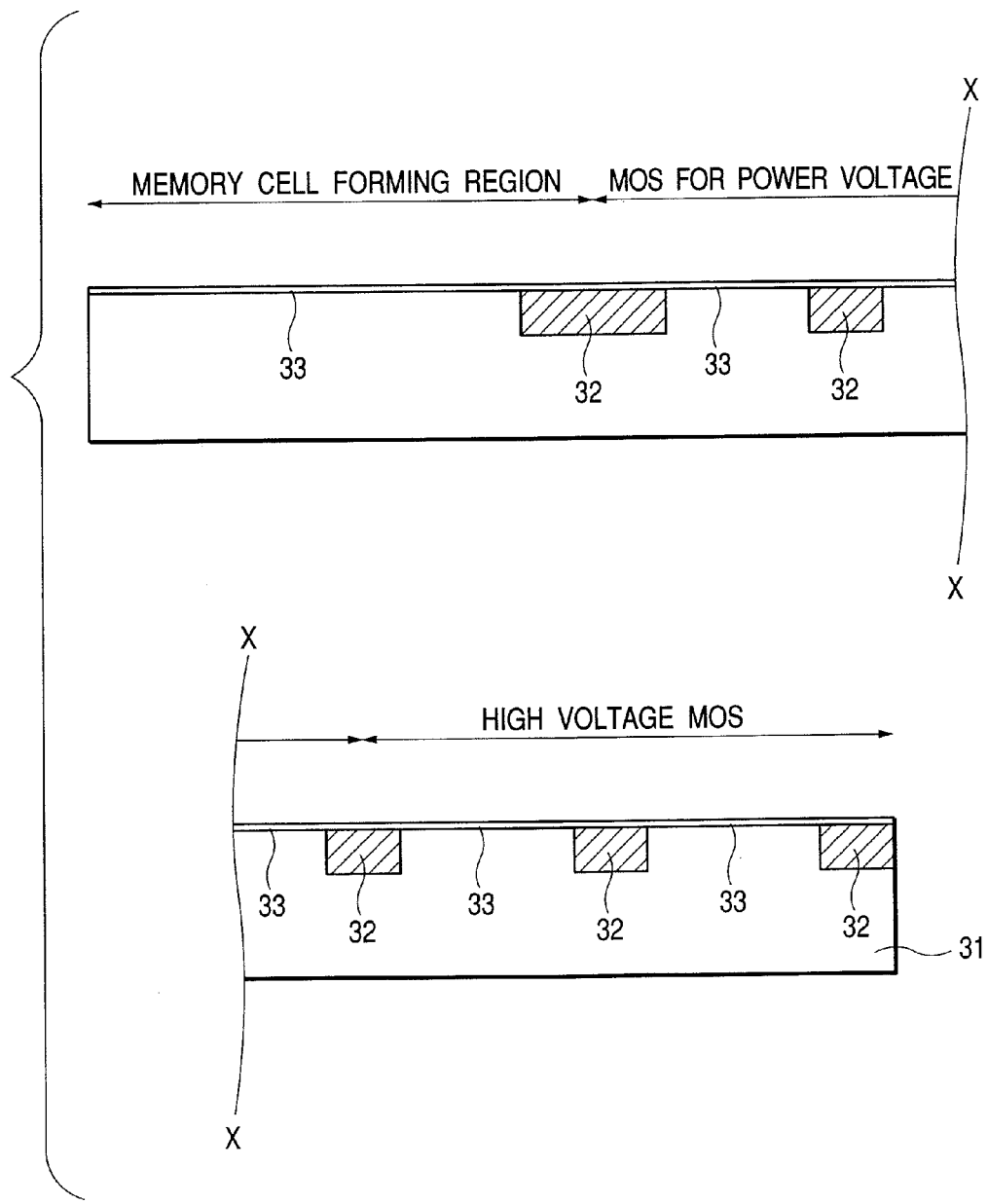
FIG. 15 is a fragmentary vertical cross-sectional view of an LSI in a step of the manufacturing process at the time that the logic LSI is mixed with a nonvolatile memory cell as illustrated in FIG. 2 by a 0.13 µm process technology.

As shown in FIG. 15, trenches each having a depth of about 250 nm are defined in a surface region of a p-type semiconductor substrate 31 (corresponding to the semiconductor substrate (well region) 1) having a resistivity of 10 Ωcm, for example, and thereafter an oxide film is deposited. Next, the oxide film is polished by a CMP (Chemical Mechanical Polishing) method to embed the oxide film into the trenches, followed by formation of trench type device isolation regions 32 planarized by the CMP method. Thereafter, a surface oxide film 33 having a thickness of 10 nm is grown on the trench type device isolation regions 32. Incidentally, while the trench type device isolation regions 32 are formed so as to define active regions 22, dummy active regions may be formed in the trench type device isolation regions to facilitate the embedding by the CMP method.

Figure 16:
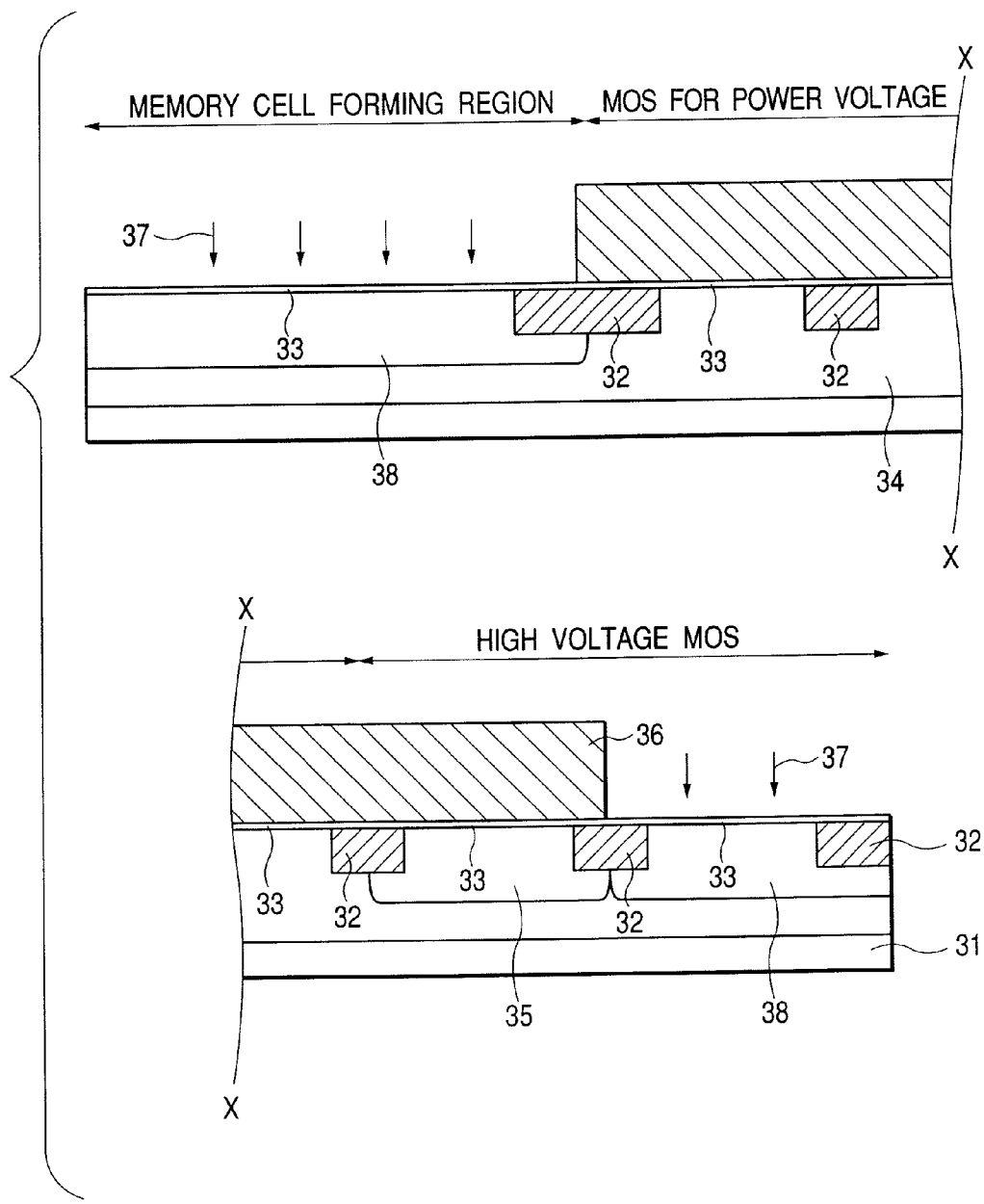
FIG. 16 is a fragmentary vertical cross-sectional view of the LSI in a step of the manufacturing process following FIG. 15.

Next, as shown in FIG. 16, phosphor ions each having an acceleration energy of 1 MeV are injected into a desired region in an injection amount of $1\times10^{13}/cm^2$ through the surface oxide film 33, and phosphor ions each having an acceleration energy of 500 keV are injected therein in an injection amount of $3\times10^{12}/cm^2$ therethrough to thereby form an n-type embedding region 34. Thereafter, phosphor ions each having an acceleration energy of 150 keV are injected into a region in which a high voltage PMOS transistor is formed, in an injection amount of $1\times10^{12}/cm^2$, thereby forming a high voltage n-type well region 35. Using a resist pattern 36 having a thickness of 3 μm as a mask in a state of only a memory cell region and a high voltage NMOS transistor forming region being open, boron ions each having an acceleration energy of 500 keV are further injected in an injection amount of $1\times10^{13}/cm^2$, boron ions each having an acceleration energy of 150 keV are injected in an injection amount of $5\times10^{12}/cm^2$, and boron ions 37 each having an acceleration energy of 50 keV are injected in an injection amount of $1\times10^{12}/cm^2$ to thereby form a high voltage p-type well region 38.

Figure 17:
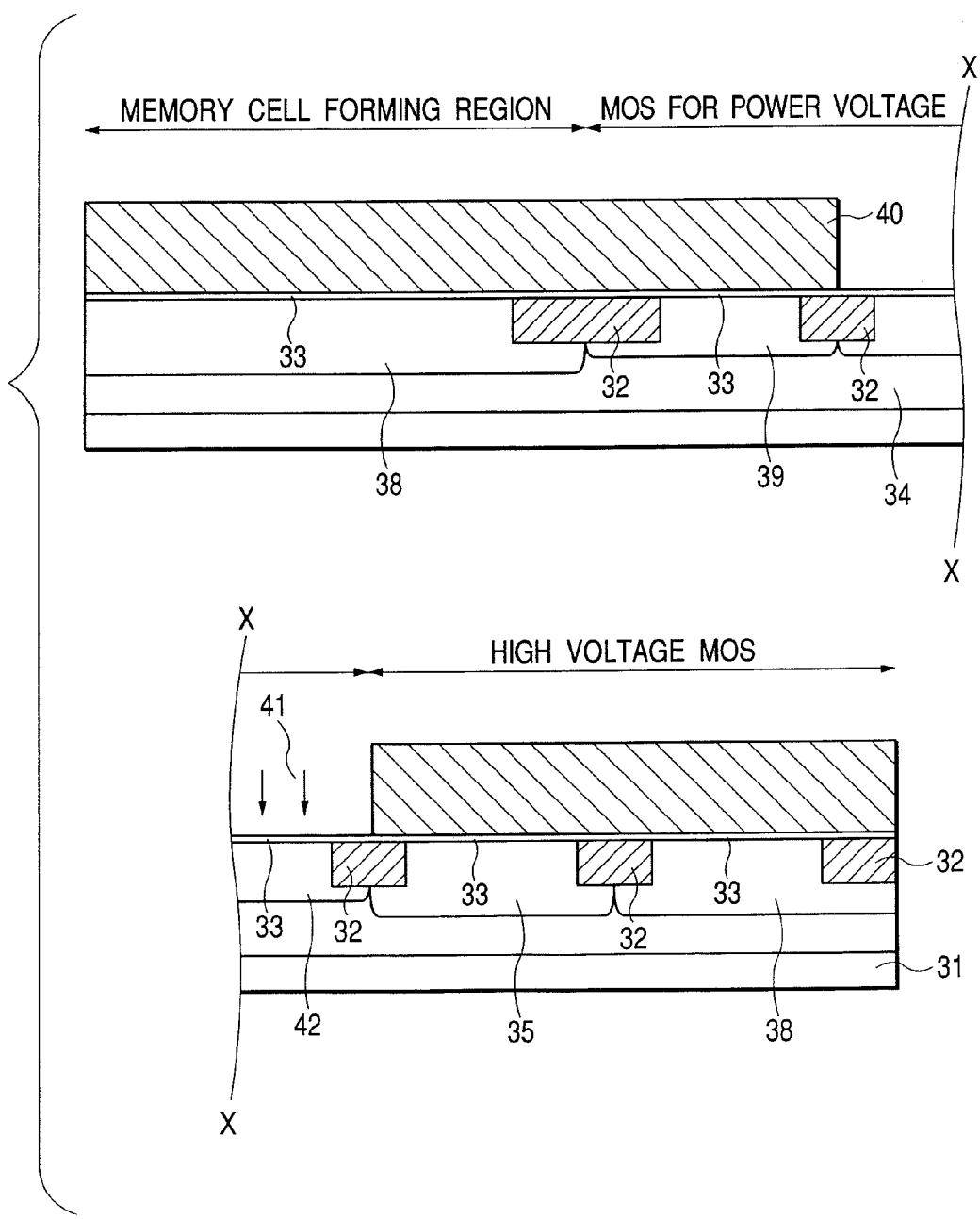
FIG. 17 is a fragmentary vertical cross-sectional view of the LSI in a step of the manufacturing process following FIG. 16.

Next, as shown in FIG. 17, phosphor ions each having an acceleration energy of 100 keV are injected into a region in which power voltage-operated PMOS transistor is formed, in an injection amount of $1\times10^{12}/cm^2$. Further, phosphor ions each having an acceleration energy of 40 keV are injected therein in an injection amount of $5\times10^{11}/cm^2$ to thereby form a power voltage n-type well region 39. Using a resist pattern 40 having a thickness of 3 μm as a mask in a state of only a region in which a power voltage-operated NMOS transistor is formed, being open, boron ions each having an acceleration energy of 200 keV are injected in an injection amount of $1\times10^{13}/cm^2$, boron ions each having an acceleration energy of 100 keV are injected in an injection amount of $5\times10^{12}/cm^2$, and boron ions 41 each having an acceleration energy of 30 keV are injected in an injection amount of $2\times10^{12}/cm^2$ to thereby form a power voltage p-type well region 42.

Figure 18:
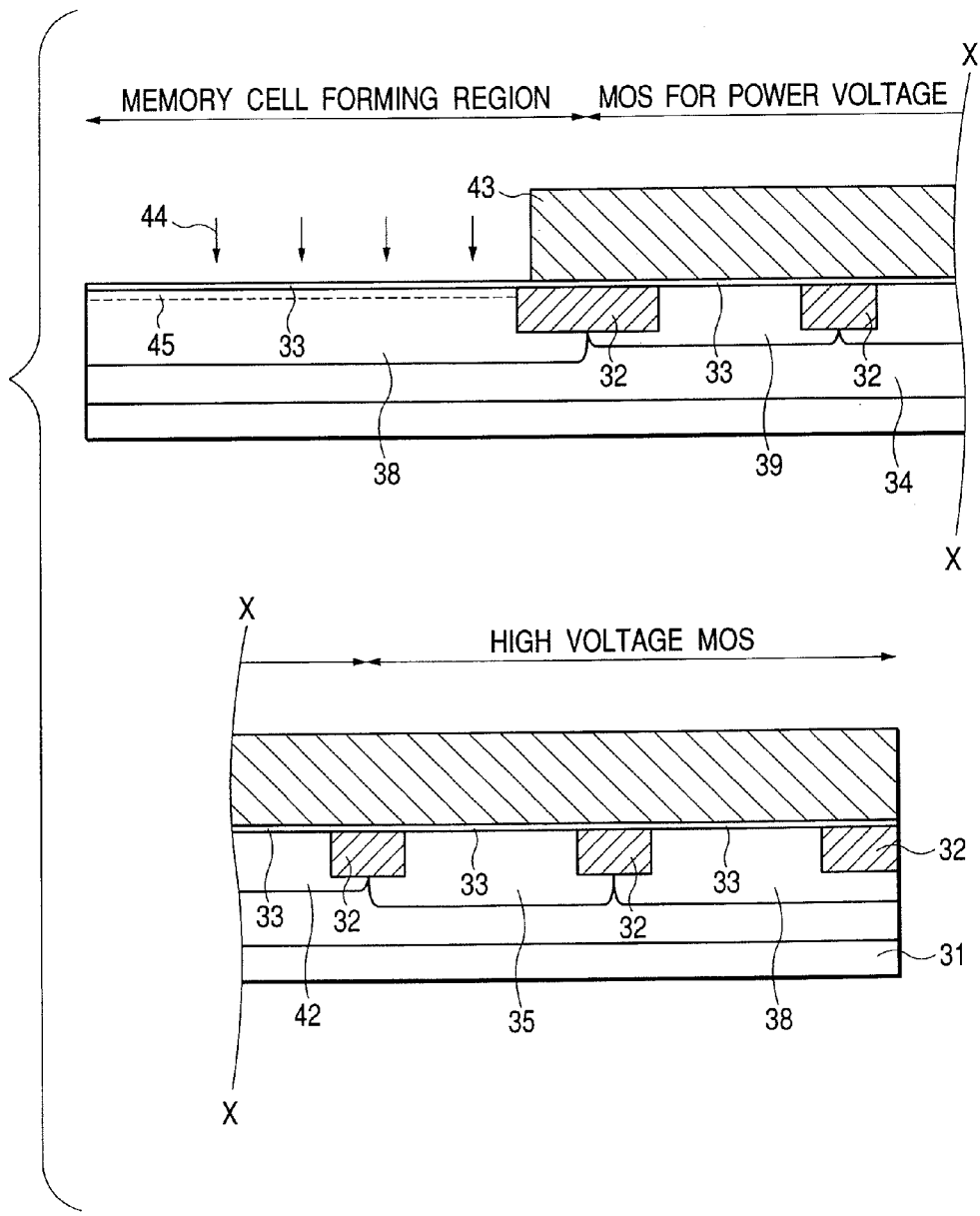
FIG. 18 is a fragmentary vertical cross-sectional view of the LSI in a step of the manufacturing process following FIG. 17.

Next, as shown in FIG. 18, boron difluoride ($BF_2$) ions 44 each having an acceleration energy of 50 keV are injected in an injection amount of $2\times10^{12}/cm^2$ using a resist pattern 43 having a thickness of 1.5 μm as a mask in a state of only the memory cell region being open, to thereby form a memory enhance implantation region 45.

Figure 19:
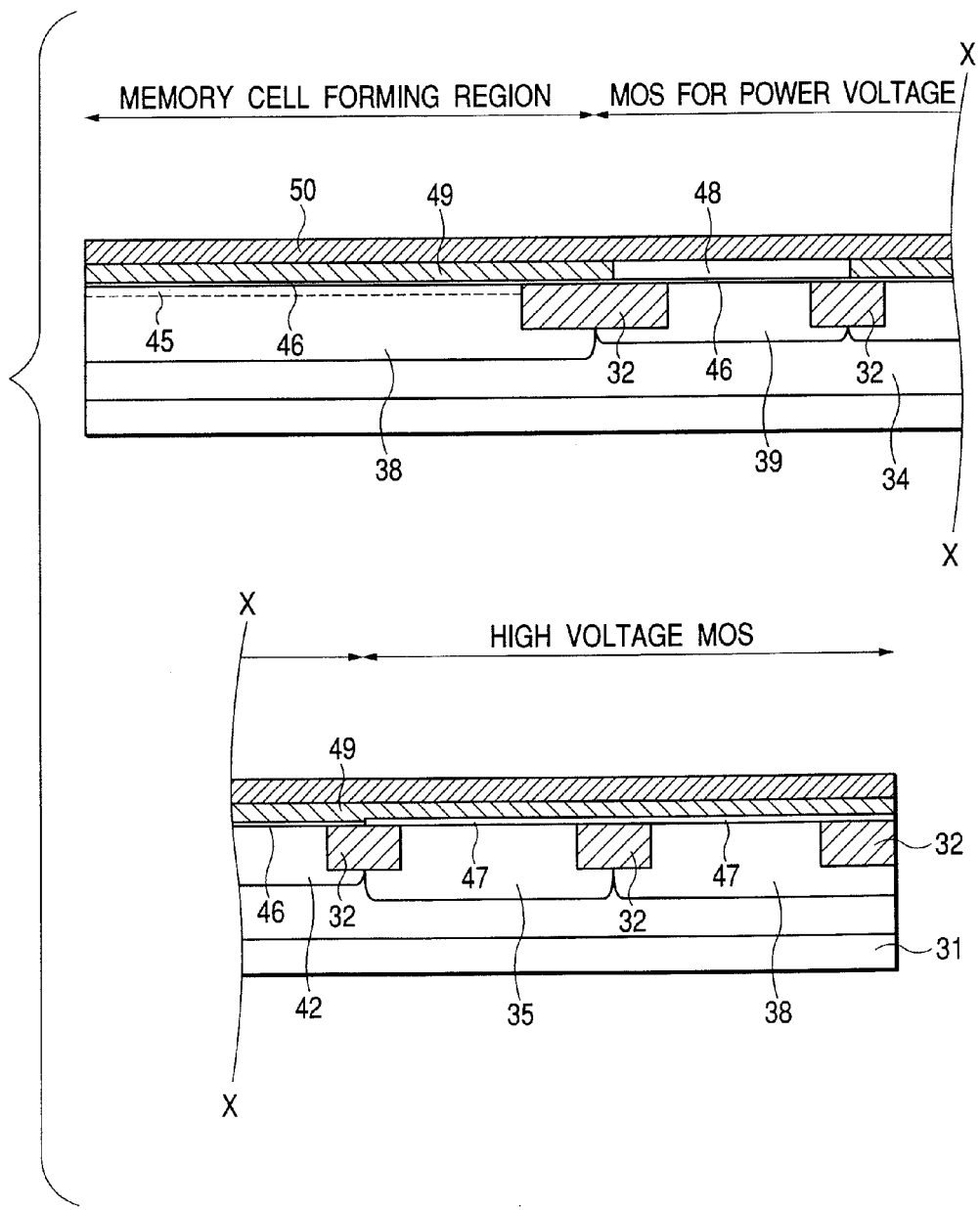
FIG. 19 is a fragmentary vertical cross-sectional view of the LSI in a step of the manufacturing process following FIG. 18.

As shown in FIG. 19, the resist mask 43 and the surface oxide film 33 are thereafter removed. A high voltage gate insulating film 47 having a thickness of about 15 nm, which is made of a silicon oxide film, is grown, by, for example, thermal oxidation, in the region in which the high voltage transistor is formed. A power voltage gate insulating film 46 (corresponding to the gate insulating film 2) having a thickness of about 2.7 nm, which comprises the silicon oxide film, is grown in the region in which the power voltage-operated transistor (power voltage MOS transistor) is formed, and the region in which the memory cell is formed. Thereafter, they are deposited by chemical vapor deposition (CVD). Further, a non-doped polysilicon film 48 having a thickness of 150 nm is deposited. Phosphor ions each having an acceleration energy of 5 keV are injected into a region other than the power voltage-operated PMOS transistor forming region, of the non-doped polysilicon film 48 in an injection amount of $2\times10^{15}/cm^2$ to thereby form an n-type polysilicon film 49. A silicon nitride film 50 having a thickness of 100 nm is deposited thereabove by CVD.

Figure 20:
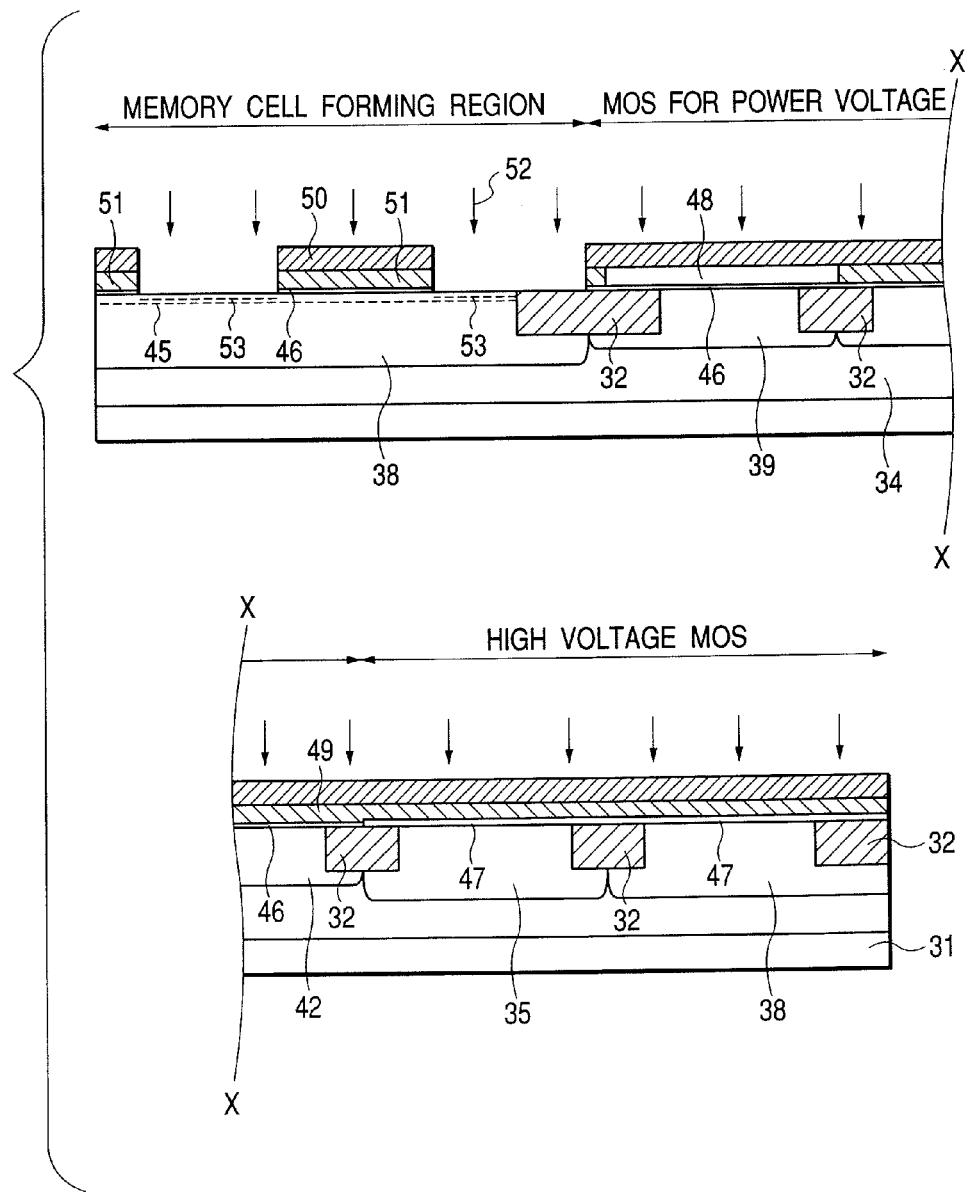
FIG. 20 is a fragmentary vertical cross-sectional view of the LSI in a step of the manufacturing process following FIG. 19.
Figure 31:
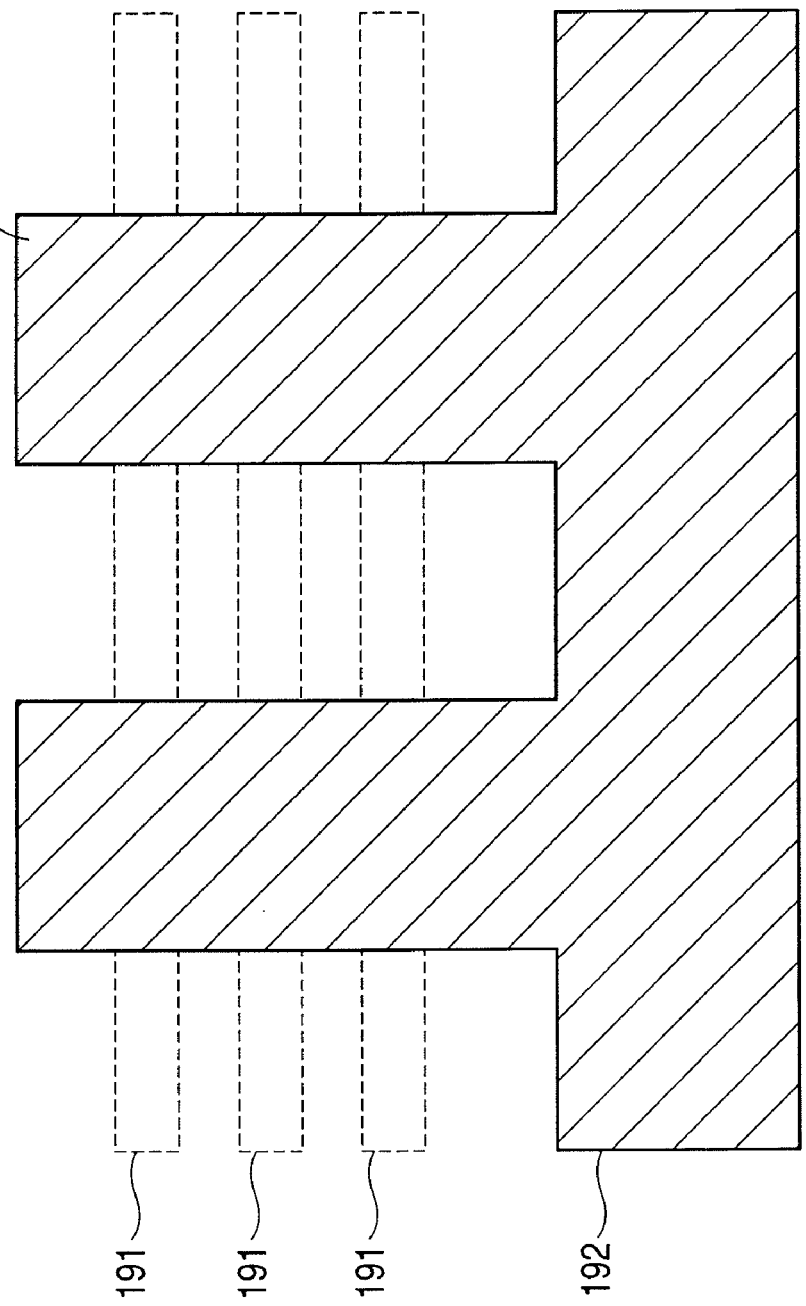
FIG. 31 is a plan view showing a flat pattern of a memory cell unit corresponding to FIG. 20.

Next, as shown in FIG. 20, the n-type polysilicon film 49 and the silicon nitride film 50 in the memory cell region are processed using the first gate film pattern 192 for defining the drain side of the control gate in the memory cell of the present invention shown in FIG. 4 to thereby form first gate film patterns 50 and 51 each corresponding to the shape of the first gate film pattern 192. Using the first gate film patterns as masks, arsenic ions 52 each having an acceleration energy of 10 keV are injected in an injection amount of $3\times10^{12}/cm^2$ to thereby form memory depletion implantation regions 53. A plan or flat pattern of a memory cell section corresponding to FIG. 20 is shown in FIG. 31.

Incidentally, the polysilicon films 48 and 49 left in the power voltage MOS transistor forming region and the high voltage MOS transistor forming region are respectively configured as gate electrodes of a power voltage MOS transistor and a high voltage MOS transistor as will be described later. Namely, since it is not necessary to form the gate insulating film 47 of the high voltage MOS transistor in the subsequent process steps, the corresponding memory cell can be formed after the formation of the gate insulating film 47 so as to be thick in thickness. Thus, thermal treatment for forming the thick gate insulating film 47 is not loaded on the formation of the memory cell, and hence the degree of freedom of device design of the memory cell can be enhanced and a burden on the forming process can be reduced.

Figure 21:
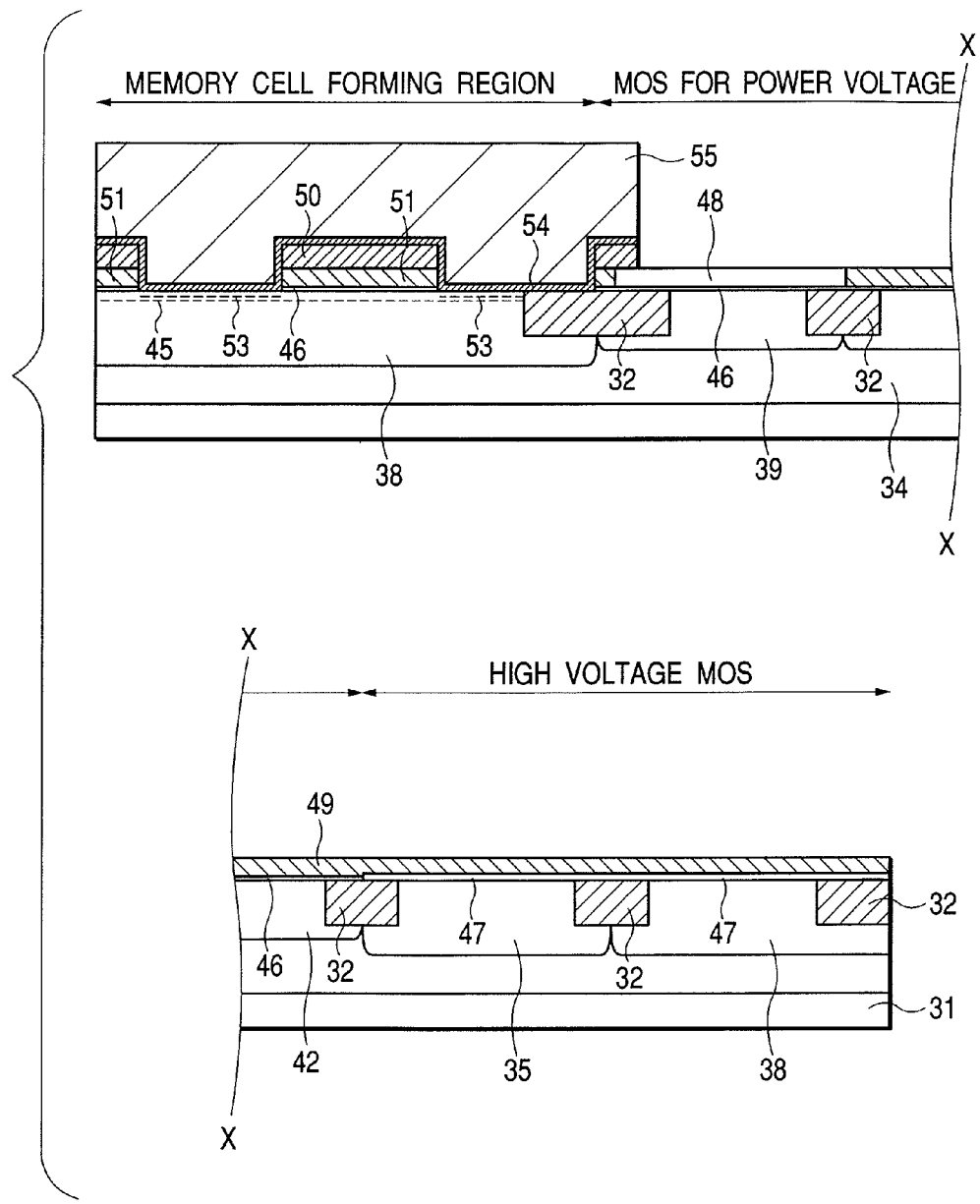
FIG. 21 is a fragmentary vertical cross-sectional view of the LSI in a step of the manufacturing process following FIG. 20.

Next, as shown in FIG. 21, a laminated film 54 comprising a lower oxide film (corresponding to the lower oxide film 5) of a thermal oxidation film having a thickness of about 3 nm, a silicon nitride film (corresponding to the silicon nitride films 6 and 25) having a thickness of about 5 nm, corresponding to a charge storage region, and an upper oxide film (corresponding to the upper oxide films 7 and 26) of a CVD oxide film having a thickness of about 5 nm is deposited on the surface region of the semiconductor substrate 31 in the memory cell region, for example. The laminated film 54 in the peripheral transistor region and the silicon nitride film 50 are removed by dry etching with a resist pattern 55 having a thickness of 2 μm, having covered the memory cell region alone, being used as a mask. Incidentally, an insulating film made of a silicon oxide film 4 is formed on side walls of each first gate film pattern 51 made of the n-type polysilicon film by thermal oxidation for forming the lower oxide film 5, so as to be thicker than the lower oxide film 5.

Figure 22:
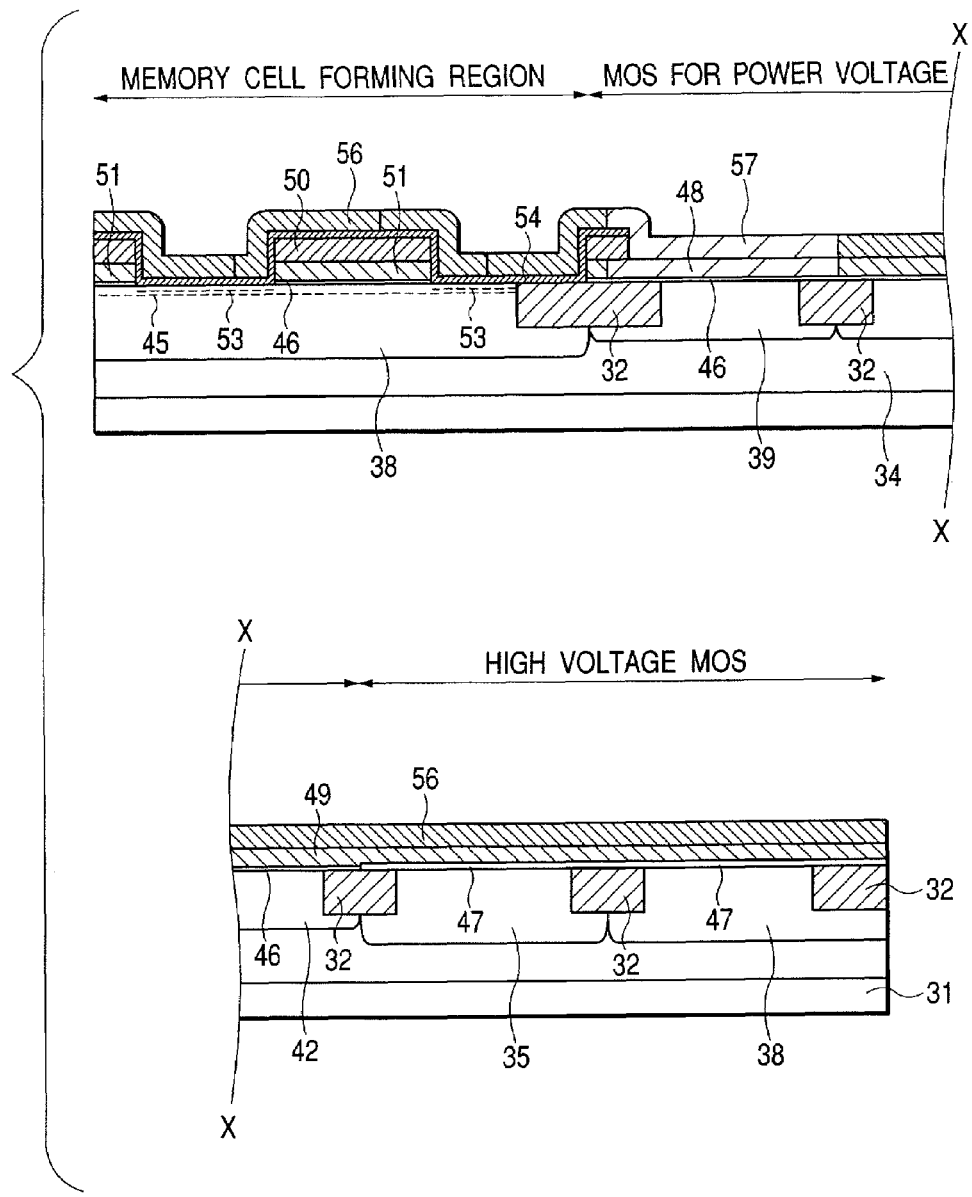
FIG. 22 is a fragmentary vertical cross-sectional view of the LSI in a step of the manufacturing process following FIG. 21.

Next, as shown in FIG. 22, the resist film 55 is removed, and thereafter a non-doped polysilicon film having a thickness of about 50 nm is deposited over the whole surface of the substrate including the polysilicon films 48 and 49 by, for example, CVD. Boron difluoride ($BF_2$) ions each having an acceleration energy of 15 keV are injected into a region in which a power voltage-operated PMOS transistor at the peripheral portion is formed, in an injection amount of $5 \times 10^{15}/cm^2$ to thereby form a p-type polysilicon film 57. Phosphor ions each having an acceleration energy of 5 keV are injected into all regions other than the power voltage-operated PMOS transistor forming region in an injection amount of $5 \times 10^{15}/cm^2$ to thereby form an n-type polysilicon film 56.

Figure 23:
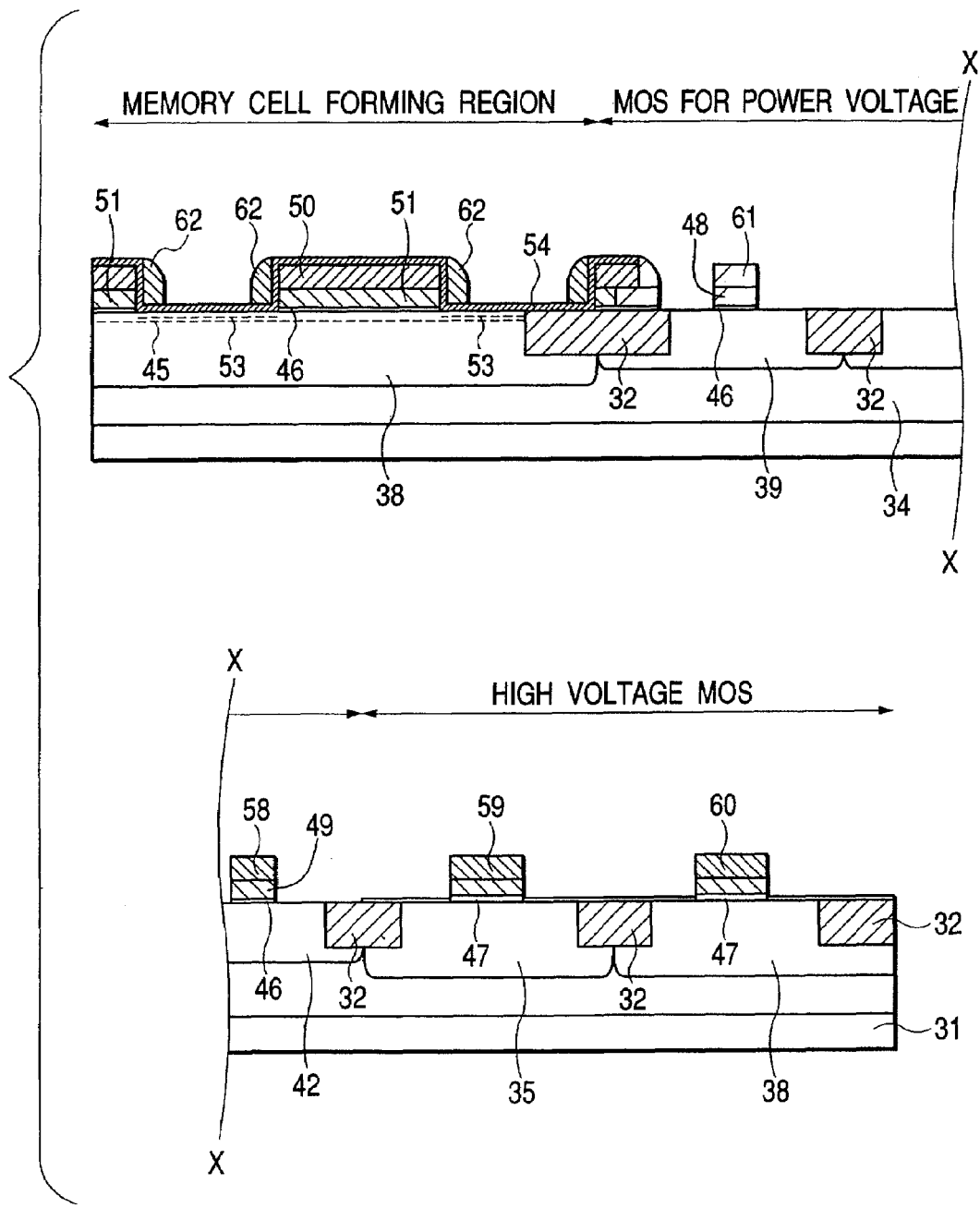
FIG. 23 is a fragmentary vertical cross-sectional view of the LSI in a step of the manufacturing process following FIG. 22.
Figure 32:
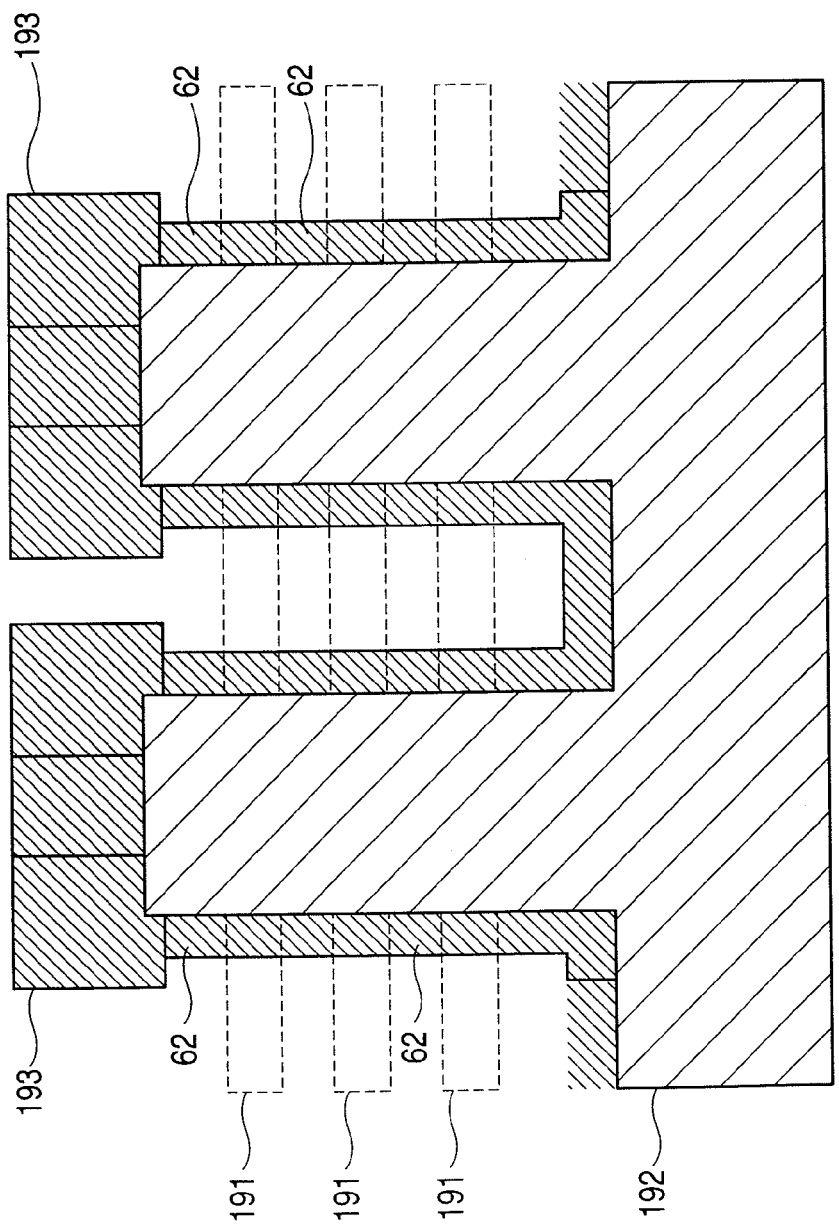
FIG. 32 is a plan view showing a flat pattern of the memory cell unit corresponding to FIG. 23.

Next, as shown in FIG. 23, for example, the n-type polysilicon film 56 and the p-type polysilicon film 57 are etched by anisotropic dry etching using the gate electrode patterns of the peripheral transistors to thereby form a power voltage-operated PMOS transistor gate 61, a power voltage-operated NMOS transistor gate 58, a high voltage PMOS transistor gate 59 and a high voltage NMOS transistor gate 60. At this time, the memory cell section is simultaneously etched using the second gate film patterns 193 shown in FIG. 4, to thereby form contact withdrawal regions 193 in regions covered with the second gate film patterns 193 and form side spacer-like memory gates 62 on side walls of the first gate film patterns 50 and 51 in regions uncovered with the second gate film patterns 193 through the insulating film 4, silicon nitride film 6 and CVD oxide film 7 on a self-alignment basis with respect to the first gate film patterns 50 and 51. A flat pattern of the memory cell section is shown in FIG. 32. Regions surrounded by thick lines 193 are covered with resist patterns and serve as the contact withdrawal regions 193. Portions uncovered with resist patterns serve as the sidewall spacers 62 and are formed on the side walls of the first gate film patterns 50 and 51 each corresponding to the shape of the first gate film pattern 192.

Figure 24:
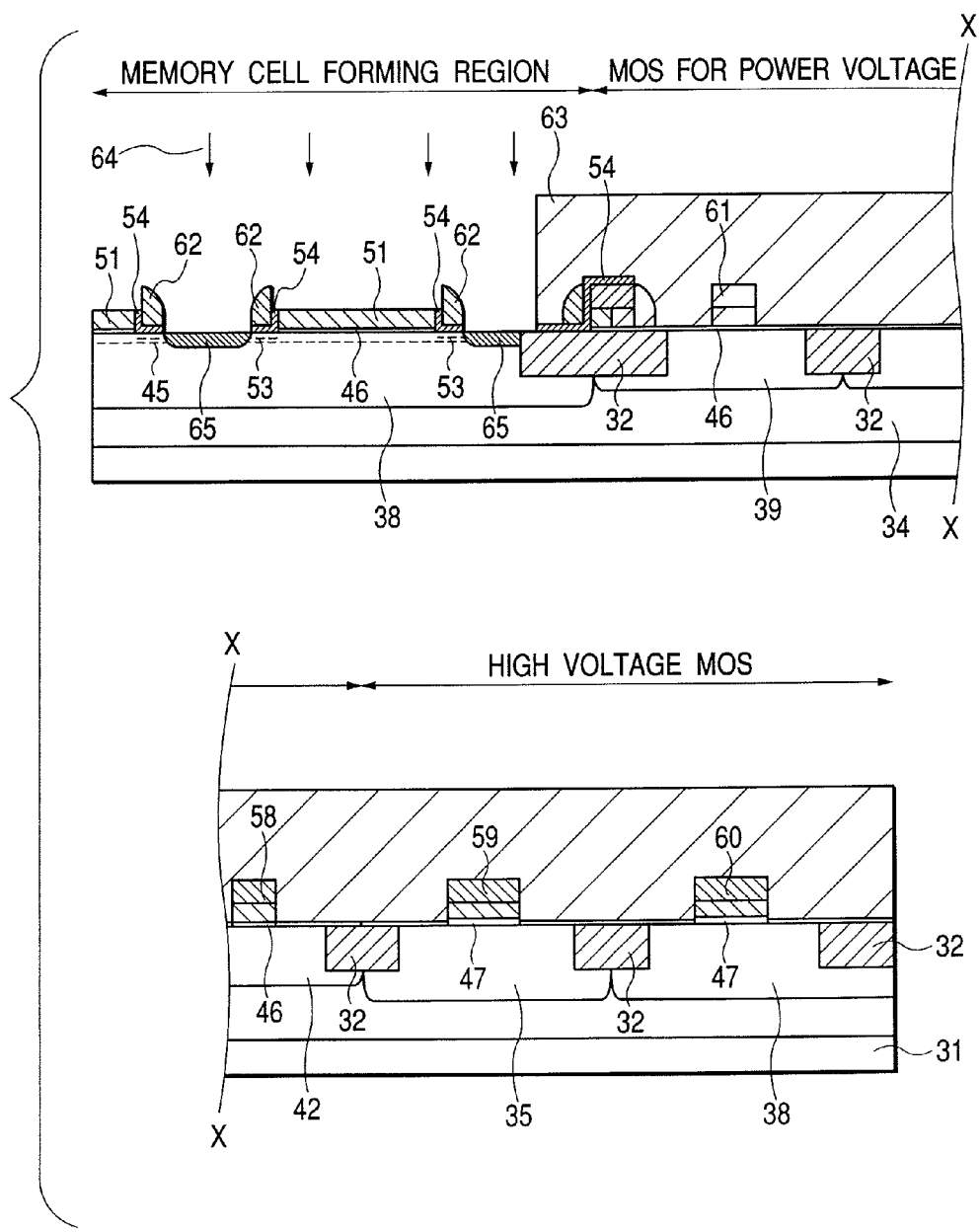
FIG. 24 is a fragmentary vertical cross-sectional view of the LSI in a step of the manufacturing process following FIG. 23.

Next, as shown in FIG. 24, the silicon nitride films 50 on the first gate film patterns 51 are removed by dry etching with, for example, a 2-μm thick resist film 63 being used as a mask in a state of the memory cell region being open. Thereafter, arsenic ions 64 each having an acceleration energy of 20 keV are injected in an injection amount of $5 \times 10^{14}/cm^2$ with the resist film 63 being used as the mask to thereby form memory drains 65. As shown in FIG. 24, vertical intervals are respectively formed between the side space-like memory gates 62 and control gates based on the first gate film patterns 51. Namely, each side spacer-like memory gate 62 is formed higher than that of the control gate based on each first gate film pattern 51.

Figure 25:
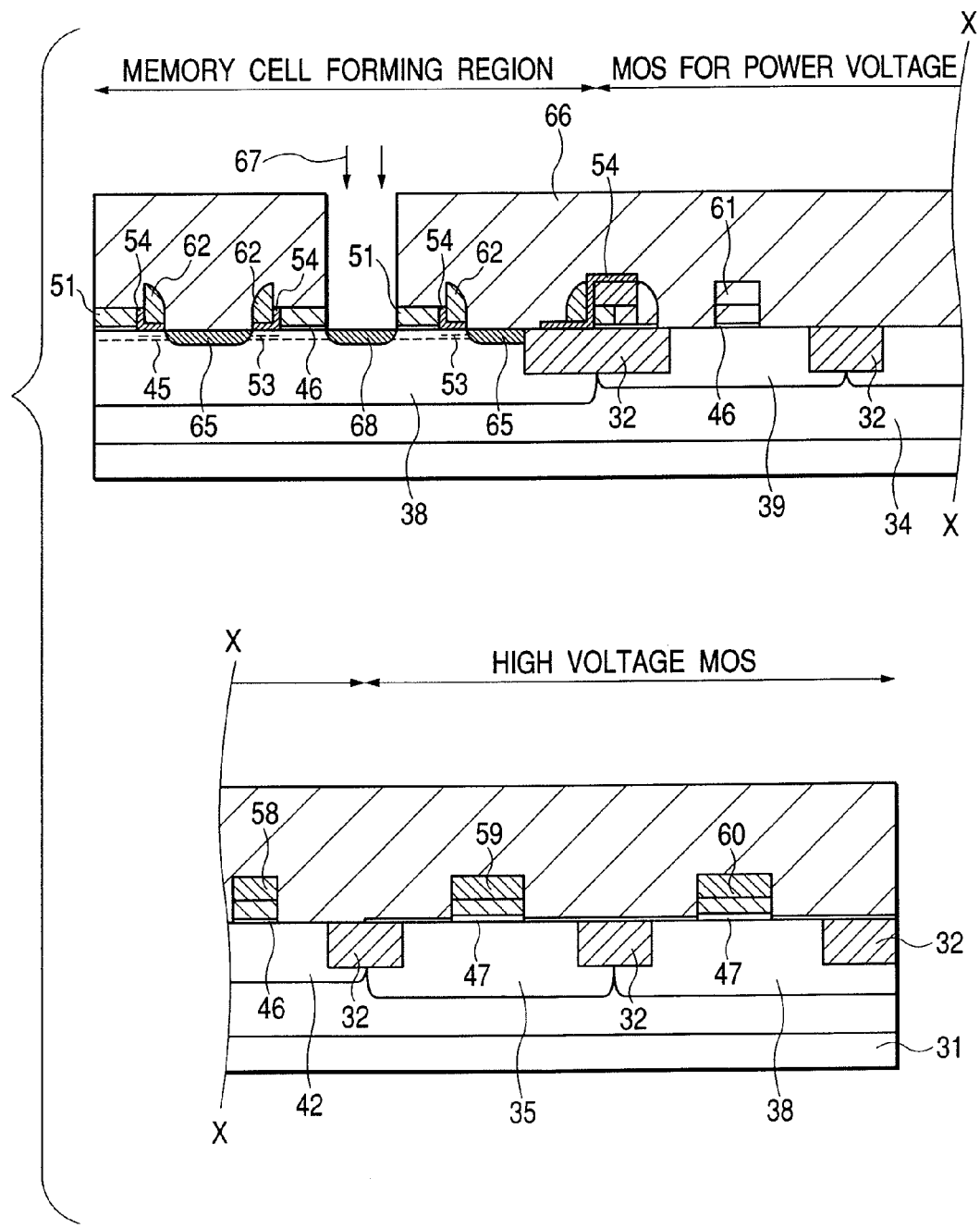
FIG. 25 is a fragmentary vertical cross-sectional view of the LSI in a step of the manufacturing process following FIG. 24.
Figure 33:
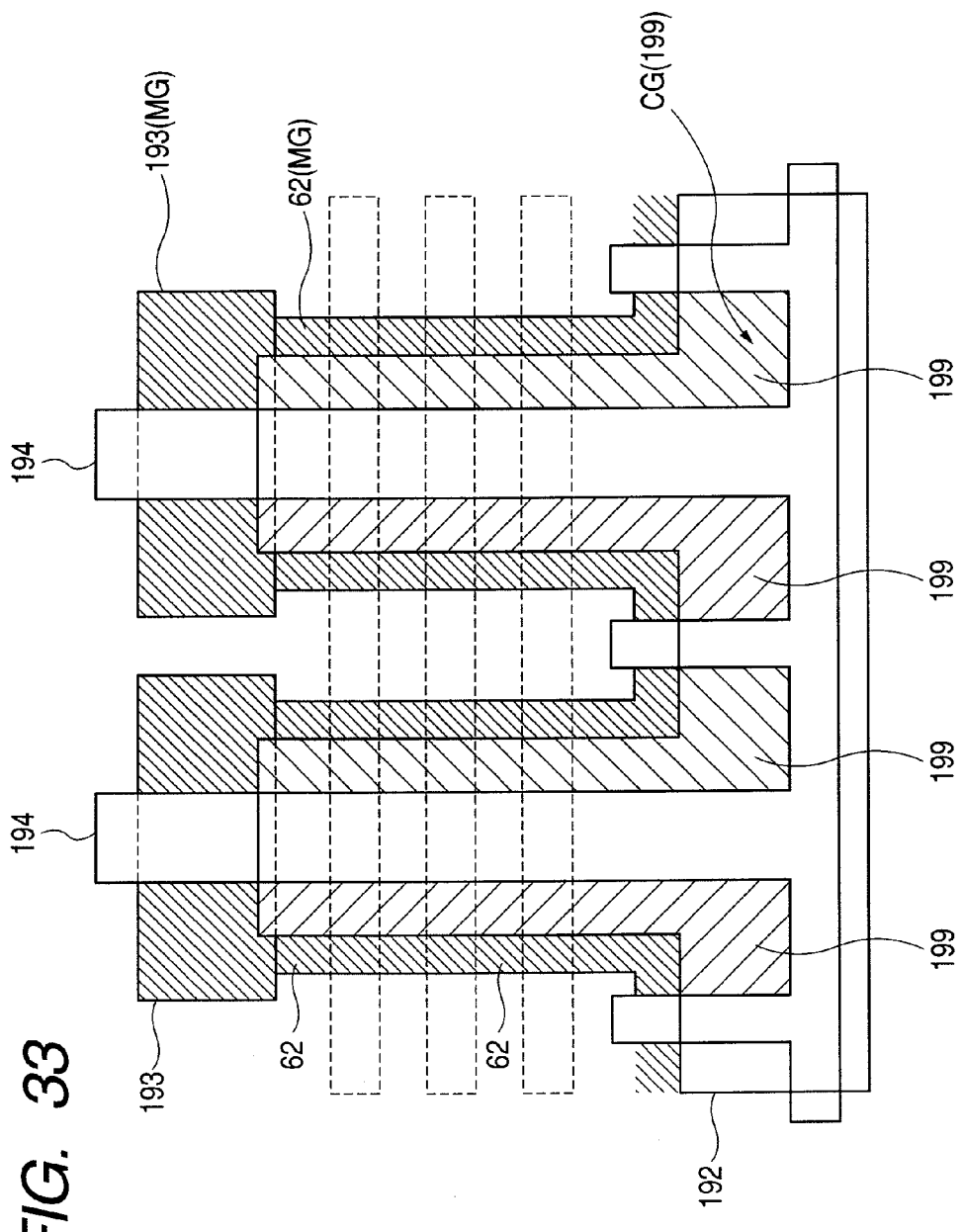
FIG. 33 is a plan view showing a flat pattern of the memory cell unit corresponding to FIG. 25.

Next, as shown in FIG. 25, the first gate film patterns 51 are cut by patterning according to dry etching using a 0.8-μm thick resist film 66 formed to etch the shapes of the gate film isolation patterns 194 of the memory cell shown in FIG. 4 as a mask to thereby pattern-process the control gate of the memory cell. Subsequently, arsenic ions 67 each having an acceleration energy of 20 keV are injected in an injection amount of $5 \times 10^{14}/cm^2$ using the resist film 66 as a mask to thereby form a source (region) 68 of the memory cell. A flat pattern of the memory cell section corresponding to FIG. 25 is shown in FIG. 33. When the portions indicated by the gate film isolation patterns 194 of the portions indicated by the first gate film pattern 192, contact withdrawal regions 193 and memory gates 62 are removed by patterning, regions designated at 199 are left in the region of the first gate film pattern 192, so that the control gates 51 (199, 2 and 23) of their memory cells are formed. The regions indicated by the contact withdrawal regions 193 and memory gates 62 are formed on the side walls of the control gates 51 (199, 2 and 23) and are respectively separated from each other to form memory gates 62 (8, 27 and 200) of the respective memory cells.

Figure 26:
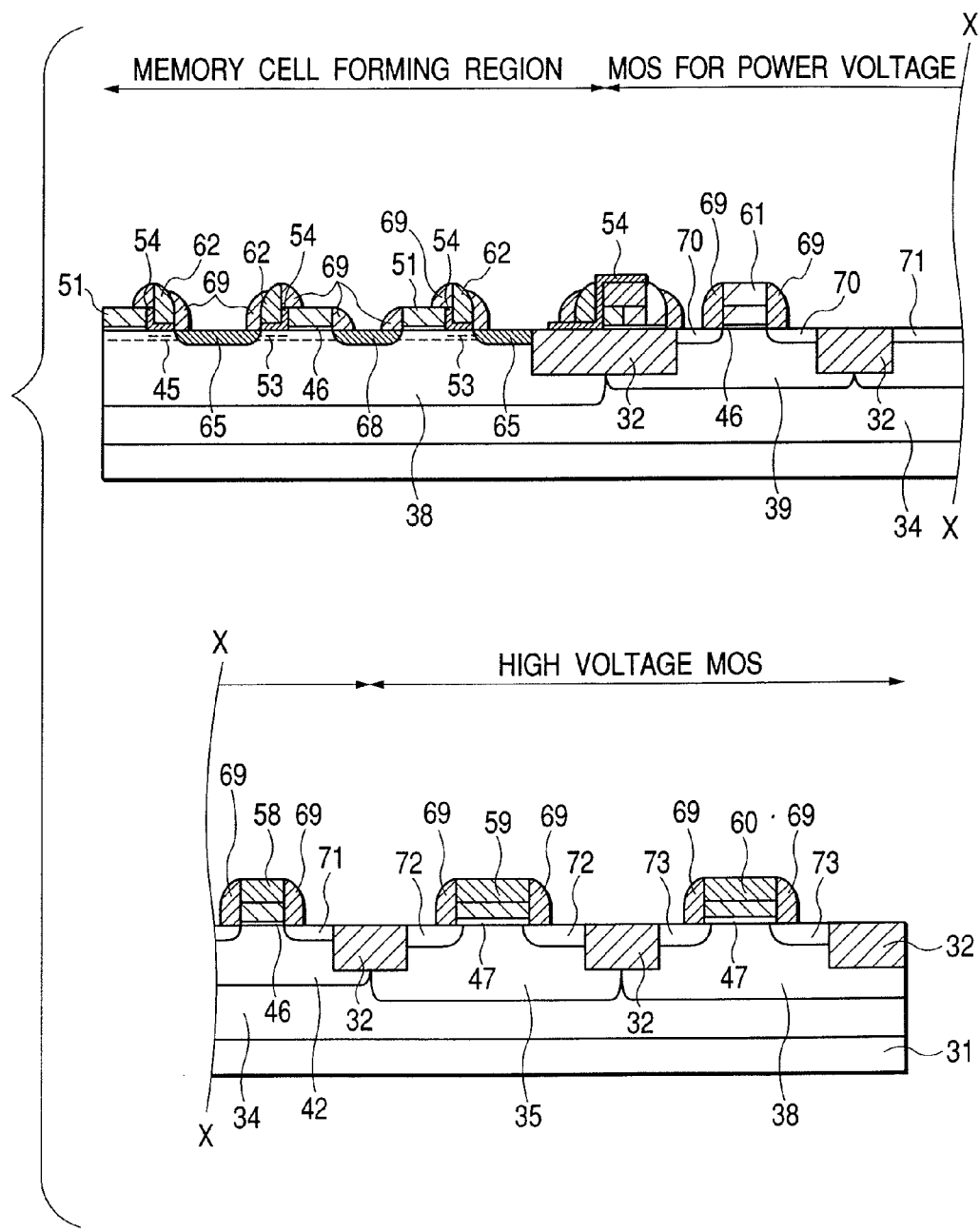
FIG. 26 is a fragmentary vertical cross-sectional view of the LSI in a step of the manufacturing process following FIG. 25.

Next, as shown in FIG. 26, boron difluoride ions each having an acceleration energy of 20 keV are injected into, for example, the power voltage-operated PMOS transistor section alone in an injection amount of $2 \times 10^{14}/cm^2$, and phosphor ions each having an acceleration energy of 10 keV are injected therein in an injection amount of $3 \times 10^{13}/cm^2$ to thereby form a p-type extension 70. Arsenic ions each having an acceleration energy of 10 keV are injected into the power voltage-operated NMOS transistor section alone in an injection amount of $2 \times 10^{14}/cm^2$, and boron ions each having an acceleration energy of 10 keV are injected therein in an injection amount of $2 \times 10^{13}/cm^2$ to thereby form an n-type extension 71. Boron ions each having an acceleration energy of 20 keV are injected into the high voltage PMOS transistor section alone in an injection amount of $1 \times 10^{13}/cm^2$ to thereby form a low-concentration p-type source/drain 72. Phosphor ions each having an acceleration energy of 30 keV are injected into the high voltage NMOS transistor section alone in an injection amount of $2 \times 10^{13}/cm^2$ to thereby form a low-concentration n-type source/drain 73. Thereafter, they are deposited by CVD, and oxide film side spacers 69 each corresponding to a 75-nm thick insulating film processed by an etchback method using on anisotropic etching are respectively formed on both side walls of the memory gates 62 (8, 27 and 200) and the side walls of the control gates 51 (199, 2 and 23) on a self-alignment basis. The oxide film side spacer 69 formed on one side wall of each of the memory gates 62 (8, 27 and 200) is formed on its corresponding control gate 51 (199, 2 and 23), whereas the oxide film side spacer 69 formed on the other side wall is formed on the drain region 65 side. The oxide film side spacers 69 formed on the side walls of the control gate 51 (199, 2 and 23) are formed on the source region 68 side.

Figure 27:
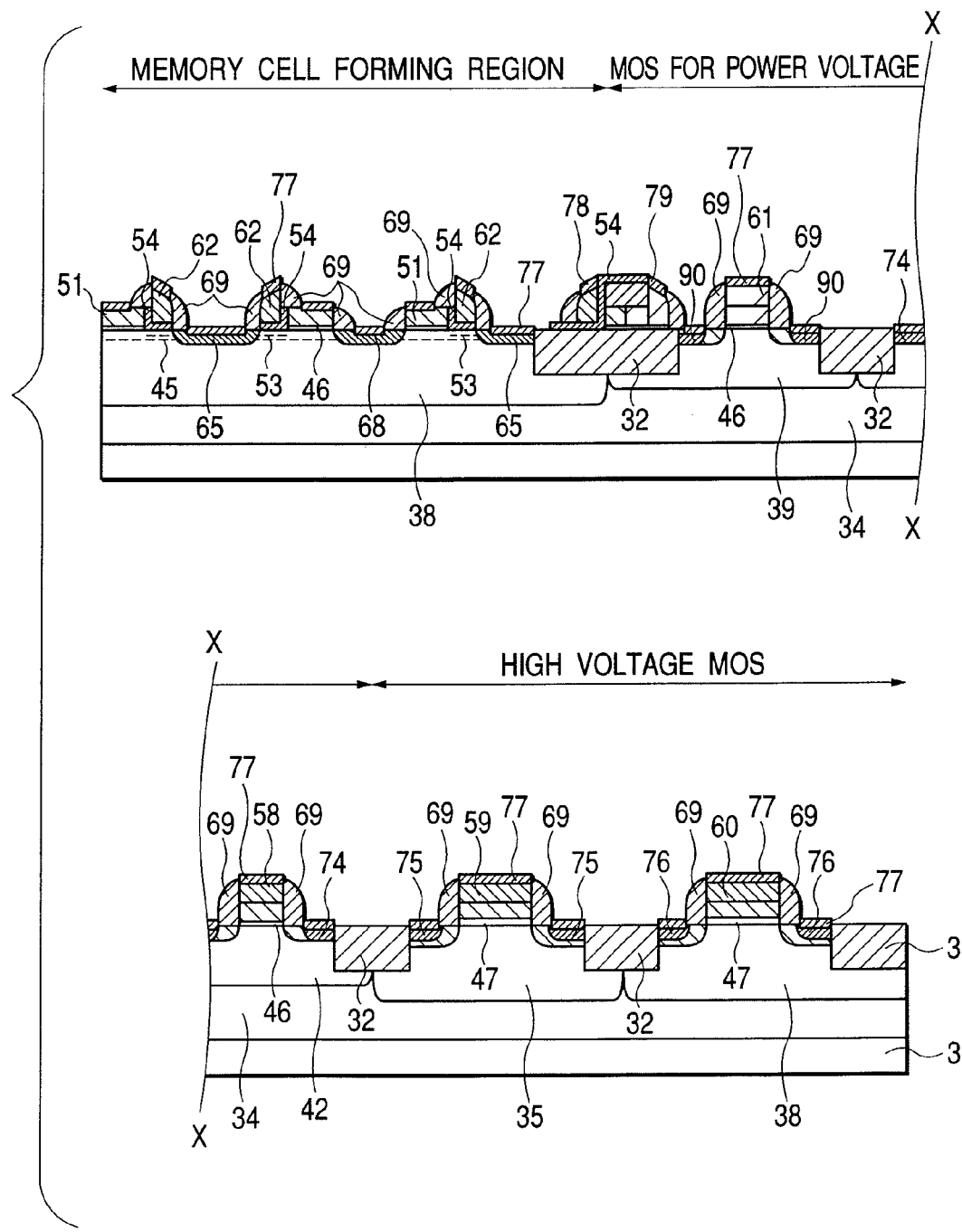
FIG. 27 is a fragmentary vertical cross-sectional view of the LSI in a step of the manufacturing process following FIG. 26.
Figure 28:
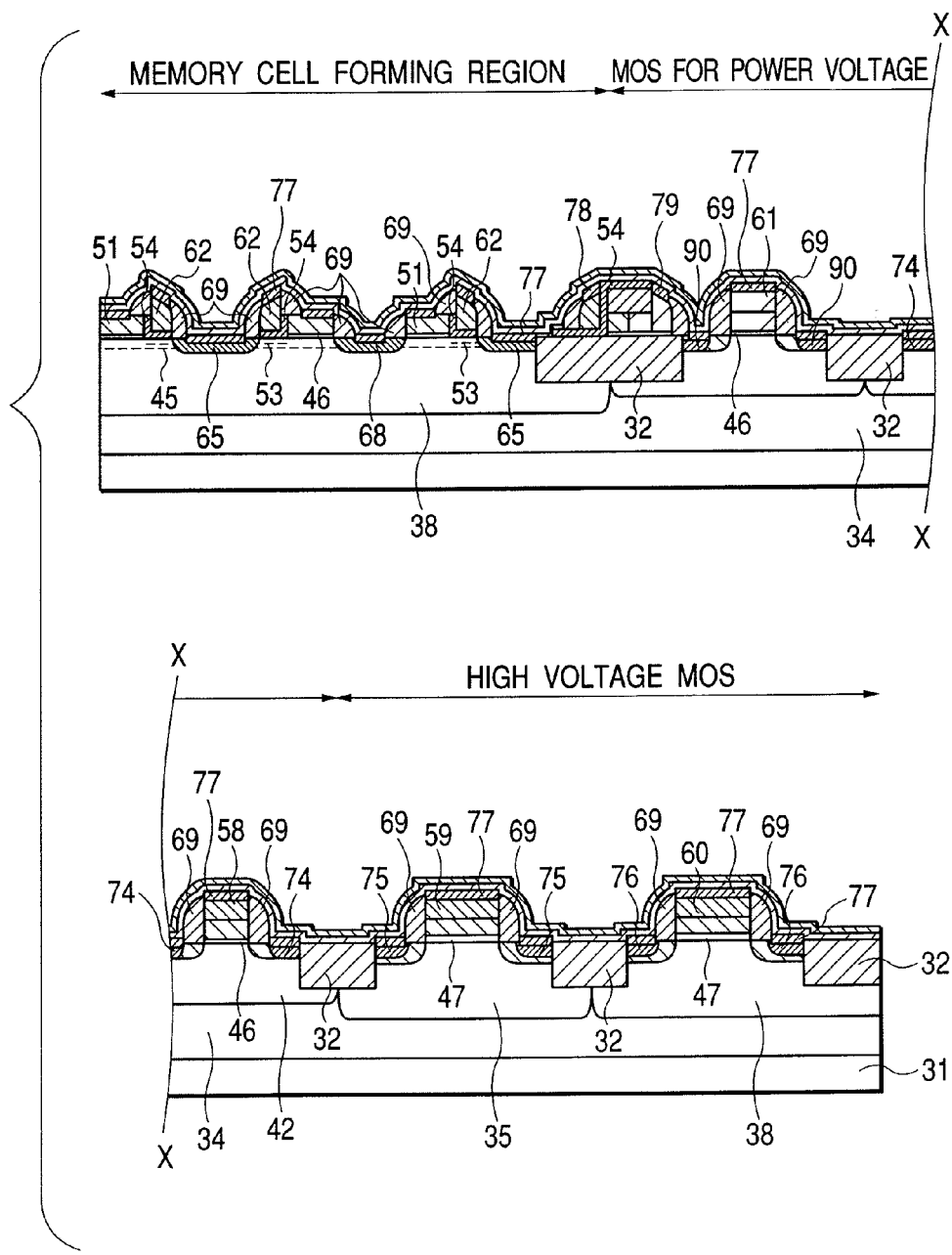
FIG. 28 is a fragmentary vertical cross-sectional view of the LSI in a step of the manufacturing process following FIG. 27.

Next, as shown in FIG. 27, boron difluoride ions each having an acceleration energy of 20 keV are injected into only the PMOS transistor sections at the peripheral portion, for example, in an injection amount of $3 \times 10^{15}/cm^2$ to thereby form high-concentration p-type source/drains 90 and 75. Arsenic ions each having an acceleration energy of 30 keV are injected into only the NMOS transistor sections at the peripheral portion in an injection amount of $3 \times 10^{15}/cm^2$ to thereby form high-concentration n-type source/drains 74 and 76. Thereafter, a cobalt silicide (CoSi) film 77 having a thickness of 40 nm is grown on all the gates 58, 59, 60 and 61, the source/drains 70 through 76 and 90, the gates 51 and 62 of the memory cell, and the source/drains 65 and 68 at the peripheral portion by using a salicide technology. Further, an oxide film 78 having a thickness of about 30 nm and a silicon nitride film 79 having a thickness of about 50 nm are deposited by, for example, CVD as an insulating film as shown in FIG. 28. Incidentally, the cobalt silicide (CoSi) film 77 is formed by, for example, depositing a cobalt (Co) film on the whole area on the main surface of the substrate, thereafter causing cobalt and silicon to react by thermal treatment and subsequently removing the unreacted cobalt (Co) film. No cobalt is silicidized over the insulating film such as the silicon oxide film or the like, and the cobalt silicide (CoSi) film 77 is selectively formed on the gates and source/drains formed of silicon. As described above, the vertical interval is formed between each side spacer-like memory gate 62 and its corresponding control gate based on the first gate film pattern 51, and the insulating film side spacers 69 are formed on the side walls of the memory gates 62 so as to be placed between them. Therefore, there is no possibility that the cobalt silicide film 77 on each memory gate 62 and the cobalt silicide film 77 on each control gate 51 will be shorted. Since the insulating film side spacer 69 is formed on the side wall on the drain 65 side, of each memory gate 62 so as to be placed between the side spacer-like memory gate 62 and the drain 65, there is no possibility that the cobalt silicide film 77 on the memory gate 62 and the cobalt silicide film 77 on the drain 65 will be shorted. Since the insulating film side spacers 69 are formed on the side walls on the source 68 side, of the control gates 51 so as to be placed between the side spacer-like control gates 51 and the source 68, there is no possibility that the cobalt silicide film 77 on the memory gate 62 and the cobalt silicide film 77 on the source 68 will be shorted.

Figure 29:
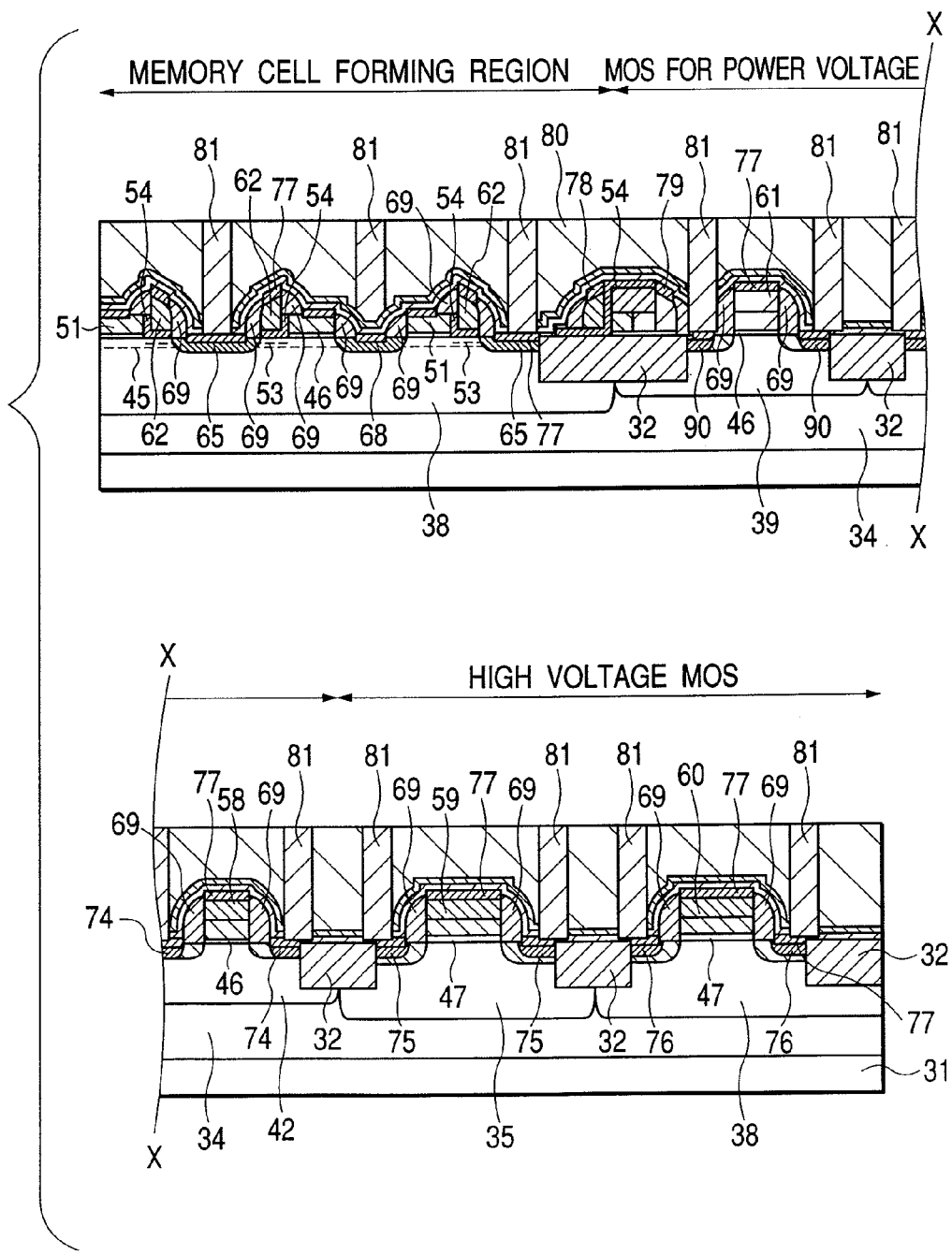
FIG. 29 is a fragmentary vertical cross-sectional view of the LSI in a step of the manufacturing process following FIG. 28.

Next, as shown in FIG. 29, for example, an ozone ($O_3$)-TEOS (silicon oxide film) film 80 having a thickness of about 700 nm is deposited as an interlayer insulating film by CVD. Thereafter, the interlayer insulating film 80 is polished by CMP to planarize its surface. Next, plug holes (connecting holes) are made open on all the gates and source/drains to be connected, and, for example, tungsten (W) is embedded into the plug holes to form plugs 81. Common source lines for the memory cells are connected to one another by the plugs 81.

Figure 30:
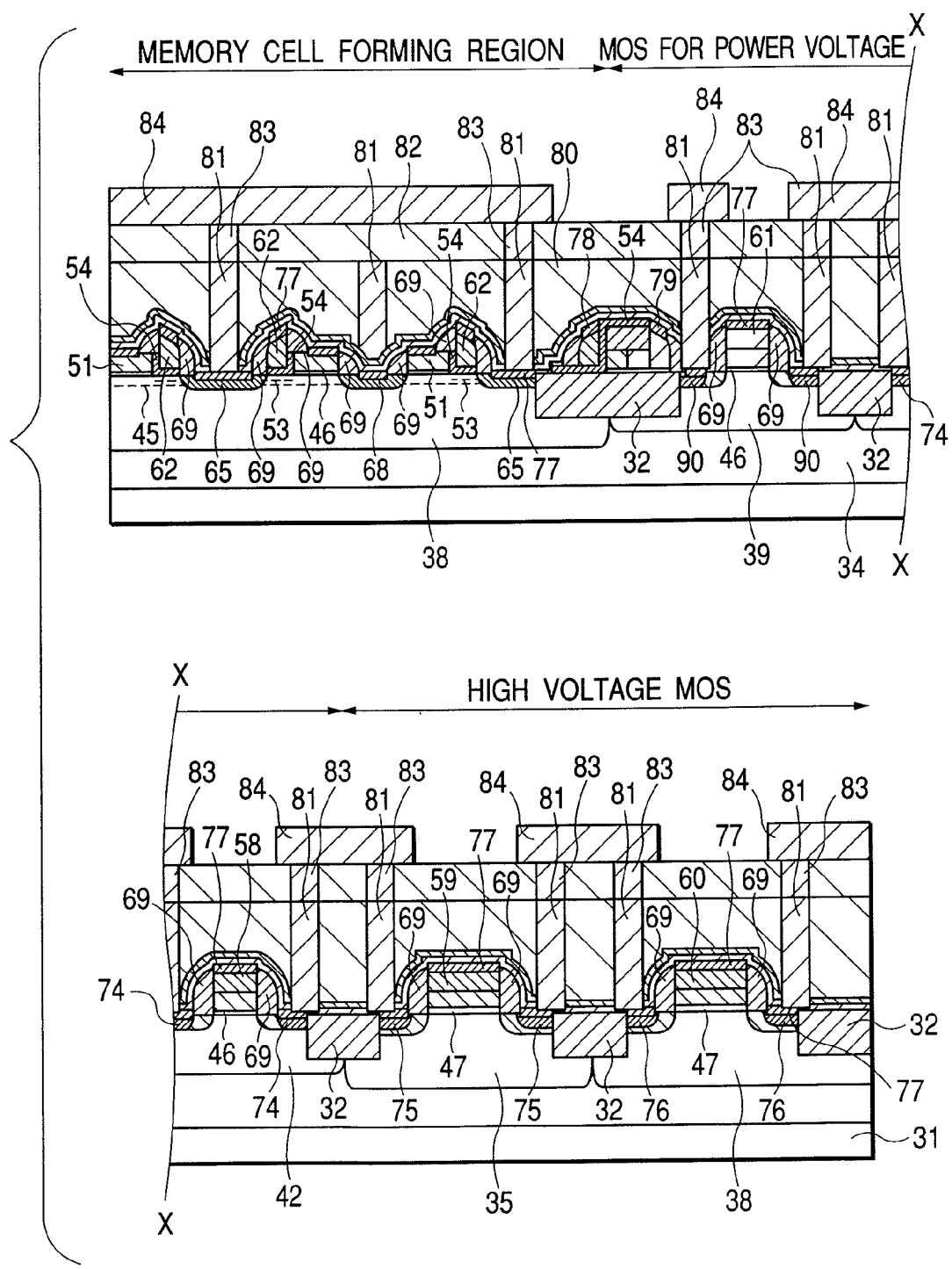
FIG. 30 is a fragmentary vertical cross-sectional view of the LSI in a step of the manufacturing process following FIG. 29.

Finally, as shown in FIG. 30, an interlayer insulating film 82 having a thickness of about 300 nm is deposited by CVD, for example. Contact holes (connecting holes) are made open directly above all the plugs 81 at the peripheral portion and the plugs 81 on the drains of the memory cell. Contact plugs 83 each formed of tungsten (W) are embedded into the contact holes in a manner similar to the plugs 81, and a first metal wiring 84 each made of a tungsten film having a thickness of about 200 nm is formed, whereby the major manufacturing process of the flash memory-mixed logic LSI according to the present embodiment is completed. Although not shown in the drawing, the process of adding desired metal wirings by a multilayered wiring structure, the deposition of a passivation film and the opening of bonding holes are carried out, and the initial to final processes are completed.

According to the above-described example illustrative of the manufacturing method of the present invention, a gate length of the logic transistor (power voltage MOS transistor) at the peripheral portion was 100 nm, a gate length of the high voltage transistor was 0.5 μm, a control gate length of each memory cell was 150 nm, a memory gate length was 50 nm, a memory channel width was 180 nm, a bit line pitch was 0.3 μm, a word line pitch was 0.5 μm, and the area of the memory cell was 0.15 μm². As a read current for the memory cell, about 50 μA/cell can be achieved at a power-voltage 1.2V operation.

<<Another Manufacturing Method>>

A description will next be made of a manufacturing method in which, in the manufacturing process of mixing the non-volatile memory cell into the logic LSI by the 0.13 μm process technology as described above, a memory cell is adopted in which the electrode structure thereof is partly changed. The basic process of the manufacturing method in this case is almost the same as that described with reference to FIGS. 15 to 29. Changes thereof will be described using FIG. 34.

Figure 34:
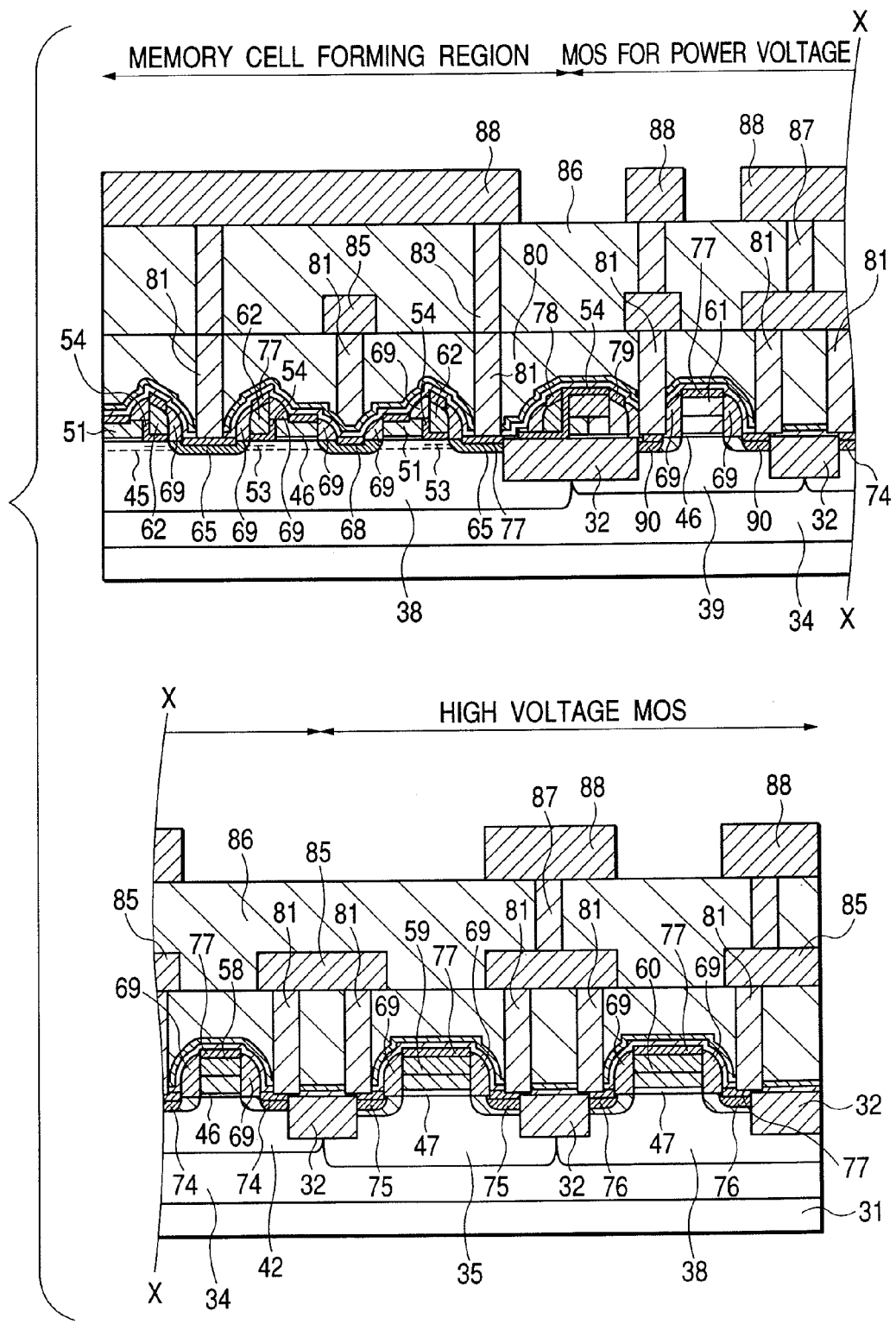
FIG. 34 is a fragmentary cross-sectional view of an LSI in which changes in another manufacturing method used as an alternative to the manufacturing method illustrated in FIGS. 15 through 29, which adopts a memory cell whose electrode structure is partly changed, are typically illustrated.

As shown in FIG. 34, a common source line of the memory cell is used as a first metal wiring 85 made of an aluminum film having a thickness of about 400 nm and configured in common with a first metal wiring 85 of each transistor at a peripheral portion. An interlayer insulating film 86 whose surface is planarized by CMP, is formed over the first metal wring 85, and contact plugs 87 each made of tungsten (W) are formed in the interlayer insulating film 86. The contact plugs 87 are directly connected to plugs 81 disposed directly above on a drain of the memory cell, and a second metal wiring 88 formed of an aluminum film having a thickness of about 400 nm, which is used as a bit line thereabove, is configured in common with a second metal wiring 88 of each transistor at the peripheral portion. The interlayer insulating film 86 with the contact plugs 87 defined therein is about 700 nm in thickness. Forming the common source line and the wirings for connecting between the transistors at the peripheral portion by using the first metal wiring 85 formed of the aluminum film in this way makes it possible to reduce wiring resistances and enhance the operating speed.

<<Further Manufacturing Method>>

A description will be made here of a method for processing both control and memory gates in the memory cell of the present invention on a self-alignment basis without depending on processing by lithography. The method will be described with reference to FIGS. 35 through 39 which show sectional structures of a memory cell section as a sequence of manufacturing process steps.

Figure 35:
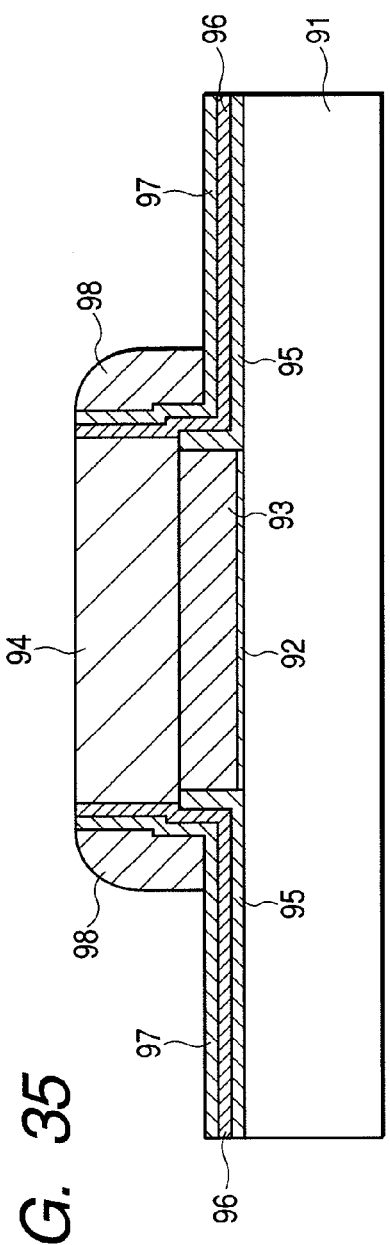
FIG. 35 is a fragmentary cross-sectional view of an LSI in a step of the manufacturing process for processing both a control gate and a memory gate on a self-alignment basis without depending on their processing by lithography.

FIG. 35 shows a state in which processing is carried out to provide a gate oxide film 92 (corresponding to the gate insulating film 2) having a thickness of 2 nm is grown on a desired memory-cell forming region of a p-type silicon substrate (well region) 91 having a resistivity of 10 Ωcm, for example, a laminated film of a first gate film pattern 93 made of a silicon film doped with phosphor having a concentration of $2 \times 10^{20}/cm^3$ with a thickness of 100 nm, and a cap nitride film 94 having a thickness of 200 nm, followed by growth of a lower oxide film 95 (corresponding to the lower oxide film 5) having a thickness of 3 nm by a thermal oxidation method, and deposition of a silicon nitride film 96 (corresponding to the silicon nitride film 6) having a thickness of 5 nm and an upper oxide film 97 (corresponding to the upper oxide film 7) having a thickness of 5 nm, and side spacer-like memory gates 98 (corresponding to the memory gate 8) formed by etching back a polysilicon film doped with phosphor having a concentration of $2\times10^{20}/cm^3$ with a thickness of 70 nm are further provided.

Figure 36:
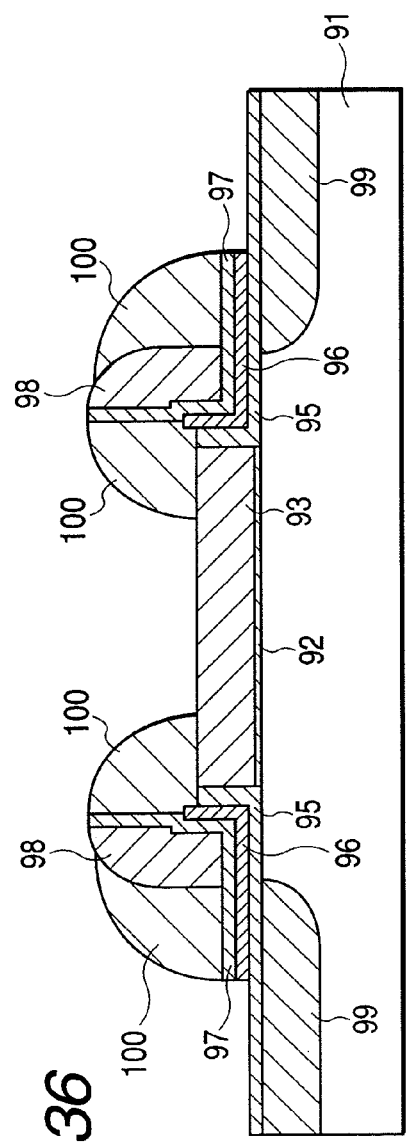
FIG. 36 is a fragmentary vertical cross-sectional view of the LSI in a step of the manufacturing process following FIG. 35.

Next, as shown in FIG. 36, for example, arsenic ions each having an acceleration energy of 30 keV are injected in an injection amount of $4\times10^{14}/cm^2$ into the memory gates 98 from outside to thereby form drains 99 (corresponding to the drain 10). Thereafter, the cap nitride film 94 is removed by wet etching using the silicon nitride film 96 as a mask, followed by deposition and etchback of an oxide film having a thickness of 150 nm, whereby oxide film side spacers 100 (corresponding to the oxide film side spacers 12, 13 and 69) each corresponding to an insulating film having a spacer length of 150 nm is formed.

Figure 37:
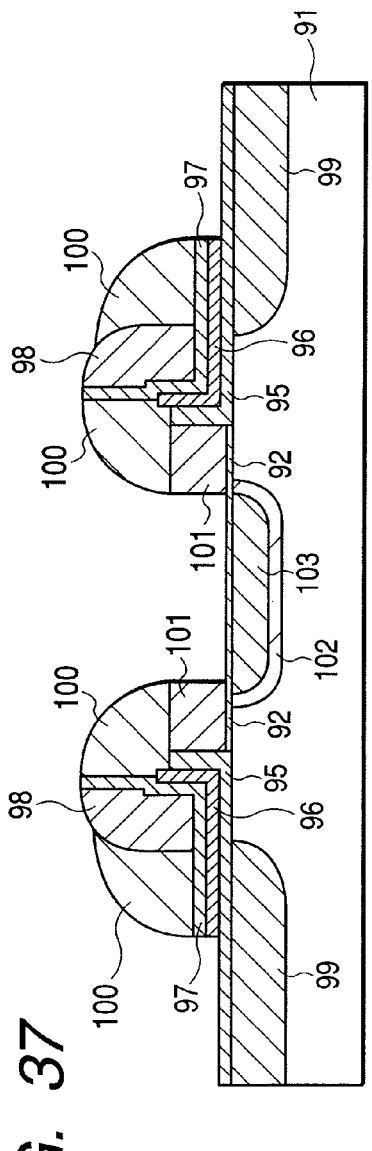
FIG. 37 is a fragmentary vertical cross-sectional view of the LSI in a step of the manufacturing process following FIG. 36.

Next, as shown in FIG. 37, for example, a resist pattern is formed in which only a region for the first gate film pattern 93 to be cut is made open. The first gate film pattern 93 is processed on a self-alignment basis with respect to the oxide film side spacers 100 by dry etching using the oxide film side spacers 100 as masks, whereby control gates 101 (corresponding to the control gate 3) are formed on a self-alignment basis with respect to the oxide film side spacers 100.

Figure 38:
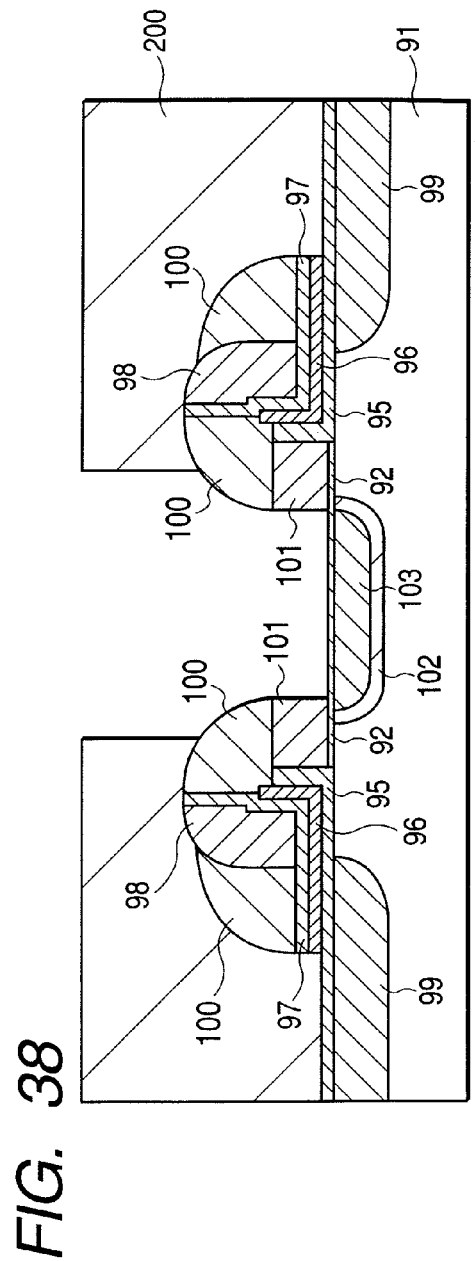
FIG. 38 is a fragmentary vertical cross-sectional view of the LSI in a step of the manufacturing process following FIG. 37.

As shown in FIG. 38 as well, arsenic ions each having an acceleration energy of 30 keV are injected into, for example, a region used as the source between the control gates 101 and 101 in an injection amount of $4\times10^{14}/cm^2$ from the vertical direction to thereby form a source 103 (corresponding to the source 11). Boron ions each having an acceleration energy of 20 keV are injected in an injection amount of $2\times10^{13}/cm^2$ from the direction diagonally angled at 300 to thereby form a p-type hollow region 102 having an impurity concentration higher than an impurity concentration of a channel region. At this time, the completed control gate length is 130 nm, and the top of each memory gate 98 is etched 120 nm, so that its height reaches 150 nm.

Figure 39:
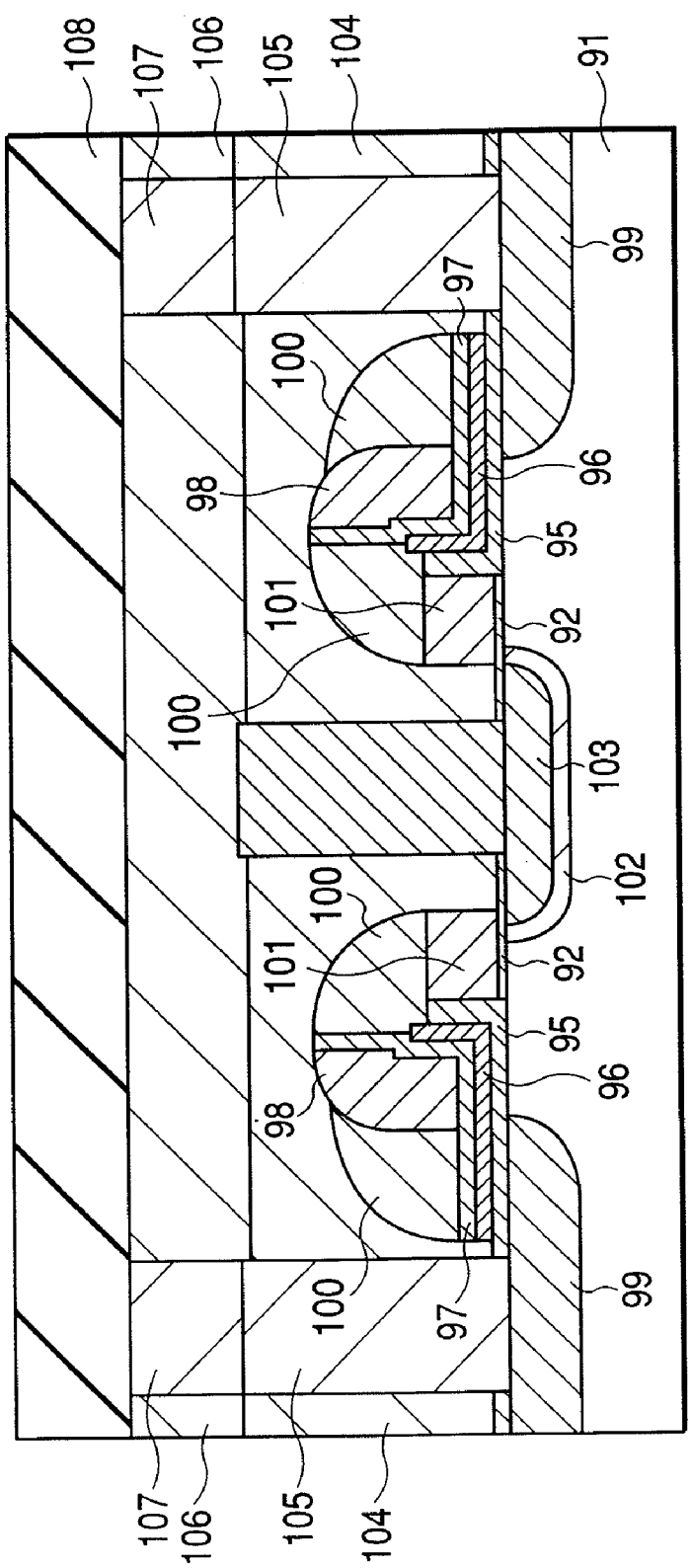
FIG. 39 is a fragmentary vertical cross-sectional view of the LSI in a step of the manufacturing process following FIG. 38.

Finally, as shown in FIG. 39, an insulating film 104 having a thickness of 700 nm is deposited, so that tungsten plugs 105 for connecting openings of plug holes and a common source line are embedded into the plug holes. A contact interlayer film 106 having a thickness of 300 nm is deposited, so that contact plugs 107 formed of tungsten are embedded into contact holes through their openings, followed by formation of a bit line 108 made of a tungsten film having a thickness of 300 nm, whereby a major portion of the memory cell is completed.

While the gate length of each control gate 101 is 120 nm and the gate length of each memory gate 98 is 60 nm in the memory cell manufactured by the present method, both the gate lengths are also determined by side spacer lengths (the width of each oxide film side spacer 100 as viewed in a channel-length direction and the width of each side spacer-like memory gate as viewed in a channel-length direction) processed with the film thickness deposited by CVD as the reference. Variations in the gate length within a wafer surface were within ±10%, i.e., the gate length of each control gate 101 was 120±12 nm, and the gate length of each memory gate 98 was 60±6 nm. Since the alignment accuracy of the lithography technology under the 0.13-μm process technology is about ±30 nm, the variations in the gate lengths are difficult to attain, so that the validity of the present embodiment was confirmed.

Figure 40:
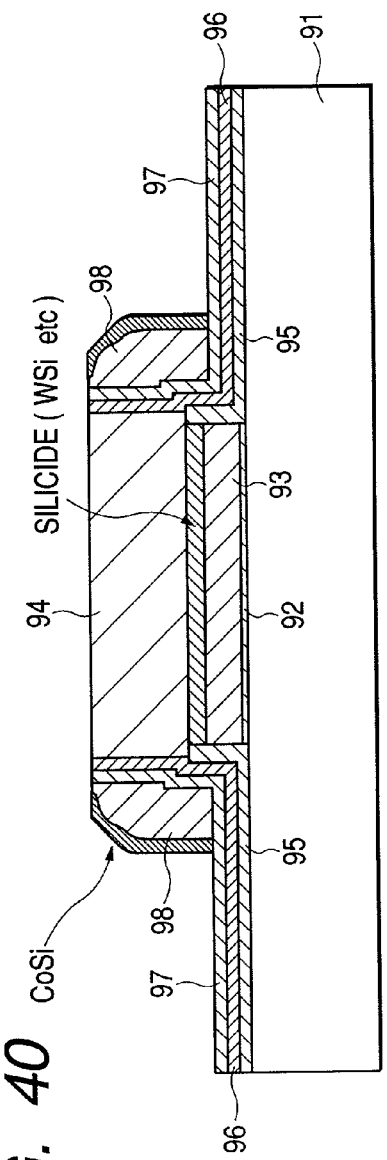
FIG. 40 is a vertical cross-sectional view showing a structure in which a tungsten polycide film is applied to the control gate of the memory cell, as a point different from FIG. 35.
Figure 41:
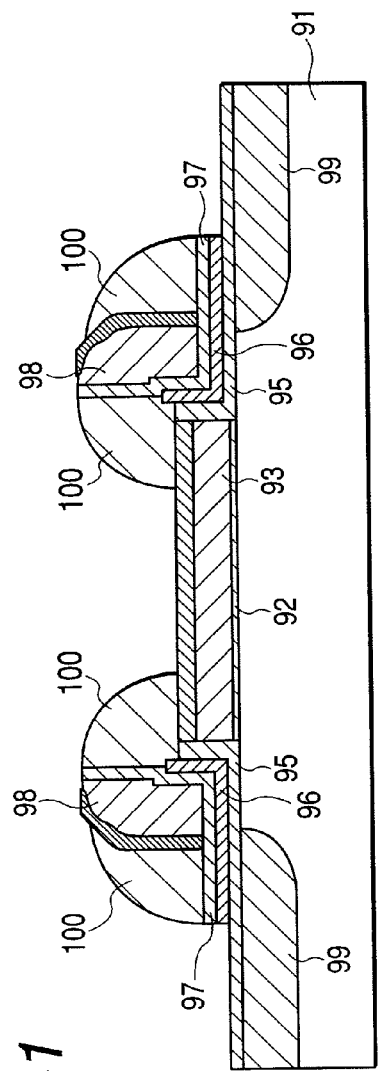
FIG. 41 is a vertical cross-sectional view illustrating a process section corresponding to FIG. 36 where the structure of FIG. 40 is adopted.
Figure 42:
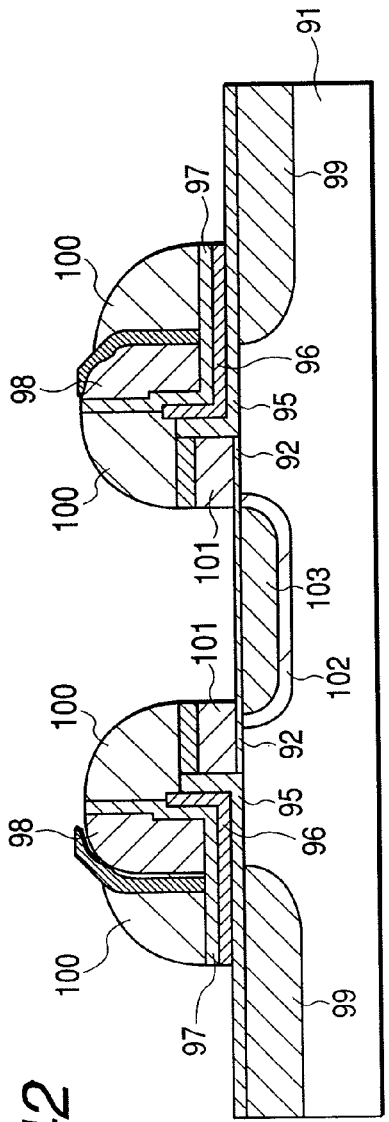
FIG. 42 is a vertical cross-sectional view illustrating a process section corresponding to FIG. 37 where the structure of FIG. 40 is adopted.

FIGS. 40 through 43 respectively show an example in which a tungsten polycide ($WSi_2$/poly Si) film is applied to the control gates 101. With respect to FIG. 35, for example, the first gate film pattern 93 can be changed from the polysilicon film (poly Si) to a structure wherein silicide, like tungsten silicide (WSi), is provided on the poly Si, or a metal gate structure formed of a metal film, as shown in FIG. 40, is provided. Incidentally, the first gate film pattern 93 is not limited to silicide, but may be configured as a polymetal structure in which a metal such as W or the like is provided on poly Si with a barrier metal film such as WN interposed therebetween. A silicide film such as a cobalt silicide ($CoSi_2$) film may be formed on each memory gate 98 by using the salicide technology. In this case, the process cross-section of FIG. 36 is represented as shown in FIG. 41, and the process cross-section of FIG. 37 is represented as shown in FIG. 42. Thus, the wiring resistance of the control gate 101 can be reduced as compared with the formation of each control gate 101 by the silicon film, and hence an increase in operating speed can be achieved. Forming the cobalt silicide ($CoSi_2$) on the memory gate 98 makes it possible to reduce the wiring resistance of the memory gate 98 and achieve an increase in operating speed.

Figure 43:
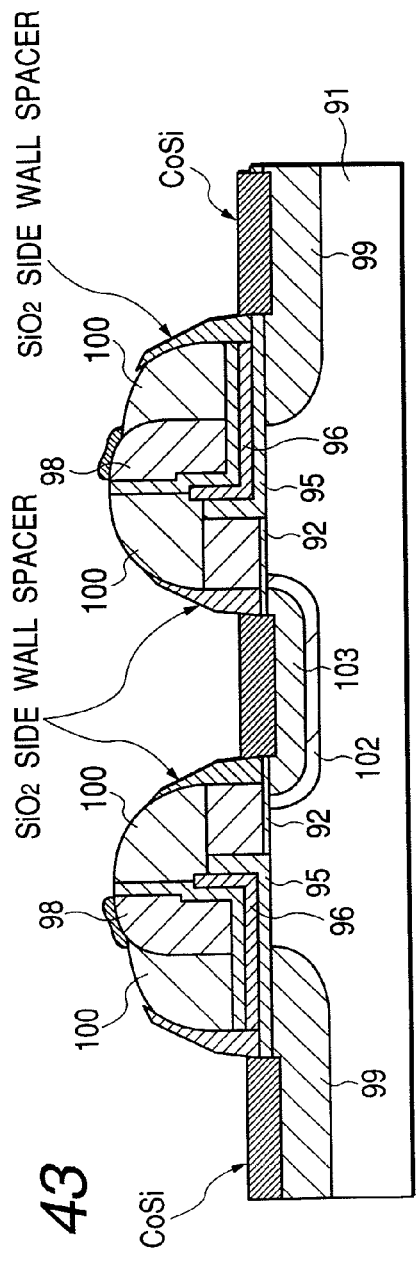
FIG. 43 is a vertical cross-sectional view illustrating, in section, a process to be added after the process of FIG. 37 where a cobalt silicide film is formed on the side spacer-like memory gate shown in FIG. 35 immediately after the process of forming the memory gate.
Figure 44:
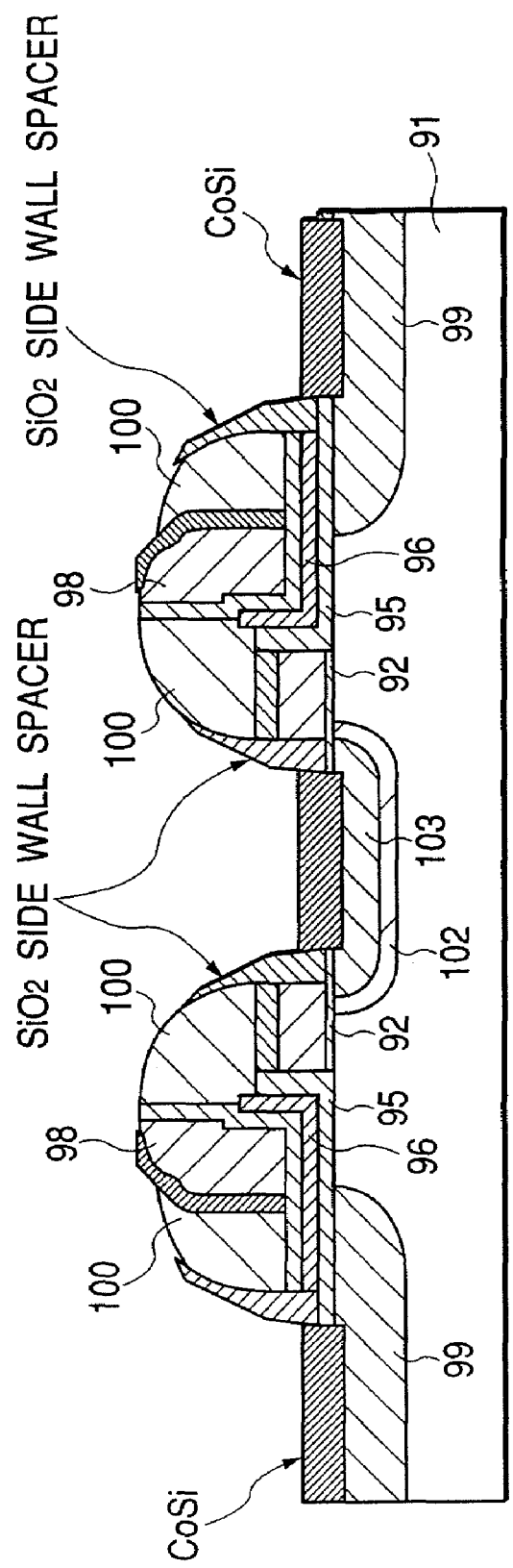
FIG. 44 is a vertical cross-sectional view illustrating a structure in which $SiO_2$ sidewalls are formed after the step of FIG. 42 to bring the tops of diffusion layers into CoSi salicidation in the case of FIG. 42.

A modification of salicide is shown in FIGS. 43 and 44. Subsequent to the process of FIG. 37, oxide film ($SiO_2$) side walls each corresponding to an insulating film are formed on their corresponding side walls of the control gates 101 on a self-alignment basis as shown in FIG. 43. Thereafter, a CoSi salicide layer may be formed on the diffusion layers corresponding to the source/drains 99 and 103 and the memory gates 98 by the salicide technology. Incidentally, the oxide film ($SiO_2$) side walls each corresponding to the insulating film are thereafter formed on their corresponding side walls of the control gates 101 on a self-alignment basis even in the case of FIG. 42 as illustrated in FIG. 44. Afterwards, the CoSi salicide layer may be formed on the diffusion layers corresponding to the source/drains 99 and 103 by the salicide technology. Forming the $SiO_2$ side walls on their corresponding side walls of the control gates 101 on a self-alignment basis makes it possible to electrically isolate the drain 103 and the CoSi salicide layer and reduce the resistances of the source/drains 99 and 103 and the wiring resistances of the memory gates 98, thereby enabling an increase in operating speed.

<<Multi-Valued Memory Cell>>

Next, an example of application of a 2-bit/cell having a virtual ground array configuration to a so-called multi-valued memory cell will be described.

Figure 45:
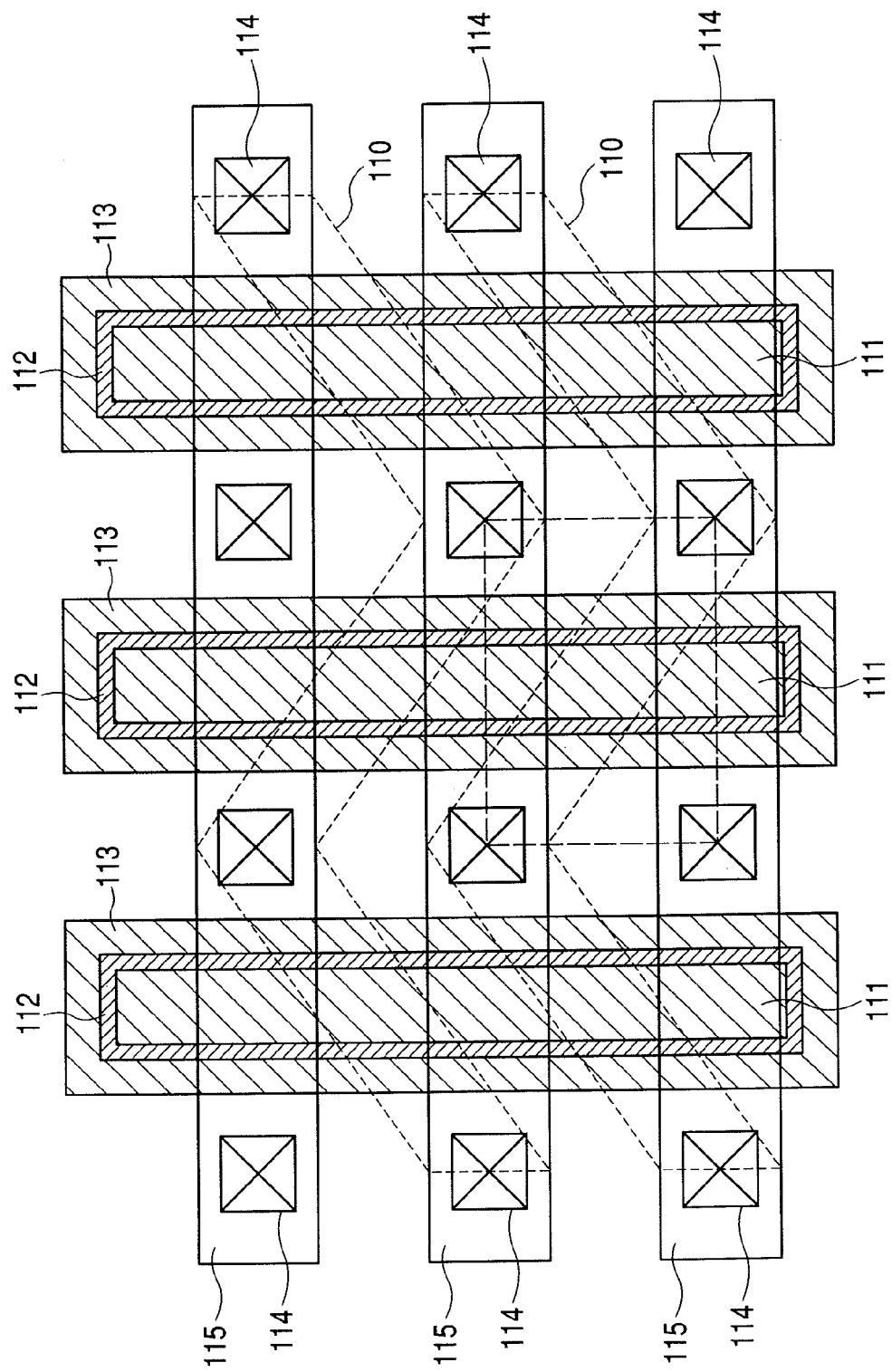
FIG. 45 is a plan layout diagram of a multi-valued memory cell.

A flat or plane layout of the multi-valued memory cell is illustrated in FIG. 45. In FIG. 45, reference numerals 110 indicate zigzag-shaped active regions surrounded by device isolation regions, reference numerals 111 indicate control gates (each corresponding to the control gate 3), and reference numerals 115 indicate data lines each formed of a metal wiring, which are disposed in the direction normal to the control gates 111. A laminated film 112 comprising a lower oxide film (corresponding to the lower oxide film 5), a silicon nitride film (corresponding to the silicon nitride film 6), and an upper oxide film (corresponding to the lower oxide film 5) is formed below each memory gate 113 (corresponding to the memory gate 8). The memory gates 113 are disposed on their corresponding side walls of the control gates 111 with the laminated films 112 respectively interposed therebetween. Metal plugs 114 for connecting the active regions and the data lines 115 are disposed at the corners of the zigzag-shaped active regions 110. The layout pitch of each data line 115 is designed to be twice (2F) the minimum processing size F, the layout pitch of each control gate 111 is designed to be 4F, and the physical cell area is $8F^2$. Thus, since the layout angle θ of each zigzag-shaped active region 110 to the data line 115 is tan θ=(data line pitch)/(control gate pitch)=2F/4F=0.5, θ results in about 26.6°

Figure 46:
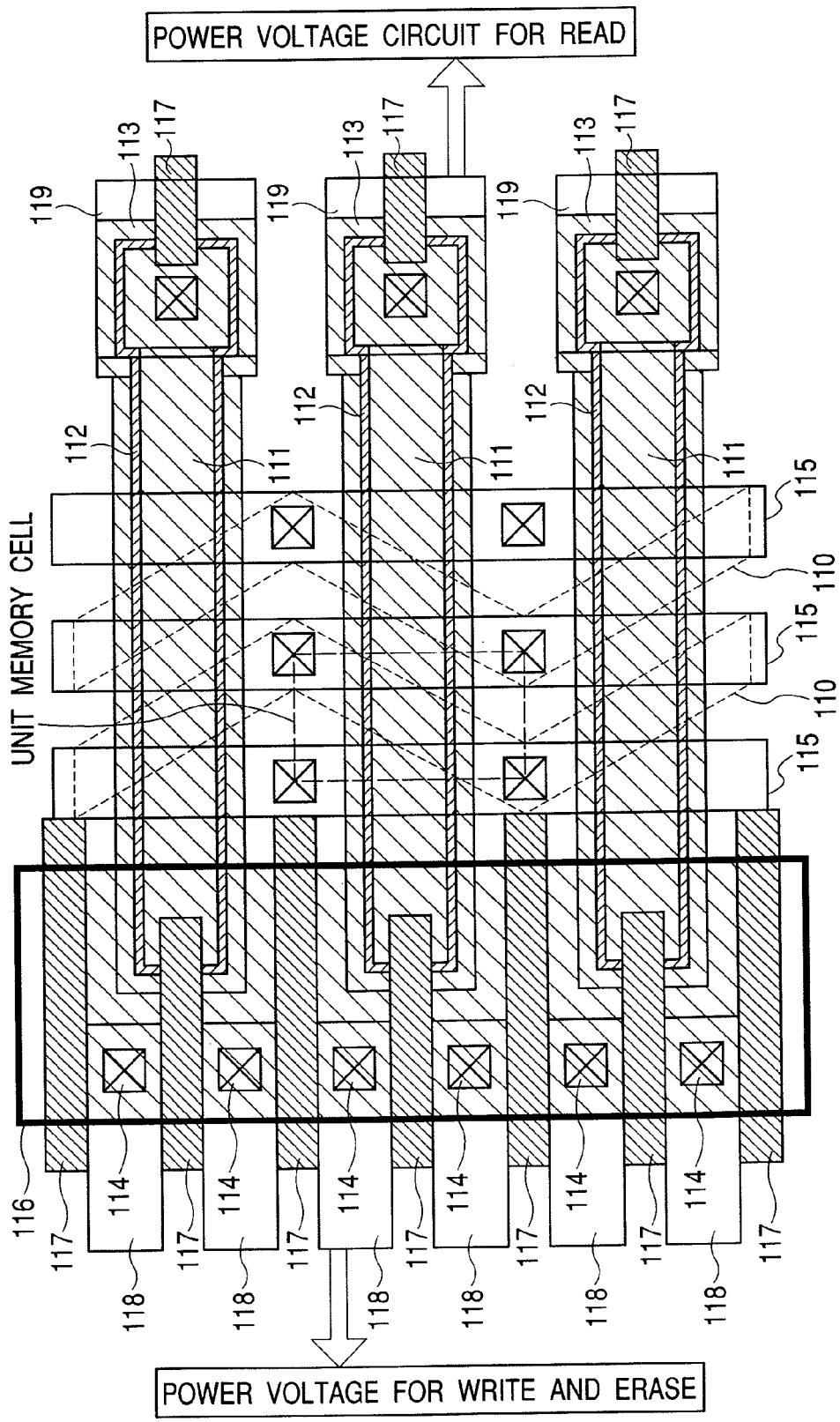
FIG. 46 is a plan layout diagram illustrating portions for withdrawal of contacts to a control gate and a memory gate of the multi-valued memory cell of FIG. 45.

A plane layout of the contact withdrawal portions to the control gates 111 and memory gates 113 is illustrated in FIG. 46. Before the processing of the memory gates 113 formed in the side spacer are formed by etchback based on the anisotropic dry etching, a resist pattern, to which a second gate processing pattern 116 is transferred, is disposed at the ends of the control gates 111 to perform etching. In order to independently withdraw or take out the memory gates 113 at both side portions of the control gates 111, a polysilicon film processed to the shape of the second gate processing pattern 116 is next pattern-processed using resist films, to which isolation hole patterns 117 (diagonally-shaded portions) are transferred, as masks to thereby take out the memory gates 113 through contact holes 114 and first metal wirings 118 for the control gates. While, at this time, the withdrawal portions of the control gates 111 are connected to the contact holes 114 by first metal wirings 119 for the control gates, the side spacer-shaped memory gates 113 are cut off by the isolation hole patterns 117 (diagonally-shaded portions) even at the ends of the control gates 111 at such portions. Thus, the second gate processing pattern 116 and the isolation hole patterns 117 (diagonally-shaded portions) of the side spacer-shaped memory gates 113 are removed, so that the memory gates 113 at both side portions of the control gates 111 are independently formed. The layout pitch of each of the first metal wirings 118 for the memory gates is twice (2F) the minimum processing size F, the layout pitch of each of the first metal wirings 119 for the control gates is 4F, and the layout pitch of each of the data lines 115 is 2F, respectively. A processing technology of F=0.2 μm is applied to the memory cell according to the present embodiment. A physical memory cell area is 2F×4F=0.4×0.8 μm$^2$=0.32 μm$^2$. Since the memory cell is 2 bit/cell-operated, an effective cell area is 0.16 μm$^2$.

Figure 47:
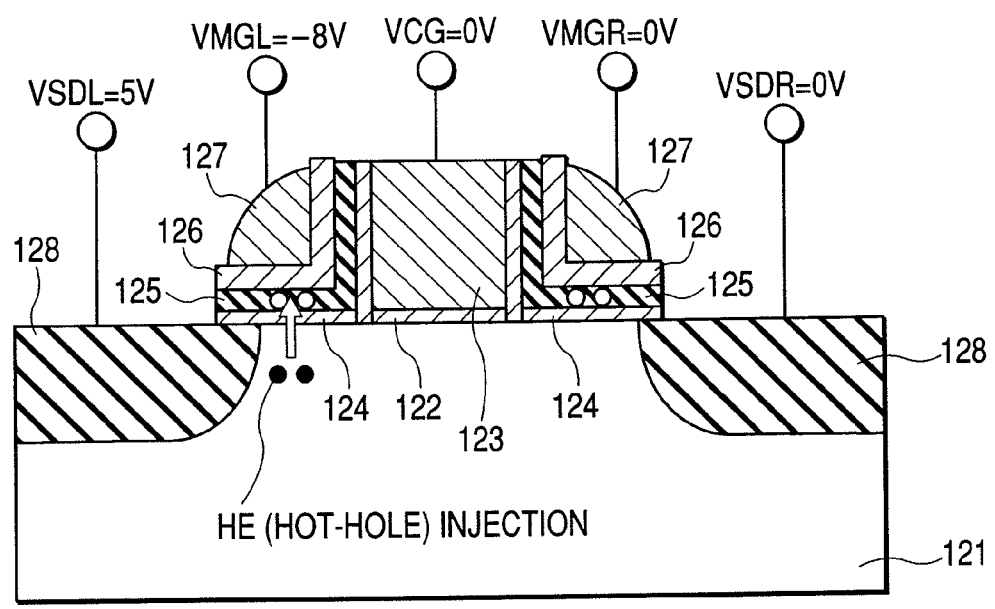
FIG. 47 is a vertical cross-sectional view illustrating the multi-valued memory cell shown in FIG. 45.

A vertical cross-section of the multi-valued memory cell is illustrated in FIG. 47. In the multi-value memory cell, a control gate 123 having a gate length of 200 nm, which is made of a polysilicon film doped with phosphor having a concentration of 2×10$^{20}$/cm$^3$ with a thickness of 200 nm, is disposed over the surface of a p-type well region 121 formed in a surface region of a p-type silicon substrate having a resistivity of 10 Ωcm with a gate oxide film 122 (corresponding to the gate insulating film 2) having a thickness of 4.5 nm being interposed therebetween. Lower oxide films 124 each having a thickness of 3 nm, silicon nitride films 125 each having a thickness of 5 nm and upper oxide films 126 each having a thickness of 5 nm are laminated on the surface regions of the p-type well on the left and right sides of the control gate 123. Side spacer-shaped memory gates 127 made of a polysilicon film doped with phosphor having a concentration of 2×10$^{20}$/cm$^3$ with a thickness of 70 nm are respectively disposed over the laminated films. Arsenic ions each having an acceleration of 30 keV are vertically injected from outside the memory gates 127 in an injection amount of 4×10$^{14}$/cm$^2$ to form source/drain electrodes (memory electrode in which one thereof serves as a source electrode and the other serves as a drain electrode) having a junction withstand voltage of 5V. The left source/drain electrode 128 is also called a left source/drain SDL, and the right source/drain electrode 128 is also called a right source/drain SDR. The gate electrodes to be controlled, of the multi-valued memory cell shown in the drawing, consist of three gates, including the control gate 123 (also called control gate CG), the left memory gate 127 (also called left memory gate MGL), and the right memory gate 127 (also called right memory gate MGR).

In FIG. 47, the multi-valued memory cell is capable of storing four-value or quaternary information. An erase state (e.g., memory information "00") is realized by applying 10V to the left memory gate MGL and the right memory gate MGR, injecting electrons from the p-type well 121 to trap them into the silicon nitride films 125, thereby bringing threshold voltages measured from the memory gates 127 to 1.5V. A first write state (e.g., memory information "10") is realized, as illustrated in FIG. 47, by applying 5V to the left source/drain SDL, applying −8V to the left memory gate MGL, injecting hot holes into only the left silicon nitride film 125, thereby bringing a threshold voltage measured from the left memory gate MGL to −1.5V. Although not shown in the drawing, a second write state (e.g., memory information "01") is realized by applying 5V to the right source/drain SDR, applying −8V to the right memory gate MGR, injecting hot holes into only the right silicon nitride films 125, thereby bringing a threshold voltage measured from the right memory gate MGR to −1.5V. Although not shown in the drawing, a third write state (e.g., memory information "11") is realized by performing a write operation for obtaining a first write state and a write operation for obtaining a second write state.

Figure 48:
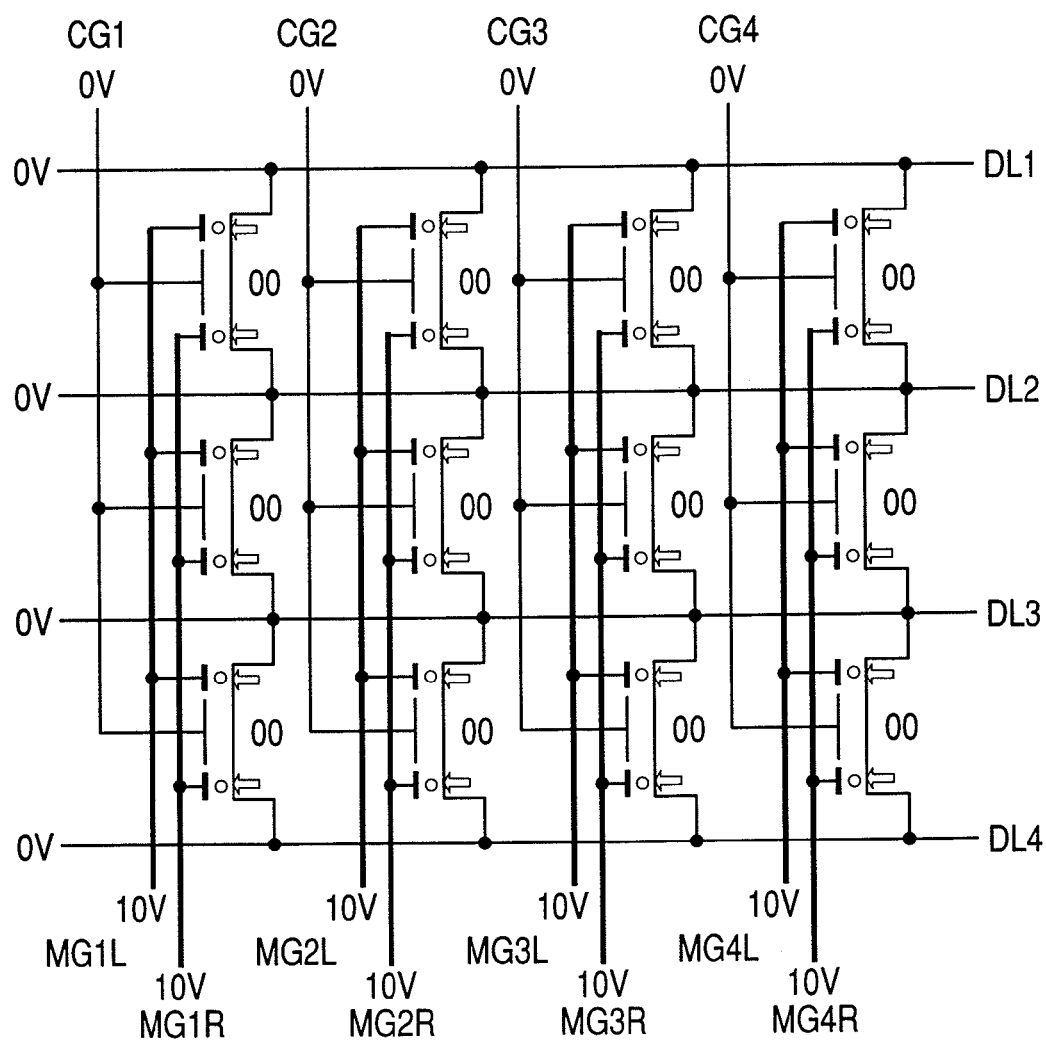
FIG. 48 is a circuit diagram illustrating, in an erase-operated state, a memory array in which the multi-valued memory cells each shown in FIG. 45 are disposed in matrix form.

A memory array in which multi-value memory cells are disposed in matrix form, is illustrated in FIG. 48. 12 memory cells are typically disposed in the memory array in matrix form. CG1 through CG4 are typically-illustrated control gate lines, MG1L through MG4L are left memory gate lines, MG1R through MG4R are right memory gate lines, and DL1 through DL4 are data lines, respectively. The data lines are respectively shared between right source/drain SDRs and left source/drain SDLs of the adjacent memory cells.

An erase operation of each memory cell will be described with reference to FIG. 48. All of the left and right memory gates MG1L through MGL4L and MG1R through MG4R in an erase block are selected. 10V is applied to them for an interval corresponding to an erase time of 100 ms and electrons are injected therein by tunneling currents and are trapped into the silicon nitride films 125 as shown in FIG. 47. A threshold voltage measured from each memory gate is set to VTE=1.5V.

Now, an erase state, a write state, and threshold voltage states of left and right memory gates in one memory cell will be described as "0", "1" and "L, R" (L, R="0" or "1") respectively. After the erase operation, all the memory cells are understood or taken as states of storing erase data "0, 0".

Figure 49:
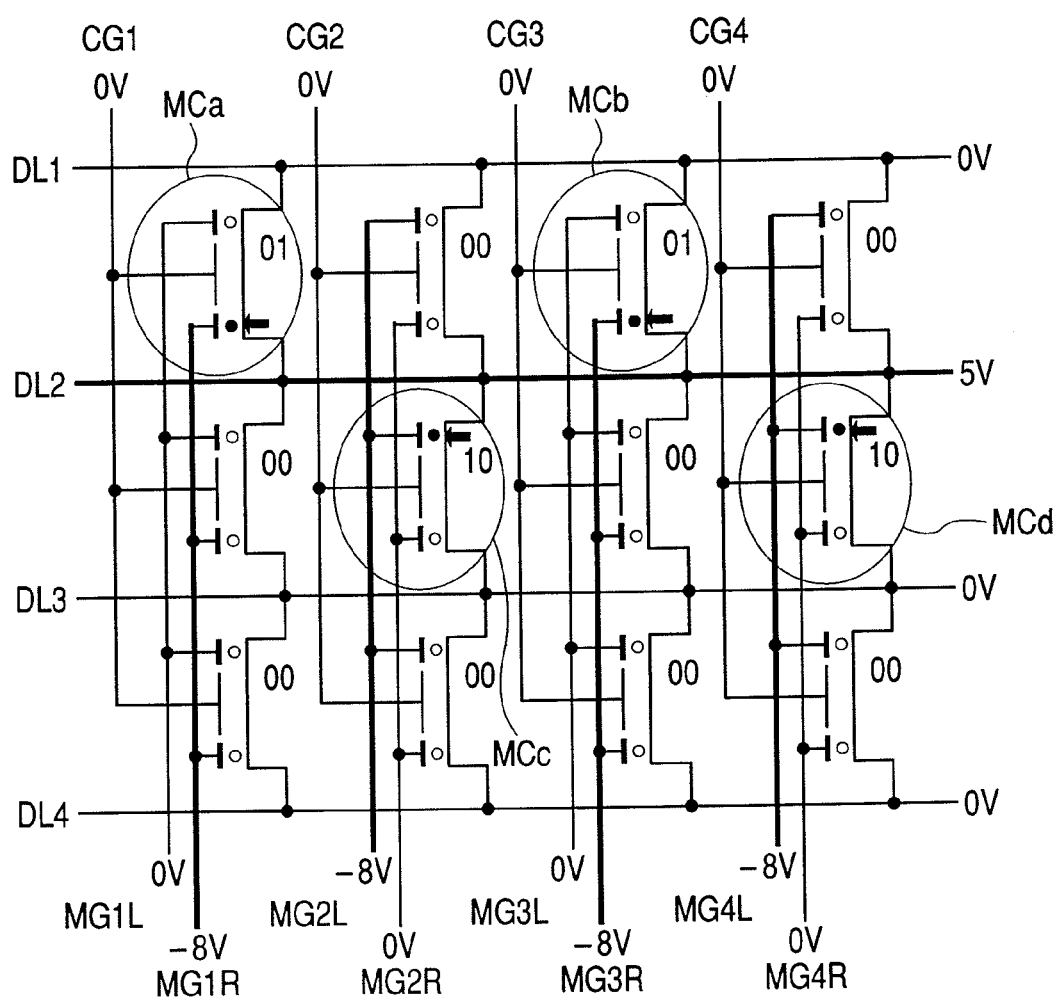
FIG. 49 is a circuit diagram illustrating, in a write-operated state, the memory array in which the multi-valued memory cells each shown in FIG. 45 are disposed in matrix form.

FIG. 49 illustrates a write operation −8V is applied to selected memory gates to be written, e.g., MG1R, MG2L, MG3R and MG4L. Thereafter, 5V corresponding to a source/drain junction withstand voltage is applied to the selected data line DL2 for an interval corresponding to a write time of 10 μs to thereby inject hot holes based on band-to-band tunneling currents produced in source/drain junction surfaces into the silicon nitride films 125 already placed under electron traps to neutralize the electron traps, and reduce threshold voltages measured from the memory gates to VTP=−1.5V, whereby the write operation is completed. In the present write state, memory cells MCa and MCb respectively store data "0, 1", and memory cells MCc and MCd respectively store data "1, 0".

In the case of a write operation, a data disturb voltage of 5V is applied to only the source/drain of each write-nonselected memory cell not subjected to writing, or a word disturb voltage of −8V is applied to each memory gate alone. However, the time necessary for a slight variation (ΔVTE=0.1V) in threshold voltage due to any one of the disturb voltages, a so-called disturb life is 1 s or more and includes an operation margin of 5 digits or more with respect to a write time 10 μs.

While 5V corresponding to the source/drain junction withstand voltage is applied to the selected data line DL2 for the interval corresponding to the write time of 10 µs in the case of a write operation, 1.8V of a power voltage and −3.2V may respectively be applied to the selected data line DL2 and the semiconductor substrate to set an effective source/drain applied voltage as 5V. Thus, the maximum voltage to be applied to the data lines and control gates can be set to 1.8V inclusive of a read operation to be described below. As a result, a word driver connected to the control gates and a sense amplifier circuit connected to the data lines can be made of transistors each having a thin-film gate oxide film operated at the power voltage, whereby high-speed reading is achieved.

Figure 50:
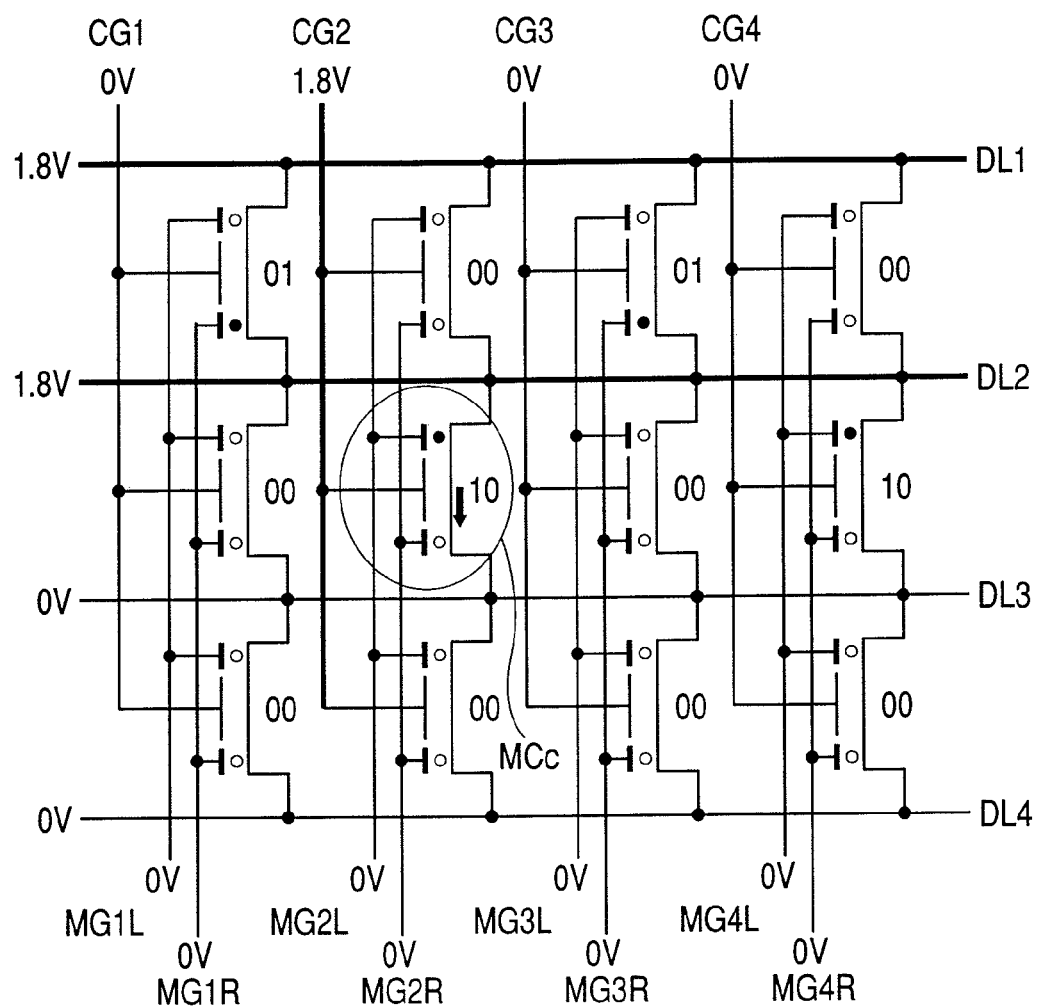
FIG. 50 is a circuit diagram illustrating, in a state of a read operation for a plus direction, the memory array in which the multi-valued memory cells each shown in FIG. 45 are disposed in matrix form.
Figure 51:
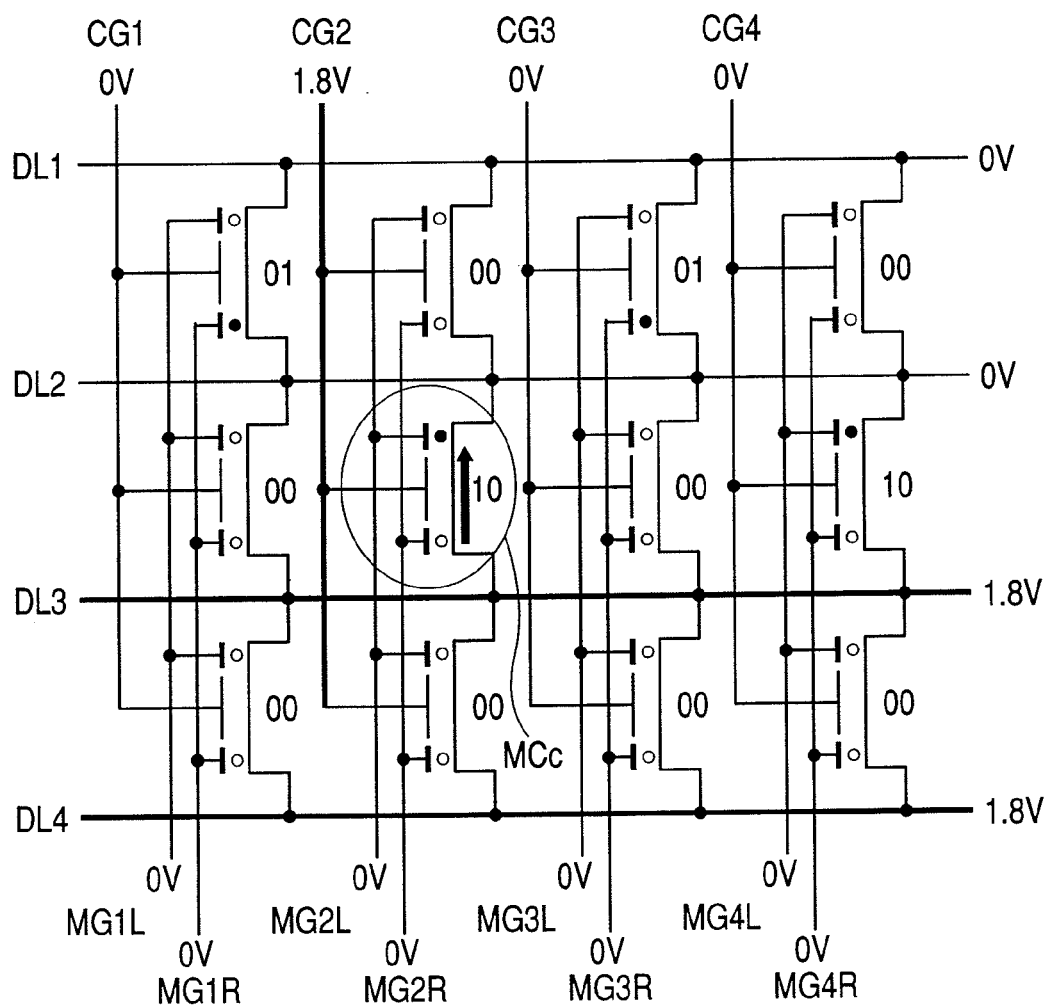
FIG. 51 is a circuit diagram illustrating, in a state of a read operation for a reverse direction, the memory array in which the multi-valued memory cells each shown in FIG. 45 are disposed in matrix form.

The read operation is illustrated in FIGS. 50 and 51. A read operation effected on one memory cell comprises a read operation for a plus direction and a read operation for a reverse direction. The plus-direction read operation is defined as the operation of determining whether a current path is formed when one of the left source/drain and the right source/drain of the memory cell is configured as a drain electrode. Contrary to the above, the reverse-direction read operation is defined as the operation of determining whether a current path is formed when the other of the left source/drain and the right source/drain of the memory cell is configured as a drain electrode.

FIG. 50 illustrates the read operation for plus direction. The drawing illustrates a case in which a memory cell MCc having data "1, 0" written therein is intended for reading. In FIG. 50, the data line DL2 and the data line DL1 ranking ahead of it are precharged to the power voltage 1.8V and the control gate CG2 is thereafter raised to the power voltage 1.8V, whereby a change in the potential of the data line DL2 is detected by the corresponding sense amplifier. While the data line DL2 is operated as the drain and the data line DL3 is operated as the source at this time, a drain current is cut off because the memory gate MG2R in the neighborhood of the source is in an erase state, so that the potential of the data line DL2 remains unchanged. Namely, erase data "0" is read. Reverse-direction reading is subsequently performed. In FIG. 51, the data line DL3 and the data line DL4 ranking lower than it are precharged to the power voltage 1.8V and the control gate CG2 is thereafter raised to the power voltage 1.8V, whereby a change in the potential of the data line DL3 is detected by the corresponding sense amplifier. While the data line DL3 is operated as the drain and the data line DL2 is operated as the source contrary to the above at this time, a drain current flows because the memory gate MG2L in the neighborhood of the source is in a write state, so that the potential of the data line DL3 is lowered. Namely, write data "1" is read. Memory cells in which data "0, 0", data "0, 1" and data "1, 1" have been written, can be read according to the procedures of similar plus-direction reading and reverse-direction reading.

Although not shown in the drawing in particular, the relationship between the selective control of the data lines, control gate lines and memory gate lines used upon the write and read operations, and access addresses can be arbitrarily determined by the logic of the X and Y decoders described with reference to FIG. 9. Assuming that byte addresses are taken, for example, eight memory cells sharing one data line may be selected with respect to one byte address such that a total of eight memory transistor sections are intended for writing or reading. The write operation may be effected on the eight memory cells on a parallel basis. As to the read operation, the plus-direction reading and the reverse-direction reading may be effected on the eight memory cells in several. If the eight memory cells, whose operations are selected by one byte address, are configured in discrete memory mats or memory blocks, then read operations for the eight memory cells can be also performed as eight on a parallel basis.

A method of manufacturing the multi-valued memory cell will be described with reference to FIGS. 52 through 57.

Figure 52:
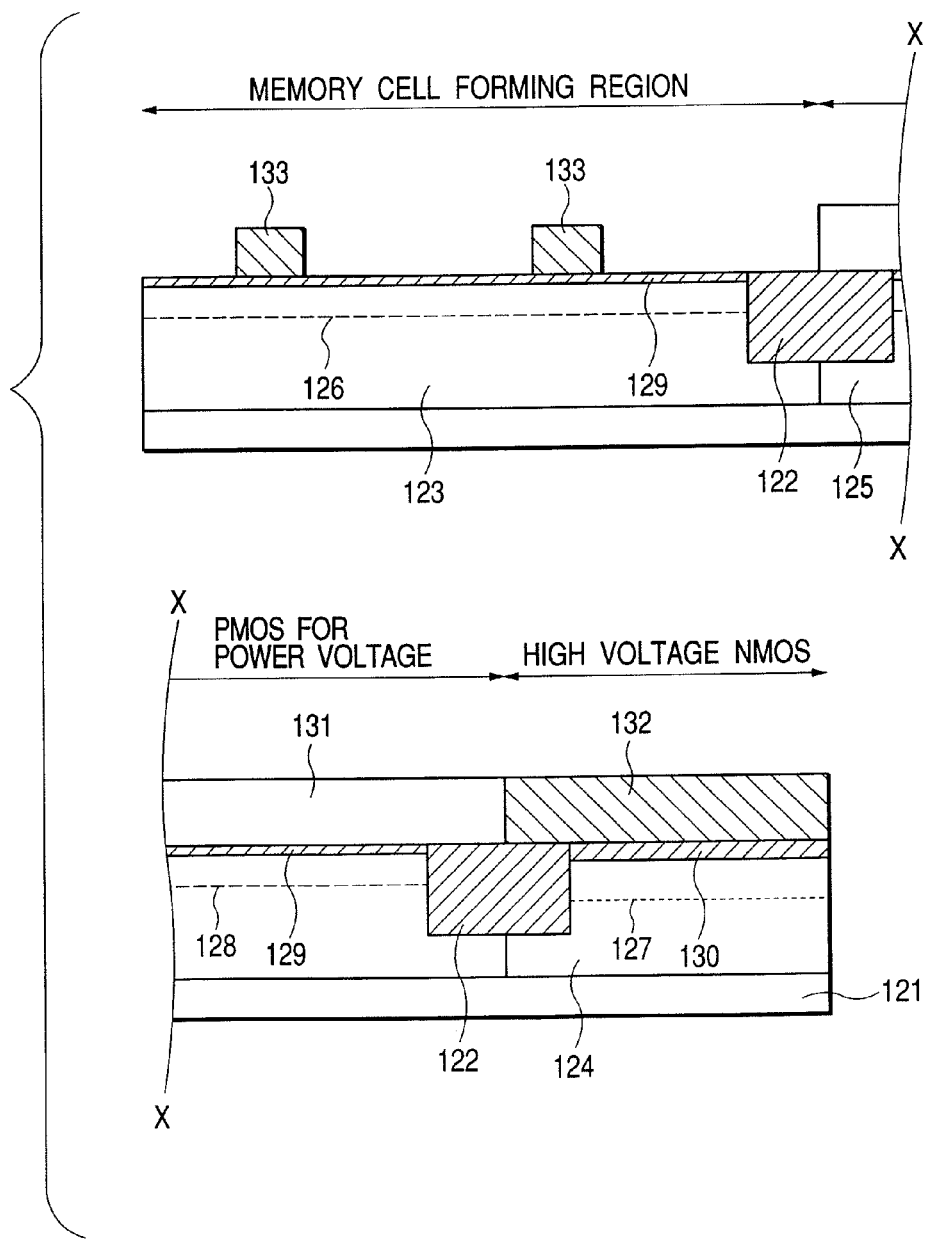
FIG. 52 is a fragmentary vertical cross-sectional view of an LSI in a step of the manufacturing process of a multi-valued memory cell.

As illustrated in FIG. 52 by way of example, a trench type device isolation region 122 obtained by embedding an oxide film into a trench having a depth of 250 nm and planarizing it by a CMP (Chemical Mechanical Polishing) method is first formed in a surface region of a p-type semiconductor substrate 121 having a resistivity of 10 Ωcm. Thereafter, phosphor ions each having an acceleration energy of 1 MeV, phosphor ions each having an acceleration of 500 keV, and phosphor ions each having an acceleration energy of 150 keV are respectively injected into a desired region through a surface oxide film having a thickness of 10 nm in injection amounts of $1 \times 10^{13}/cm^2$, $3 \times 10^{12}/cm^2$, and $1 \times 10^{12}/cm^2$ to form an n-type well region 125. Boron ions each having an acceleration energy of 500 keV are injected in an injection amount of $1 \times 10^{13}/cm^2$, and boron ions each having an acceleration energy of 150 keV are injected in an injection amount of $5 \times 10^{12}/cm^2$ to form a high withstand p-type well region 124. Boron ions each having an acceleration energy of 500 keV, boron ions each having an acceleration energy of 150 keV, and boron ions each having an acceleration energy of 50 keV are respectively injected in injection amounts of $1 \times 10^{13}/cm^2$, $5 \times 10^{12}/cm^2$ and $1 \times 10^{12}/cm^2$ to form a p-type well region 123. Thereafter, boron difluoride ($BF_2$) ions each having an acceleration energy of 50 keV are injected into a memory cell region in an injection amount of $7 \times 10^{12}/cm^2$ to form a memory channel implantation region 126. Phosphor ions each having an acceleration energy of 50 keV are injected into a power voltage-operated PMOS transistor region in an injection amount of $4 \times 10^{12}/cm^2$ to form a p-type channel enhance implantation region 128. Boron difluoride ($BF_2$) ions each having an acceleration energy of 50 keV are injected into a high voltage NMOS transistor region in an injection amount of $3 \times 10^{12}/cm^2$ to form an n-type channel enhance implantation region 127. Thereafter, a thin-film gate oxide film 129 having a thickness of 4.5 nm is grown on the memory cells region and power voltage-operated transistor region, and a thick-film gate oxide film having a thickness of 15 nm is grown on the high voltage transistor region. A non-doped polysilicon film 131 having a thickness of 200 nm is deposited by CVD, and phosphor ions each having an acceleration energy of 10 keV are injected into the memory cell region and NOS transistor region in an amount of $4 \times 10^{15}/cm^2$ to form a first n-type gate film 132. Thereafter, the n-type gate film 132 in the memory cell region alone is processed to form control gates 133.

Figure 53:
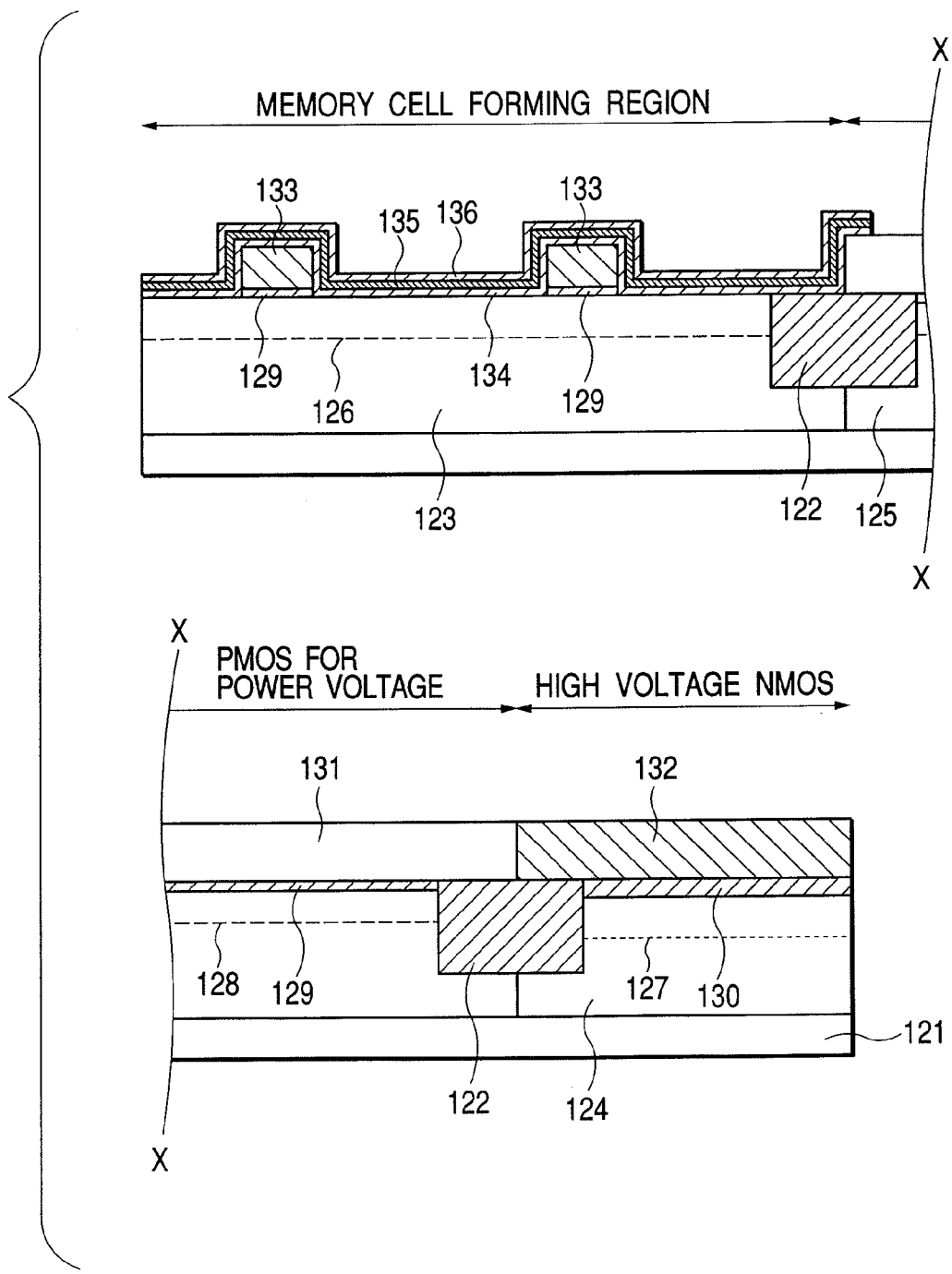
FIG. 53 is a fragmentary vertical cross-sectional view of the LSI in a step of the manufacturing process following FIG. 52.

Next, as shown in FIG. 53, a lower oxide film 134 having a thickness of 3 nm is grown by a thermal oxidation method, and a silicon nitride film 135 having a thickness of 5 nm is deposited thereabove by CVD. Further, an upper oxide film 136 having a thickness of 5 nm is deposited and thereafter the lower oxide film 134, silicon nitride film 135 and upper oxide film 136 in a peripheral region other than the memory cell region are removed.

Figure 54:
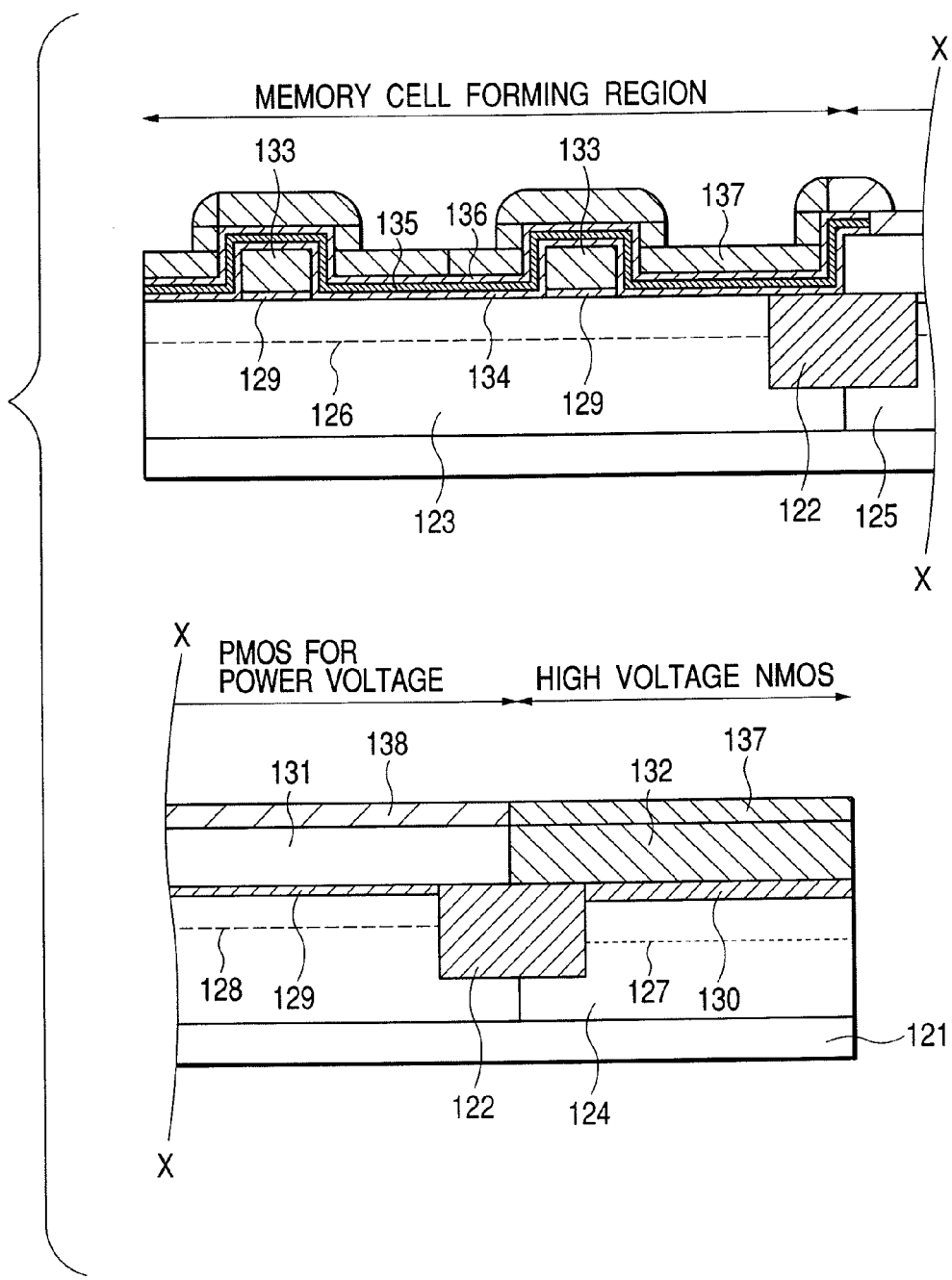
FIG. 54 is a fragmentary vertical cross-sectional view of the LSI in a step of the manufacturing process following FIG. 53.

Next, as shown in FIG. 54, a non-doped polysilicon film having a thickness of 50 nm is deposited by CVD, and phosphor ions each having an acceleration energy of 10 keV are injected into the memory cell region and NMOS transistor region in an injection amount of $2 \times 10^{15}/cm^2$ to form second n-type gate films 137. Boron difluoride ($BF_2$) ions each having an acceleration energy of 10 keV are injected into the PMOS transistor region in an injection amount of $5 \times 10^{15}/cm^2$ to form a p-type gate film 138.

Figure 55:
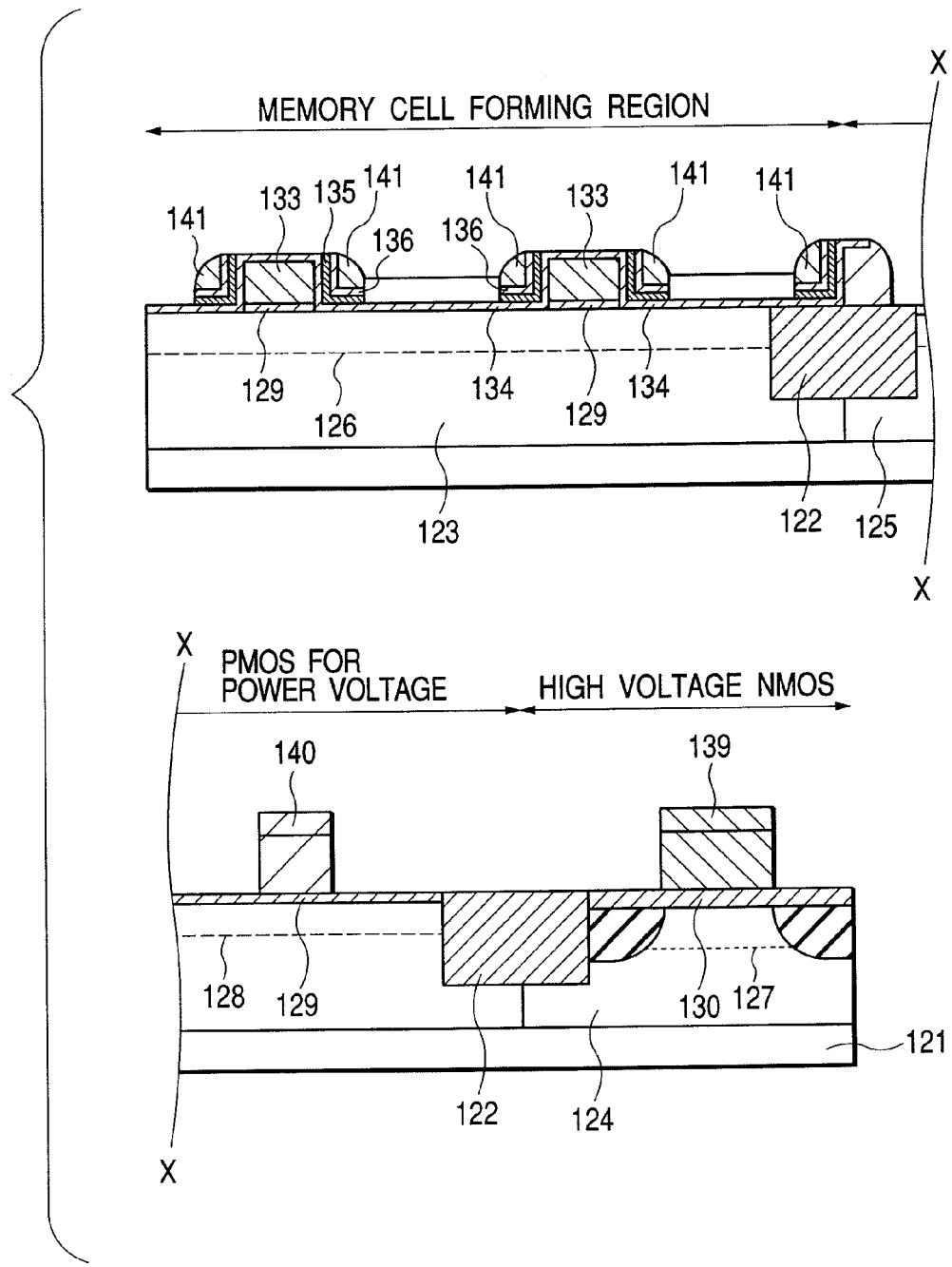
FIG. 55 is a fragmentary vertical cross-sectional view of the LSI in a step of the manufacturing process following FIG. 54.

Further, as shown in FIG. 55, a laminated film of the first n-type gate film and the second n-type gate films, and the p-type gate film are processed to form a p-type gate electrode 140 and an n-type gate electrode 139. In the same gate processing process, the second n-type gate film 137 in the memory cell region is processed into side spacer shapes to thereby form memory gates 141 of the memory cell.

Figure 56:
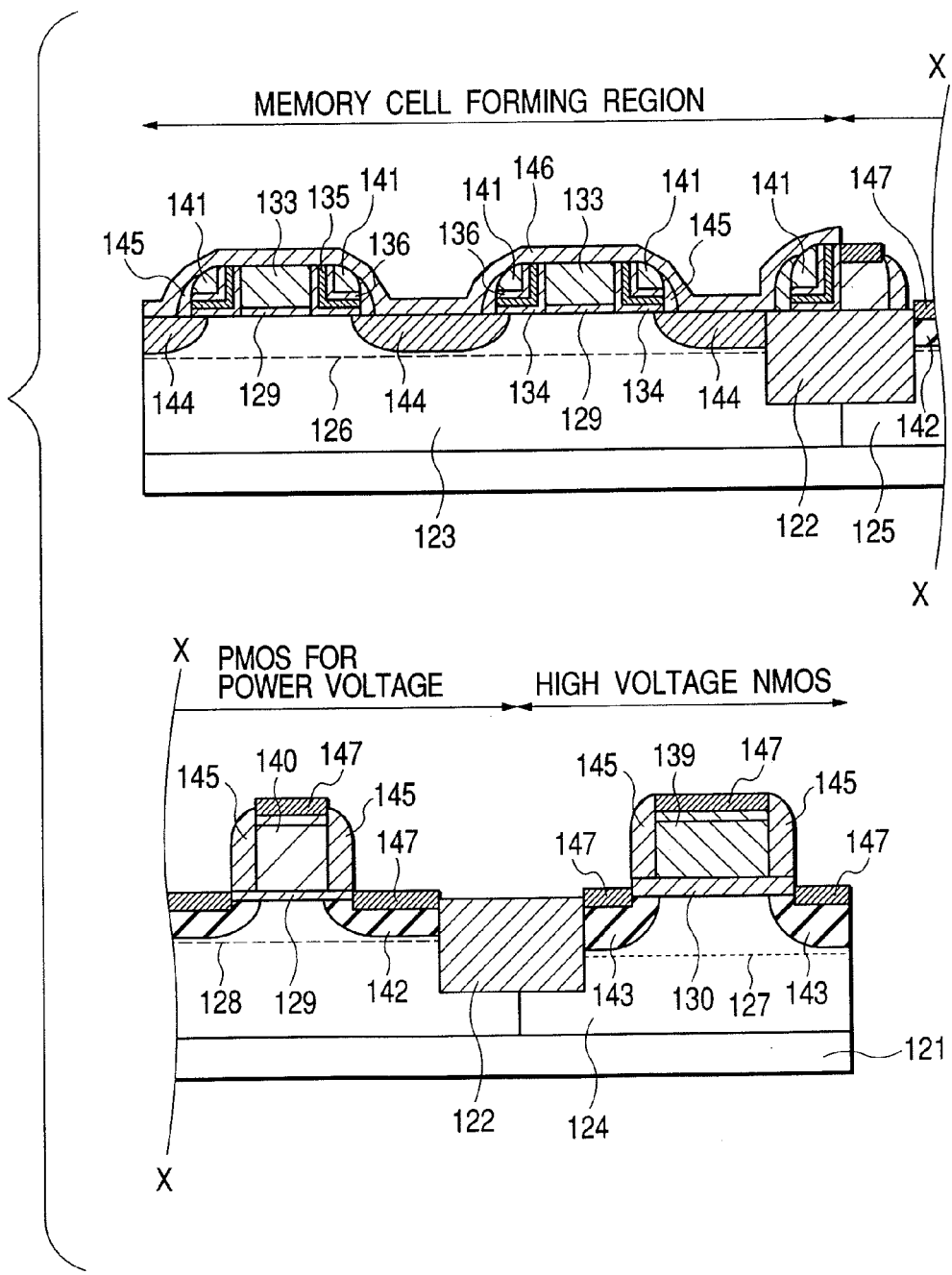
FIG. 56 is a fragmentary vertical cross-sectional view of the LSI in a step of the manufacturing process following FIG. 55.

Next, as shown in FIG. 56, boron difluoride ions each having an acceleration energy of 20 keV, and phosphor ions each having an acceleration energy of 10 keV are respectively injected into the power voltage-operated PMOS transistor section alone in injection amounts of $2\times10^{14}/cm^2$ and $3\times10^{13}/cm^2$ to form p-type extensions 142. Phosphor ions each having an acceleration energy of 30 keV are injected into the high voltage NMOS transistor section alone in an injection amount of $6\times10^{12}/cm^2$ to form low-concentration n-type source/drains 143. Arsenic ions each having an acceleration energy of 10 keV are injected into the memory cell region alone in an injection amount of $5\times10^{14}/cm^2$ to form memory source/drains 144. Thereafter, oxide film side spacers 145 each having a thickness of 80 nm, which are deposited by CVD and processed by etchback, are formed, and boron difluoride ions each having an acceleration energy of 20 keV are injected into the peripheral PMOS transistor region in an injection amount of $3\times10^{15}/cm^2$ to form high-concentration p-type source/drains. Arsenic ions each having an acceleration energy of 30 keV are injected into the peripheral NMOS transistor region in an injection amount of $3\times10^{15}/cm^2$ to form high-concentration n-type source/drains. Afterwards, an oxide film 146 having a thickness of 30 nm, which is deposited by CVD, is further removed by wet etching with only the memory cell region left behind, and cobalt silicide films 147 each having a thickness of 40 nm are formed on all the gate electrodes and source/drains of the peripheral transistors.

Figure 57:
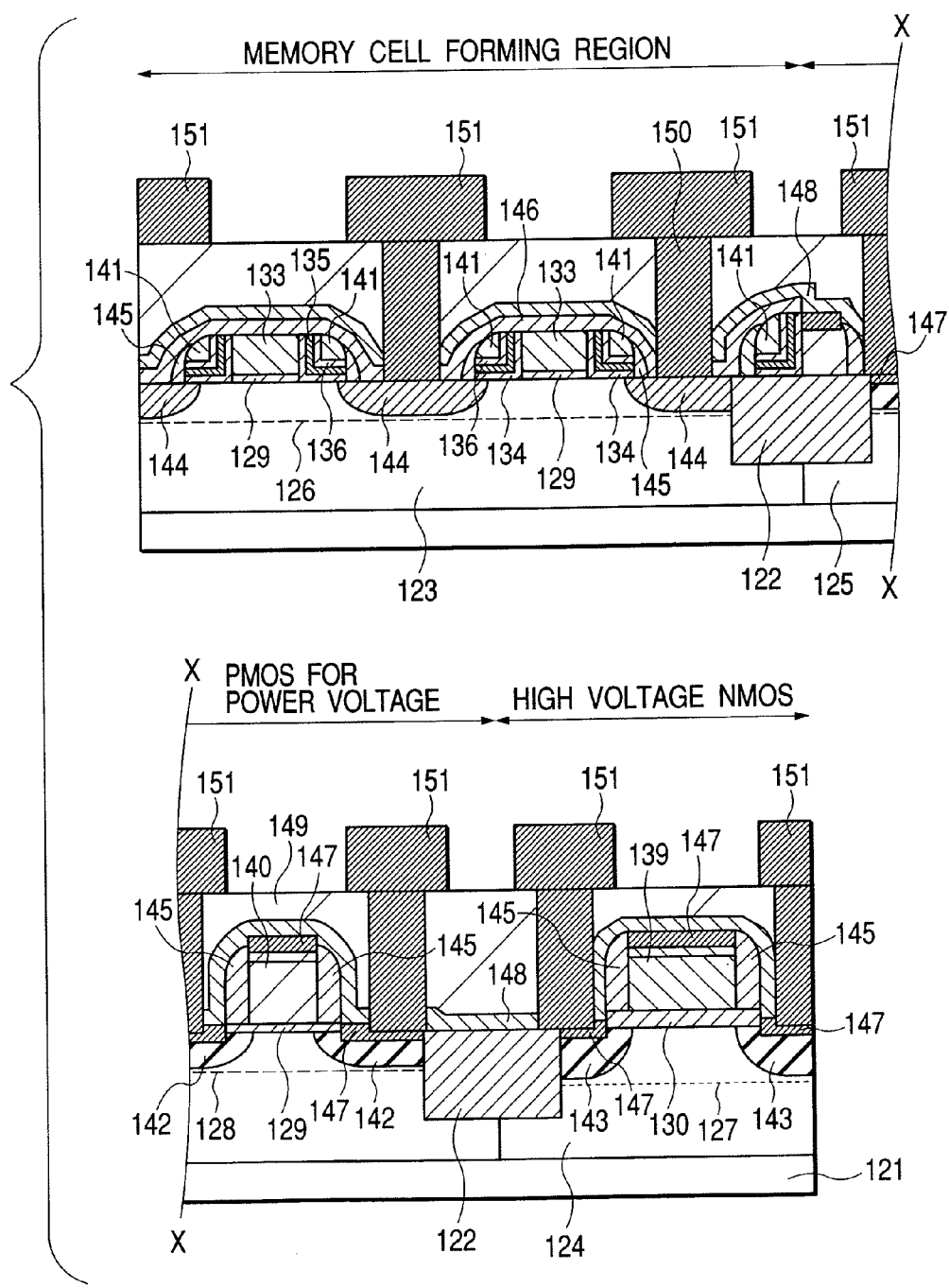
FIG. 57 is a fragmentary vertical cross-sectional view of the LSI in a step of the manufacturing process following FIG. 56.
Figure 58:
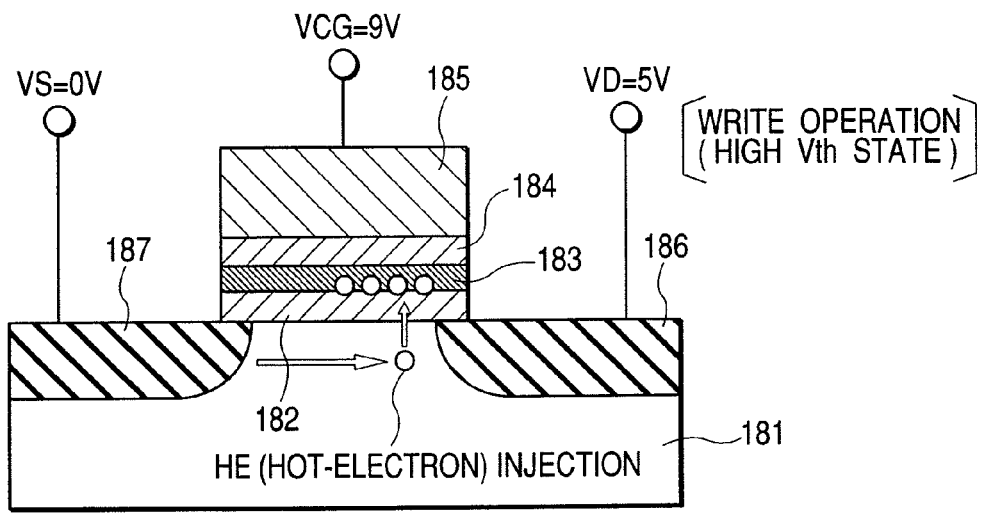
FIG. 58 is a cross-sectional view illustrating a write operation of a nonvolatile memory cell according to a first prior art example.
Figure 59:
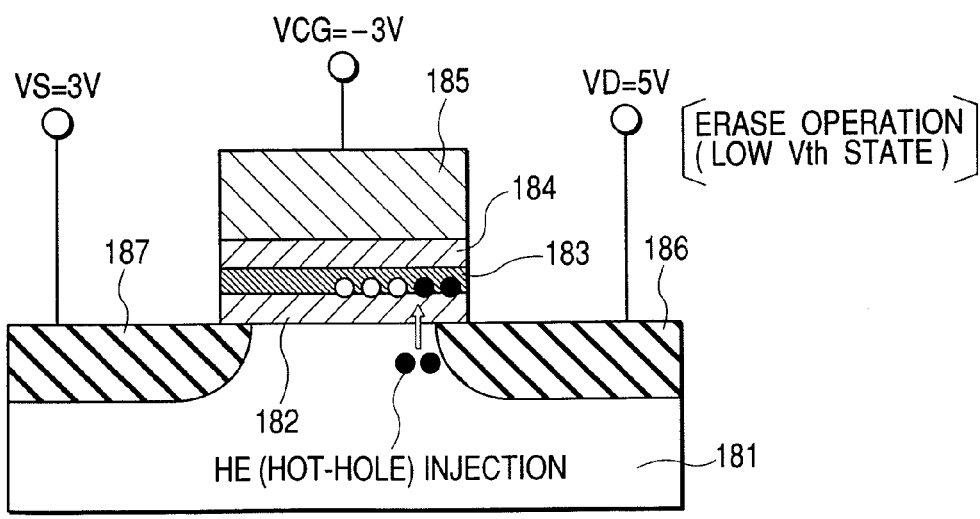
FIG. 59 is a cross-sectional view illustrating an erase operation of the nonvolatile memory cell according to the first prior art example.
Figure 60:
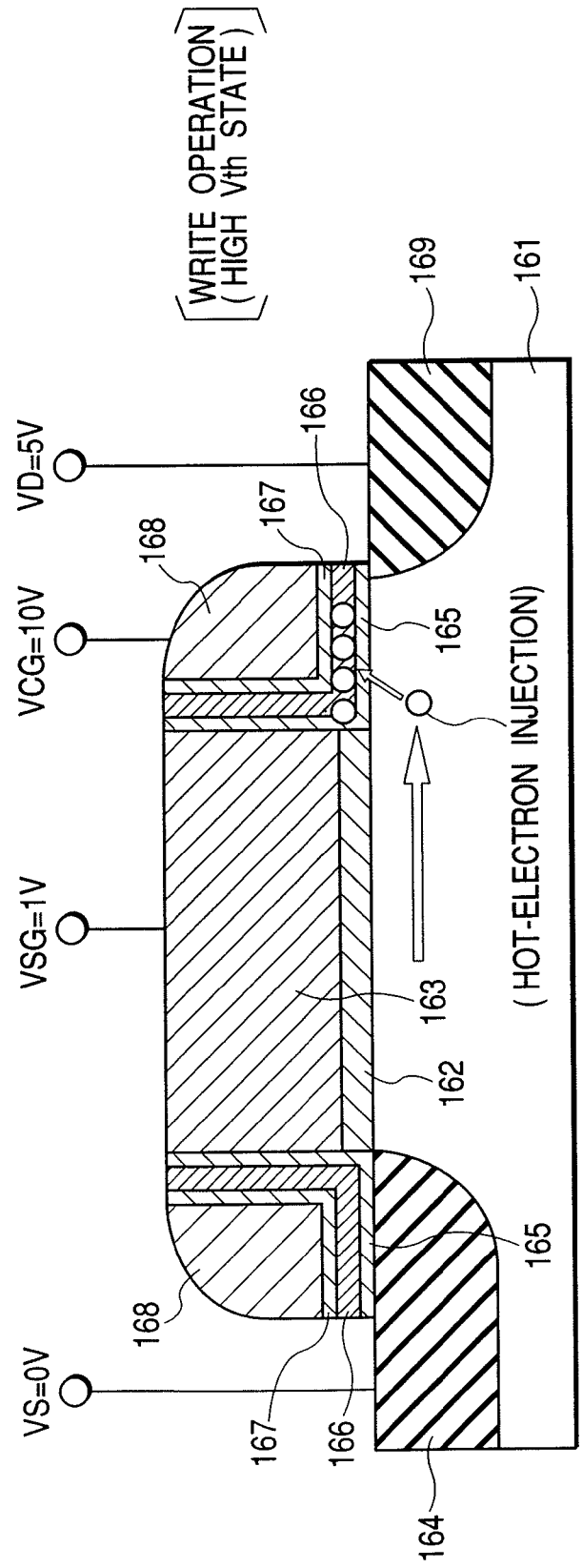
FIG. 60 is a cross-sectional view illustrating a write operation of a nonvolatile memory cell according to a second prior art example.
Figure 61:
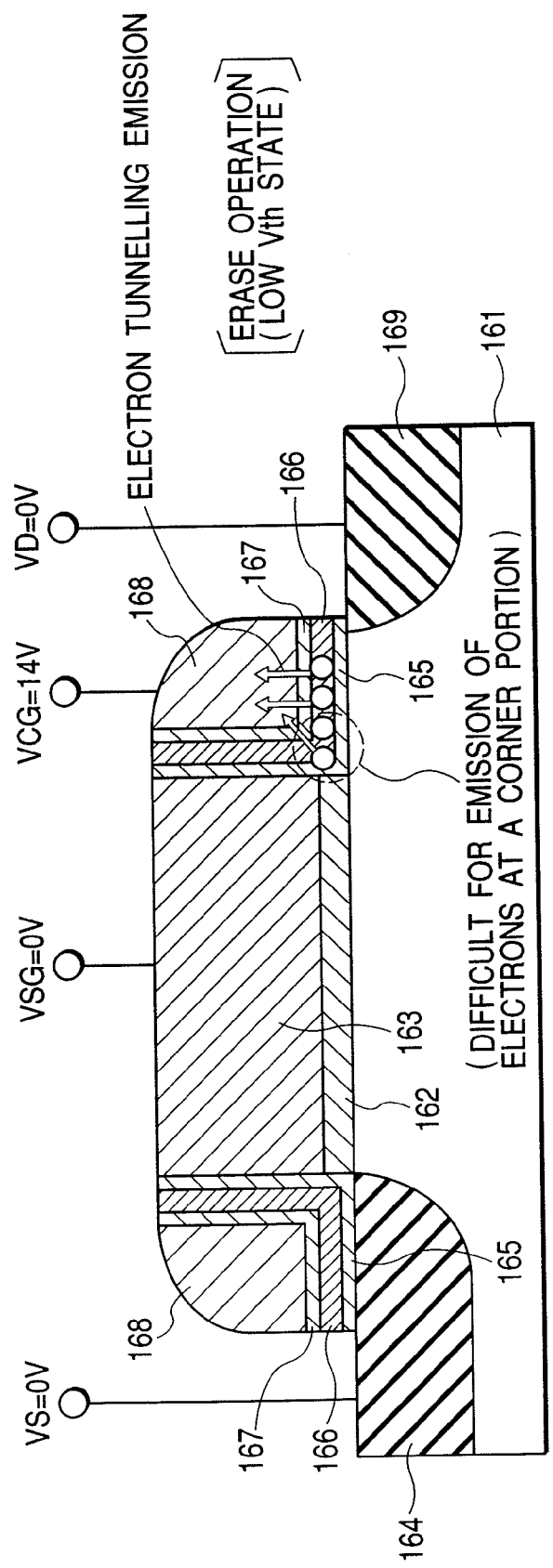
FIG. 61 is a cross-sectional view illustrating an erase operation of the nonvolatile memory cell according to the second prior art example.
Figure 62:
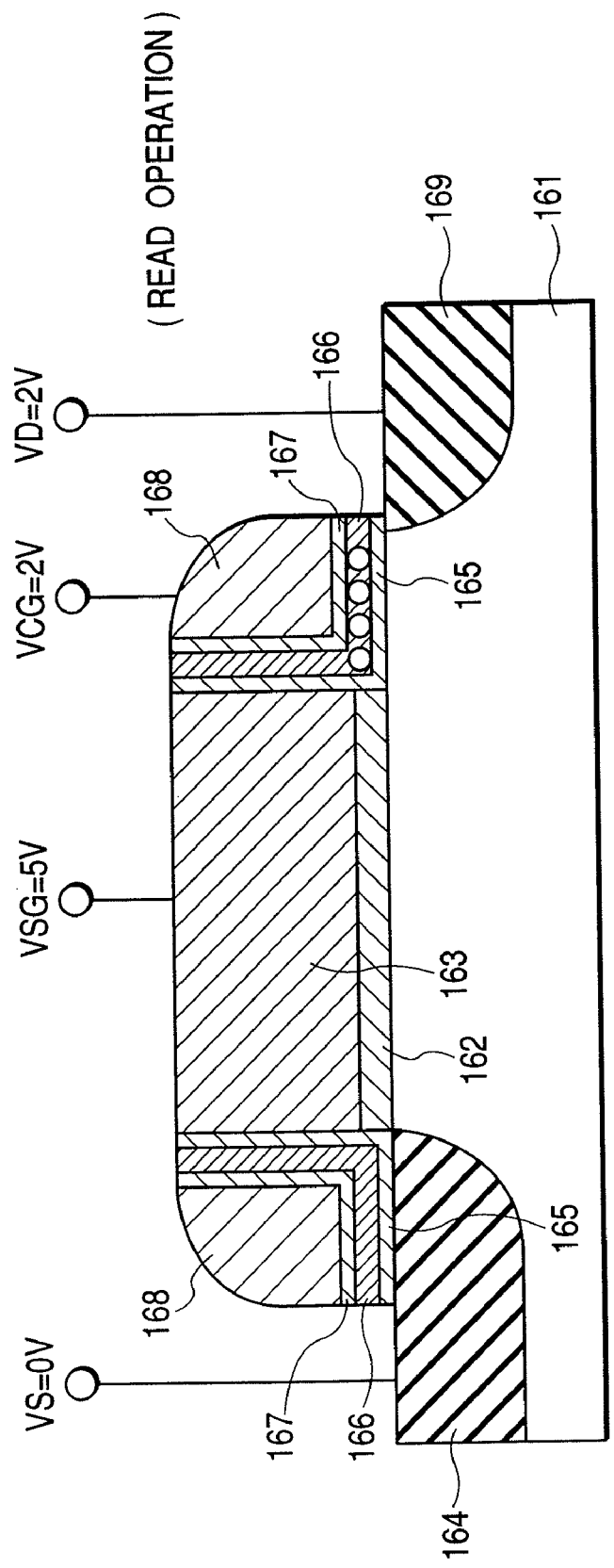
FIG. 62 is a cross-sectional view illustrating a read operation of the nonvolatile memory cell according to the second prior art example.
Figure 63:
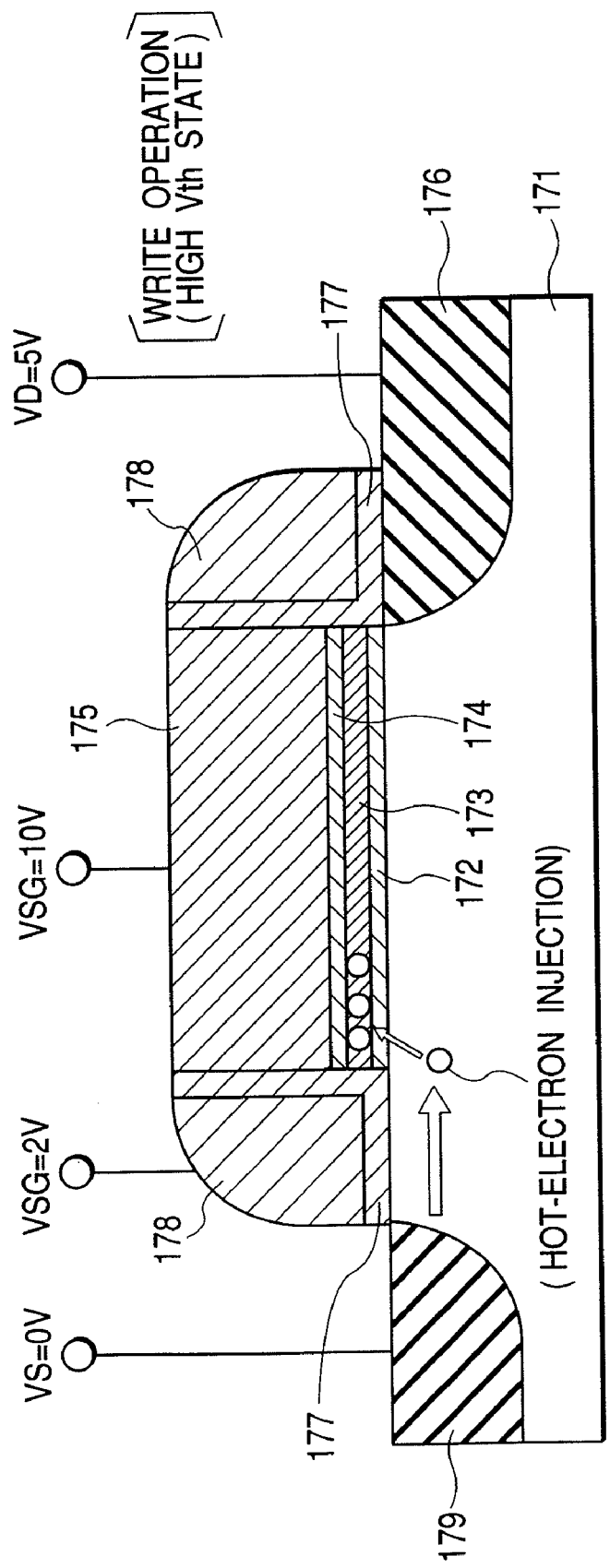
FIG. 63 is a cross-sectional view illustrating a write operation of a nonvolatile memory cell according to a third prior art example.
Figure 64:
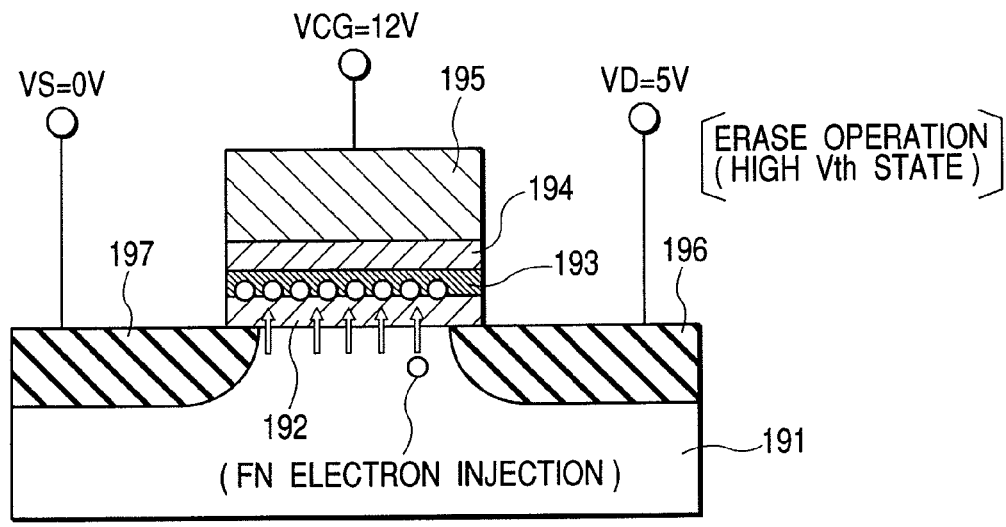
FIG. 64 is a cross-sectional view illustrating an erase operation of a nonvolatile memory cell according to a fourth prior art example.
Figure 65:
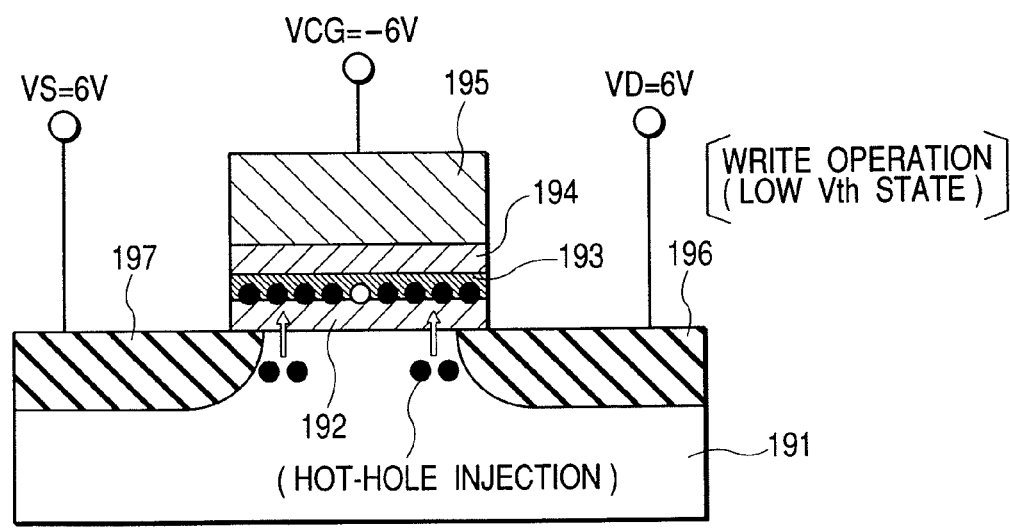
FIG. 65 is a cross-sectional view illustrating a write operation of the nonvolatile memory cell according to the fourth prior art example.

Finally, as illustrated in FIG. 57, a silicon nitride film 148 having a thickness of 50 nm is deposited by CVD, and an $O_3$-TEOS film 149 having a thickness of 700 nm is further deposited by CVD. Thereafter, plug holes are defined above all the gates and source/drains to be connected, and tungsten (W) is embedded therein to form plugs 150, and first metal wirings 151 made of a tungsten film having a thickness of 200 nm are formed, whereby the major manufacturing process for the 2-bit/cell flash memory according to the present embodiment is completed. Further, although not shown in the drawing, the process of adding desired metal wirings, the deposition of a passivation film and the opening of bonding holes are carried out, and the initial to final processes are completed.

While the invention developed by the present inventors has been described specifically based on the illustrated embodiments, the present invention is not limited to the embodiments. It is needless to say that various changes can be made thereto within a scope not departing from the substance thereof.

For example, the above description has been made of a case in which, as a best mode, a nonvolatile memory cell transistor according to the present invention has a configuration so as to perform information storage by the injection of hot holes from the drain side and the injection of electrons from a well region, as one example. However, the present invention is not limited to this example in principle. For example, combinations of the injection of electrons from the memory gate side, the injection of hot electrons as an alternative to FN tunneling, the injection of hot holes by FN tunneling, and the injection of hot electrons may be adopted. The concept of writing and erasing is a general concept, and a state in which the threshold voltage is high and a state in which the threshold voltage is low, respectively, may be defined as writing and erasure.

Various applied voltages for writing and erasure can be changed in various ways according to the relationships with a source or power voltage of an LSI in which the corresponding memory cell is provided on-chip, the generation of a manufacturing process, other on-chip circuits, etc. It is needless to say that reference numerals 10 and 11 may respectively be configured as the source and drain in FIG. 1 and other drawings.

The charge storage region is not limited to the constitution thereof by a silicon nitride film. As the charge storage region, a conductive floating gate electrode (e.g., polysilicon electrode) covered with an insulating film, or a conductive particle layer covered with an insulating film, or the like, may be adopted. The conductive particle layer can be made of, for example, nanodots which constitute polysilicon in dot form.

A semiconductor integrated circuit device according to the present invention is not limited to a data processor like a microcomputer and can be widely applied even to a system LSI which is relatively large in logic scale, and which has been system-on-chipped, etc.

Advantageous effects obtained by a typical or representative one of the aspects of the invention disclosed in the present application will be described in brief as follows:

Memory information can be read at high speed from a nonvolatile memory cell transistor formed in a semiconductor integrated circuit device.

A parasitic resistance value of a channel portion of the nonvolatile memory cell transistor formed in the semiconductor integrated circuit device can be reduced.

It is possible to prevent charges of one polarity from being constantly trapped into the nonvolatile memory cell transistor formed in the semiconductor integrated circuit device.

It is possible to suppress deterioration of data retention characteristics due to undesired leakage of charges stored in the nonvolatile memory cell transistor formed in the semiconductor integrated circuit device.

A high voltage MOS transistor, which impairs a quick response and is large in thickness, can be eliminated from a signal path for reading memory information from the nonvolatile memory cell transistor formed in the semiconductor integrated circuit device.

What is claimed is:

1. A semiconductor integrated circuit device comprising a nonvolatile memory cell transistor formed in a semiconductor substrate,
   wherein the nonvolatile memory cell transistor includes:
   a first insulating film formed over the semiconductor substrate;
   a first gate electrode formed over the first insulating film;
   a second insulating film including a charge storage film and formed over the semiconductor substrate and over one side surface of the first gate electrode; and
   a second gate electrode formed over the second insulating film and over the one side surface of the first electrode through the second insulating film, and
   wherein the height from the semiconductor substrate to a top surface of the second gate electrode is higher than the height from the semiconductor substrate to a top surface of the first gate electrode.

2. A semiconductor integrated circuit device according to claim 1, wherein a silicide layer is formed over the second gate electrode.

3. A semiconductor integrated circuit device according to claim 2, wherein the suicide layer is formed of a cobalt silicide or a nickel silicide.

4. A semiconductor integrated circuit device according to claim 1, wherein silicide layers are formed over the first and second gate electrodes, respectively.

5. A semiconductor integrated circuit device according to claim 4, wherein the silicide layers are formed of a cobalt silicide or a nickel silicide.

6. A semiconductor integrated circuit device according to claim 1, wherein the charge storage film is formed of a silicon nitride film.

7. A semiconductor integrated circuit device according to claim 1, wherein the second gate electrode has a side spacer-like shape.

8. A semiconductor integrated circuit device according to claim 1, wherein writing or erasure operations of the nonvolatile memory cell transistor are performed by injecting electrons or hot-holes into the charge storage film.

9. A semiconductor integrated circuit device comprising a nonvolatile memory cell transistor formed in a semiconductor substrate,
wherein the nonvolatile memory cell transistor includes:
a first insulating film formed over the semiconductor substrate;
a first gate electrode formed over the first insulating film;
a second insulating film including a silicon nitride film as a charge storage film and formed over the semiconductor substrate and over one side surface of the first gate electrode; and
a second gate electrode formed over the second insulating film and over the one side surface of the first electrode through the second insulating film,
wherein the second gate electrode has a side spacer-like shape, and
wherein the height from the semiconductor substrate to a top surface of the second gate electrode is higher than the height from the semiconductor substrate to a top surface of the first gate electrode.

10. A semiconductor integrated circuit device according to claim 9, wherein a silicide layer is formed over the second gate electrode.

11. A semiconductor integrated circuit device according to claim 10, wherein the suicide layer is formed of a cobalt suicide or a nickel suicide.

12. A semiconductor integrated circuit device according to claim 9, wherein silicide layers are formed over the first and second gate electrodes, respectively.

13. A semiconductor integrated circuit device according to claim 12, wherein the silicide layers are formed of a cobalt suicide or a nickel silicide.

14. A semiconductor integrated circuit device according to claim 9, wherein writing or erasure operations of the nonvolatile memory cell transistor are performed by injecting electrons or hot-holes into the charge storage film.

* * * * *